United States Patent
Tomiha

(10) Patent No.: US 10,267,874 B2
(45) Date of Patent: Apr. 23, 2019

(54) MAGNETIC RESONANCE IMAGING APPARATUS AND BED DEVICE

(71) Applicant: TOSHIBA MEDICAL SYSTEMS CORPORATION, Otawara-Shi, Tochigi-Ken (JP)

(72) Inventor: Sadanori Tomiha, Nasushiobra (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 1472 days.

(21) Appl. No.: 14/104,544

(22) Filed: Dec. 12, 2013

(65) Prior Publication Data

US 2014/0097844 A1  Apr. 10, 2014

Related U.S. Application Data

(63) Continuation of application No. PCT/JP2013/074506, filed on Sep. 11, 2013.

(30) Foreign Application Priority Data

Sep. 12, 2012  (JP) ................ 2012-200769

(51) Int. Cl.
    *G01R 33/30* (2006.01)
    *G01R 33/36* (2006.01)
    G01R 33/3415 (2006.01)

(52) U.S. Cl.
    CPC ......... *G01R 33/30* (2013.01); *G01R 33/3692* (2013.01); *G01R 33/3415* (2013.01); *G01R 33/3614* (2013.01)

(58) Field of Classification Search
    CPC ............. G01R 33/30; G01R 33/3415; G01R 33/3614; G01R 33/3692; G01R 33/36
    See application file for complete search history.

(56) References Cited

U.S. PATENT DOCUMENTS 6,961,604 B1  11/2005  Vahasalo et al.
9,519,038 B2*  12/2016  Okamoto ........... G01R 33/3692
(Continued)

FOREIGN PATENT DOCUMENTS

JP  2013-158589  8/2003
JP  2005-505361  2/2005
(Continued)

OTHER PUBLICATIONS

CN Office Action dated Jul. 20, 2015 in in CN 201380002684.2.
(Continued)

*Primary Examiner* — Rishi R Patel
(74) *Attorney, Agent, or Firm* — Nixon & Vanderhye P.C.

(57) ABSTRACT

An MRI apparatus includes a supporting unit, a first radio communication unit, a second radio communication unit and a power supply unit. The supporting unit supports a table inside a gantry. The first radio communication unit acquires an MR signal detected by an RF coil device, and wirelessly transmits the MR signal. The second radio communication unit receives the MR signal wirelessly transmitted from the first radio communication unit. At least a part of the power supply unit is disposed inside a bed device or inside the supporting unit. The power supply unit supplies consumed power of the RF coil device via the first radio communication unit, by wirelessly supplying electric power to the first radio communication unit.

19 Claims, 23 Drawing Sheets

(56) References Cited

U.S. PATENT DOCUMENTS

| | | |
|---|---|---|
| 10,001,534 B2 * | 6/2018 | Okamoto ............... G01R 33/24 |
| 2006/0226841 A1 | 10/2006 | Boskamp et al. |
| 2007/0176601 A1 | 8/2007 | Adachi |
| 2007/0182409 A1 | 8/2007 | Varjo |
| 2008/0106262 A1 * | 5/2008 | Ohsawa ........... G01R 33/34007 |
| | | 324/318 |
| 2008/0191695 A1 | 8/2008 | Van Helvoort et al. |
| 2009/0058420 A1 | 3/2009 | Adachi et al. |
| 2009/0237079 A1 | 9/2009 | Van Helvoort et al. |
| 2010/0090699 A1 | 4/2010 | Haans et al. |
| 2010/0308826 A1 | 12/2010 | Saes et al. |
| 2011/0012598 A1 * | 1/2011 | van Helvoort ......... G01R 33/34 |
| | | 324/318 |
| 2012/0161767 A1 | 6/2012 | Hardy et al. |
| 2014/0021954 A1 * | 1/2014 | Okamoto ........... G01R 33/3692 |
| | | 324/322 |

FOREIGN PATENT DOCUMENTS

| | | |
|---|---|---|
| JP | 2007-203036 | 8/2007 |
| JP | 2008-506441 | 3/2008 |
| JP | 2008-523943 A | 7/2008 |
| JP | 2008-534104 A | 8/2008 |
| JP | 2009-160015 A | 7/2009 |
| JP | 2010-029644 | 2/2010 |
| JP | 2010-512932 | 4/2010 |
| JP | 2011-507588 | 3/2011 |
| JP | 2012-130700 A | 7/2012 |

OTHER PUBLICATIONS

English Translation of International Preliminary Report on Patentability dated Mar. 17, 2015 for Application No. PCT/JP2013/074506.

JP Office Action dated Jul. 12, 2016 in JP 2012-200769.

* cited by examiner

MAGNETIC RESONANCE IMAGING APPARATUS AND BED DEVICE

CROSS-REFERENCE TO RELATED APPLICATIONS

This application is a Continuation Application of No. PCT/JP2013/74506, filed on Sep. 11, 2013, and the PCT application is based upon and claims the benefit of priority from Japanese Patent Application No. 2012-200769, filed on Sep. 12, 2012, the entire contents of which are incorporated herein by reference.

BACKGROUND OF THE INVENTION

1. Field of the Invention

Embodiments described herein relate generally to a magnetic resonance imaging apparatus and a bed device.

2. Description of the Related Art

MRI is an imaging method which magnetically excites nuclear spin of an object (a patient) placed in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

Here, an RF (Radio Frequency) coil device is a device which transmits an RF pulse to nuclear spin inside an object by, for example, supplying a coil with an RF pulse electric current and detects generated MR signals.

Some of RF coil devices are built-in types included in an MRI apparatus and other RF coil devices are recognized by a control unit of the MRI apparatus by being connected to a connection port of the MRI apparatus such as local RF coil devices, for example.

In MRI, multi-channel structure is promoted in acquisition system of MR signals. The above "channel" means each pathway of a plurality of MR signals outputted from each coil element and inputted to an RF receiver of an MRI apparatus. Although the number of the channels is set to equal to or smaller than the input reception number of the RF receiver, a large number of RF coil devices can be connected to an MRI apparatus.

If the number of cables between an RF coil device and an MRI apparatus increases due to promotion of the aforementioned multichannel structure, it is inconvenient because hard-wiring becomes complicated.

Therefore, it is desired to unwire transmission and reception of signals between an RF coil device and an MRI apparatus. However, radio communication by an analogue signal has not been achieved, because there are various restrictions such as degradation of dynamic range.

More specifically, in order to suppress influence on receiving sensitivity to weak MR signals emitted from an object, it is impossible in an MRI apparatus to enlarge the output of electromagnetic waves used for radio communication between an RF coil device and an MRI apparatus. If it is impossible to enlarge the radio output power, dynamic range degrades due to signal loss caused when transmitted signals travel space. Then, in Japanese Patent Application Laid-open (KOKAI) Publication No. 2010-29664, "a digital radio communication method in which MR signals are digitized and then transmitted wirelessly" is proposed.

The problem of restriction of dynamic range can be solved by wirelessly transmitting MR signals after digitalization. Here, a conventional RF coil device that transmits MR signals by wire is connected to a connection port of a control side of an MRI apparatus and receives electric power from the MRI apparatus via the connection port. In this case, a structure in which a manipulation burden such as preliminary charging is not imposed on a user is preferable.

Therefore, a novel technology to save electric power of an RF coil device without imposing a manipulation burden on a user has been desired in a structure of transmitting MR signals from an RF coil device side to a control side of an MRI apparatus.

DETAILED DESCRIPTION

Figure 1:
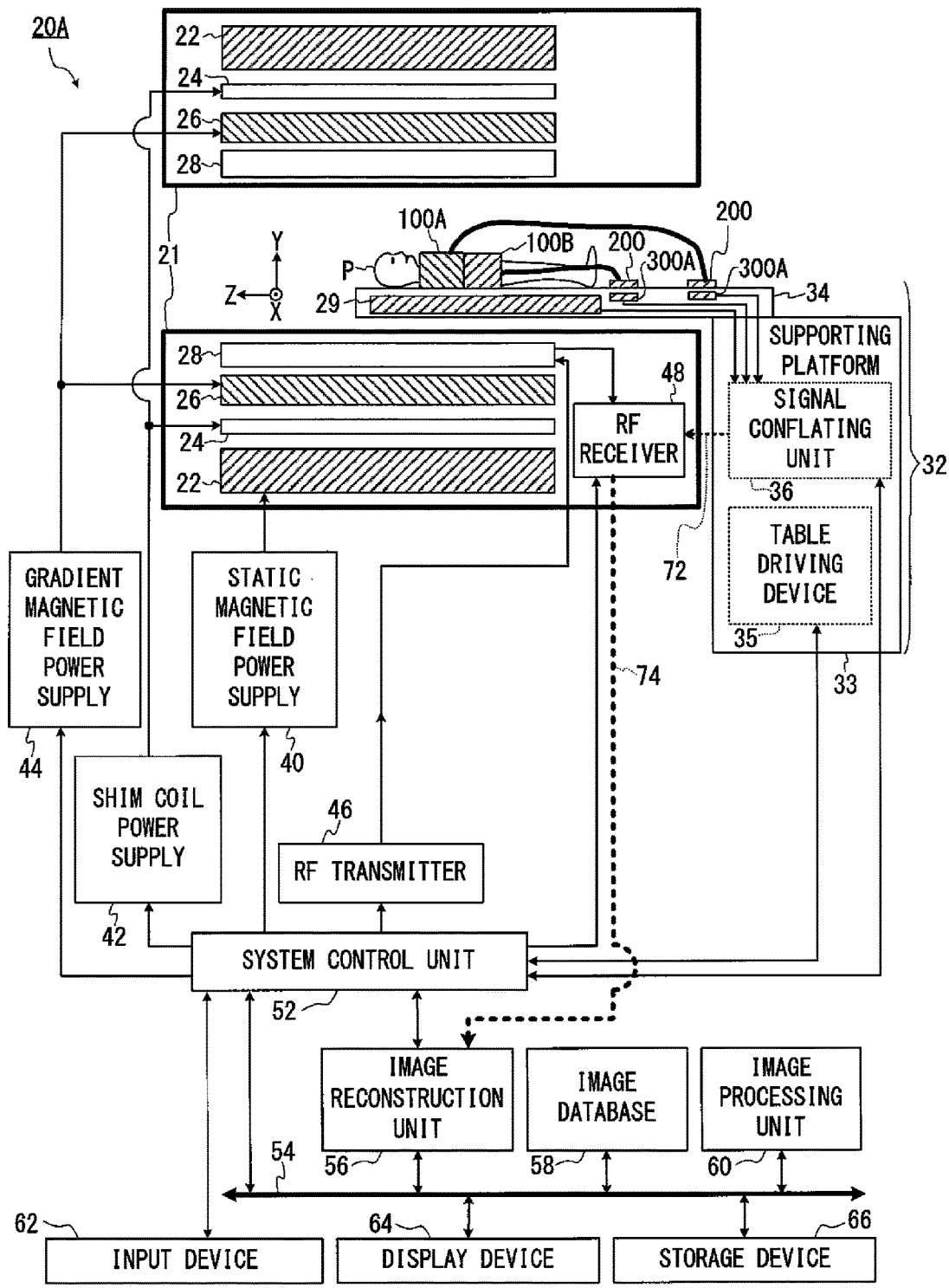
FIG. 1 is a block diagram showing an example of the general structure of the MRI apparatus of the first embodiment.

In the following examples of embodiments, "a first radio communication unit and a second radio communication unit both of which are capable of radio communication via an induced electric field" are disposed on an RF coil device side and a control side of an MRI apparatus respectively. In this case, the first radio communication unit is detachably fixed to the second radio communication unit within a near distance, for example, and digitized MR signals are wirelessly transmitted from the first radio communication unit to the second radio communication unit via an induced electric field.

By the above novel technology, MR signals can be satisfactorily transmitted from the RF coil device to the MRI apparatus. This is a novel technology worked out before Japanese filing date of the present application by researchers belonging to the applicants of the present application, and is a never-before-published technology at the time of Japanese filing date of the present application.

Here, as to applying the above radio communication via an induced electric field to transmission of MR signals from an RF coil side to a control side of an MRI apparatus, a method of surely saving (setting aside) electric power of an RF coil device has not been considered sufficiently, and an efficient and problem-free method for it has been desired. Concretely speaking, there are the following assignments.

For example, a method of disposing a rechargeable battery inside the RF coil device, detaching this rechargeable battery and charging it before imaging imposes an extra manipulation burden of detaching the rechargeable battery and charging on a user. In addition, in a structure of charging the RF coil device on a steady basis via a radio communication device of the receiving side of MR signals by disposing a power wire inside the table, an electric current flows in the power wire when the table is in motion. In this structure, because the state of the power wire such as a degree of stretching varies depending on a position of the table, there is a possibility that the power of an excitation RF pulse varies depending on a position of the table.

In addition, a degree of coupling effect between the power wire and transmission/reception coils varies depending on the position of the table, and this makes it difficult to accurately calculate SAR. The above SAR means Specific Absorption Ratio.

Then, in the following embodiments, the following two points are given as further assignments.

Firstly, it is to surely save electric power of an RF coil device without including a power wire inside a table, in a structure of wirelessly transmitting digitized MR signals from the RF coil device side to a control side of an MRI apparatus.

Secondly, it is to surely save electric power of an RF coil device by separating signal lines of MR signals from a power wire, in a structure of wirelessly transmitting digitized MR signals from the RF coil device side to a control side of an MRI apparatus.

If the second assignment is achieved, an optical communication cable is used for the signal lines of MR signals in the control side of an MRI apparatus and the digitized MR signals are wirelessly received from the RF coil device side so as to transmit the MR signals as optical signals to outside of a gantry. In this case, influence of external noise is reduced.

Hereinafter, examples of aspects which embodiments of the present invention can take will be explained per aspect.

(1) According to one embodiment, an MRI apparatus acquires an MR signal from an RF coil device that detects the MR signal emitted from an object under application of a static magnetic field. This MRI apparatus includes a gantry, a bed device, a supporting unit, a first radio communication unit, a second radio communication unit, an image reconstruction unit and a power supply unit.

A static magnetic field is applied inside the gantry.

The bed device includes a table on which the object is loaded, a supporting platform which movably supports the table, and a table driving device which moves the table inside the gantry.

The supporting unit is formed along a moving path of the table in the gantry, and supports the table moved inside the gantry.

The first radio communication unit acquires the MR signal detected by the RF coil device, and wirelessly transmits the MR signal.

The second radio communication unit receives the MR signal wirelessly transmitted from the first radio communication unit.

The image reconstruction unit reconstructs image data of the object on the basis of the MR signal received by the second radio communication unit.

At least apart of the power supply unit is disposed inside the bed device or inside the supporting unit. The power supply unit supplies consumed power of the RF coil device via the first radio communication unit by wirelessly supplying electric power to the first radio communication unit.

(2) According to another embodiment, an MRI apparatus is the same as the MRI apparatus of the above (1), except that the power supply unit and the first radio communication unit are configured as follows.

That is, the power supply unit is fixedly disposed so as not to move when the table moves. The power supply unit receives electric power via "a power wire that is fixed in the MRI apparatus so as not to move when the table moves", and wirelessly transmits the received electric power.

In addition, the first radio communication unit receives electric power wirelessly transmitted from the power supply unit, wirelessly transmits this electric power to the RF coil device, acquires the MR signal detected by the RF coil device, and wirelessly transmits the acquired MR signal.

(3) According to another embodiment, a bed device includes a table, a supporting platform, a power supply unit and a radio communication unit.

An object is loaded on the table during implementation term of magnetic resonance imaging.

The supporting platform movably supports the table.

The power supply unit is fixedly disposed to the supporting platform, and wirelessly transmits electric power to the table side.

The radio communication unit is fixedly disposed to the table and wirelessly receives electric power from the power supply unit. The radio communication unit wirelessly transmits the received electric power to the RF coil device side, and wirelessly receives "an MR signal emitted from an object and detected by the RF coil device" from the RF coil device side.

In the following, some examples of embodiments of the bed devices, the MRI apparatuses and the MRI methods for achieving the aforementioned assignment will be described with reference to the accompanying drawings. Note that the same reference numbers are given for identical components in each figure, and overlapping explanation is abbreviated.

The First Embodiment

FIG. 1 is a block diagram showing an example of the general structure of the MRI apparatus 20A of the first embodiment. As shown in FIG. 1, the MRI apparatus 20A includes a gantry 21 and a bed device 32. In the gantry which is cylinder-shaped as an example, the MRI apparatus 20A includes a static magnetic field magnet 22, a shim coil 24, a gradient magnetic field coil 26 and a transmission RF coil 28. The gantry 21 corresponds to the parts indicated as the two bold line frames in FIG. 1.

The bed device 32 includes a supporting platform 33, a table 34, a table driving device 35 and a signal conflating unit 36. The table 34 is movably supported on the supporting platform 33, and an object P is loaded on the table 34. The table driving device 35 and the signal conflating unit 36 are disposed inside the supporting platform 33. The bed device 32 may be a type whose supporting platform 33 is fixed in terms of position, or may be a dockable type which can move. In the case of the dockable type, the supporting platform 33 includes, for example, a connecting unit (not shown) and four casters (not shown) disposed on its bottom face, and it is connected with the gantry 21 via the connecting unit.

Note that, though the bed device 32 is assumed to be a part of the MRI apparatus 20A as an example in the present embodiment, this is only one example of interpretation. The main body side of the MRI apparatus 20A (all the components of the MRI apparatus 20A excluding the bed device 32) and the bed device 32 may be interpreted as mutually independent units.

The static magnetic field magnet 22 and the shim coil 24 are, for example, cylinder-shaped. Inside the static magnetic field magnet 22, the shim coil 24 is arranged so as to become coaxial with the static magnetic field magnet 22.

As an example here, an apparatus coordinate system, whose X axis, Y axis and Z axis are perpendicular to each other, is defined as follows.

Firstly, it is assumed that the static magnetic field magnet 22 and the shim coil 24 are arranged in such a manner that their axis direction accords with the vertical direction. And the direction of the axis of the static magnetic field magnet 22 and the shim coil 24 is defined as the Z axis direction. In addition, it is assumed that the vertical direction is the same as the Y axis direction. Moreover, it is assumed that the table 34 is disposed in such a position that the direction of "the normal line of the loading plane thereof" is the same as the Y axis direction.

The MRI apparatus 20A includes, on its control side, a static magnetic field power supply 40, a shim coil power supply 42, a gradient magnetic field power supply 44, an RF transmitter 46, an RF receiver 48, a system control unit 52, a system bus 54, an image reconstruction unit 56, an image database 58, an image processing unit 60, an input device 62, a display device 64 and a storage device 66.

Although the RF receiver 48 is disposed inside the gantry 2 as an example here, the RF receiver 48 may be disposed inside the supporting platform 33. Alternatively, a plurality of RF receivers 48 may be respectively disposed inside the gantry 21 and the bed device 32.

The static magnetic field magnet 22 forms a static magnetic field in an imaging space by using an electric current supplied from the static magnetic field power supply 40. The aforementioned "imaging space" means, for example, a space in the gantry 21 in which the object P is placed and to which a static magnetic field is applied.

The static magnetic field magnet 22 includes a superconductivity coil in many cases. The static magnetic field magnet 22 gets the electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The shim coil 24 is electrically connected to the shim coil power supply 42 and uniforms the static magnetic field with the electric current supplied from the shim coil power supply 42.

The gradient magnetic field coil 26 is, for example, arranged in the form of a cylinder inside the static magnetic field magnet 22. The gradient magnetic field coil 26 generates a gradient magnetic field Gx in the X axis direction, a gradient magnetic field Gy in the Y axis direction and a gradient magnetic field Gz in the Z axis direction in the imaging region, by using electric currents supplied from the gradient magnetic field power supply 44. That is, directions of "a gradient magnetic field Gss in a slice selection direction", "a gradient magnetic field Gpe in a phase encoding direction" and "a gradient magnetic field Gro in a readout (frequency encoding) direction" can be arbitrarily set as logical axes, by combining the gradient magnetic fields Gx, Gy and Gz in the three axes of the apparatus coordinate system.

Note that, the above "imaging region" means, for example, a region which is set as a part of the imaging space and is a range of acquisition of MR signals used to generate "one image" or "one set of image". Here, "one set of images" means, for example, a plurality of images when MR signals of the plurality of images are acquired in a lump in one pulse sequence such as multi-slice imaging. The imaging region is defined three-dimensionally in an apparatus coordinate system, for example.

The RF transmitter 46 generates RF pulses in accordance with control information provided from the system control unit 52, and transmits the generated RF pulses to the transmission RF coil 28. The transmission RF coil 28 transmits RF pulses given from the RF transmitter 46 to the object P. The transmission RF coil 28 also includes "a whole body coil (not shown) which is included in the gantry 21 and used for both transmission of RF pulses and detection of MR signals".

Moreover, the MRI apparatus 20A includes RF coil devices 100A and 100B, a reception RF coil 29, a plurality of coil side radio communication devices 200 and a plurality of control side radio communication devices 300A.

The reception RF coil 29 and the plurality of control side radio communication devices 300A are disposed inside the table 34. The reception RF coil 29 detects MR signals generated due to excited nuclear spin inside the object P by the RF pulse, and transmits the detected MR signals to the RF receiver 48.

The RF coil device 100A and 100B are, for example, wearable local RF coil devices for detecting MR signals. Here, "the RF coil device 100A which is set on the chest part of the object P and detects MR signals from the chest part" is shown and "the RF coil device 100B which is set on the pelvic part of the object P and detects MR signals from the pelvic part" is shown, but they are only examples. In the MRI apparatus 20A, various wearable RF coil devices such as a shoulder RF coil device can be used for detection of MR signals aside from the RF coil devices 100A and 100B.

As an example here, these RF coil devices 100A and 100B for detecting MR signals are interpreted as parts of the MRI apparatus 20A. However, these RF coil devices 100A and 100B may be interpreted as components separated from the MRI apparatus 20A.

Each of the RF coil device 100A and 100B includes a cable 102 (see FIG. 4) and is connected to the coil side radio communication device 200 by the cable 102. Each of the coil side radio communication devices 200 is closely fixed to one control side radio communication device 300A which is a communication target.

Thus, one of the coil side radio communication devices 200 acquires the MR signals detected by the RF coil device 100A, and wirelessly transmits the digitized MR signals to one control side radio communication device 300A via an induced electric field. Another coil side radio communication device 200 acquires the MR signals detected by the RF coil device 100B, and wirelessly transmits digitized the MR signals to another control side radio communication device 300A via an induced electric field. Operation of the radio communication will be described later.

Note that, the aforementioned signal conflating unit 36 conflates a serial signal (in which the MR signals detected by the RF coil device 100A are included) obtained from one control side radio communication device 300A and a serial signal (in which the MR signals detected by the RF coil device 100B are included) obtained from another control side radio communication device 300A into one serial signal.

As an example in the first embodiment, the pathway between the signal conflating unit 36 and the RF receiver 48 is connected with an optical communication cable 72 such as an optical fiber, and similarly, the pathway between the RF receiver 48 and the image reconstruction unit 56 is connected with an optical communication cable 74 (corresponding to bold line parts in FIG. 1). Thus, the signal conflating unit 36 converts the synthesized serial signal from an electrical signal into an optical signal, and then transmits the converted signal to the RF receiver 48.

In addition, though only two of the control side radio communication devices 300A are shown in FIG. 1 in order to avoid complication, the number of the control side radio communication devices 300A may be one, three or more than three. However, configuration of including many of the separately arranged control side radio communication devices 300A is more preferable than configuration of including only one control side radio communication device 300A. This is because the former has more choices to closely fix the coil side radio communication device 200 to the control side radio communication device 300A.

In other words, if there are more choices of fixing positions, the coil side radio communication device 200 can be fixed on the nearest control side radio communication device 300A thereto. If it is fixed in such a manner, the cable 102 between the RF coil device 100A (100B) and the coil side radio communication device 200 can be shortened. Note that, the aforementioned "closely fix" means, for example, to fix mutually immovably within a range (distance) of being mutually electro-magnetically coupled so as to be capable of radio communication via an induced electric field.

Note that, as an example in the present embodiment, transmission of an RF pulse to the transmission RF coil 28 inside the MRI apparatus 20A and transmission of MR signals detected from the object P are performed under wire transmission except the pathway between the coil side radio communication device(s) 200 and the control side radio communication device(s) 300A.

The RF receiver 48 generates complex number data of digitized MR signals (hereinafter, referred to as raw data of MR signals) by performing predetermined signal processing. The RF receiver 48 inputs the generated raw data of MR signals to the image reconstruction unit 56 via the optical communication cable 74.

The system control unit 52 performs system control of the entirety of the MRI apparatus 20A in imaging operation and an image display after the imaging operation via interconnection lines such as the system bus 54.

For the sake of achieving the above control, the system control unit 52 stores control information needed in order to make the gradient magnetic field power supply 44, the RF transmitter 46 and the RF receiver 48 drive. The aforementioned "control information" includes, for example, sequence information describing operation control information such as intensity, application period and application timing of the pulse electric currents which should be applied to the gradient magnetic field power supply 44.

The system control unit 52 generates the gradient magnetic fields Gx, Gy and Gz and RF pulses by driving the gradient magnetic field power supply 44, the RF transmitter 46 and the RF receiver 48 in accordance with a predetermined sequence stored therein.

In addition, the system control unit 52 functions as an imaging condition setting unit. That is, the system control unit 52 sets the imaging conditions of the main scan on the basis of some of the imaging conditions and information inputted to the input device 62 by a user. For the sake of achieving this, the system control unit 52 makes the display device 64 display screen information for setting the imaging conditions.

The input device 62 provides a user with a function to set imaging conditions and image processing conditions.

The aforementioned term "imaging condition" refers to under what condition an RF pulse or the like is transmitted in what type of pulse sequence, or under what condition MR signals are acquired from the object P, for example. As a parameter of the "imaging conditions", for example, there are "the imaging region as positional information in the imaging space", an imaging part, the type of the pulse sequence such as parallel imaging, the type of RF coil devices used for imaging, the number of slices, an interval between respective slices.

The above "imaging part" means a region of the object P to be imaged as an imaging region, such as a head, a chest and an abdomen.

The aforementioned "main scan" is a scan for imaging an intended diagnosis image such as a proton density weighted image, and it does not include a scan for acquiring MR signals for a scout image or a calibration scan.

A scan is an operation of acquiring MR signals, and it does not include image reconstruction processing.

The calibration scan is, for example, a scan for determining "unconfirmed elements of imaging conditions", "conditions and data used for image reconstruction processing" and so on, and it is performed separately from the main scan. The after-mentioned "prescan" is a calibration scan which is performed before the main scan.

The image reconstruction unit 56 converts the raw data of MR signals inputted from the RF receiver 48 into, for example, matrix data on the basis of a phase encode step number and a frequency encode step number, and stores the converted data as k-space data. The k-space means a frequency space (Fourier space). The image reconstruction unit 56 generates image data of the object P by performing image reconstruction processing including such as two-dimensional Fourier transformation on the k-space data. The image reconstruction unit 56 stores the generated image data in the image database 58.

The image processing unit 60 takes in the image data from the image database 58, performs predetermined image processing on them, and stores the image data after the image processing in the storage device 66 as display image data.

The storage device 66 stores the display image data after adding "accompanying information such as the imaging conditions used for generating the display image data and information of the object P (patient information)" to the display image data. The display device 64 displays a screen for setting imaging conditions of the main scan and images indicated by the generated display image data under control of the system control unit 52.

Figure 2:
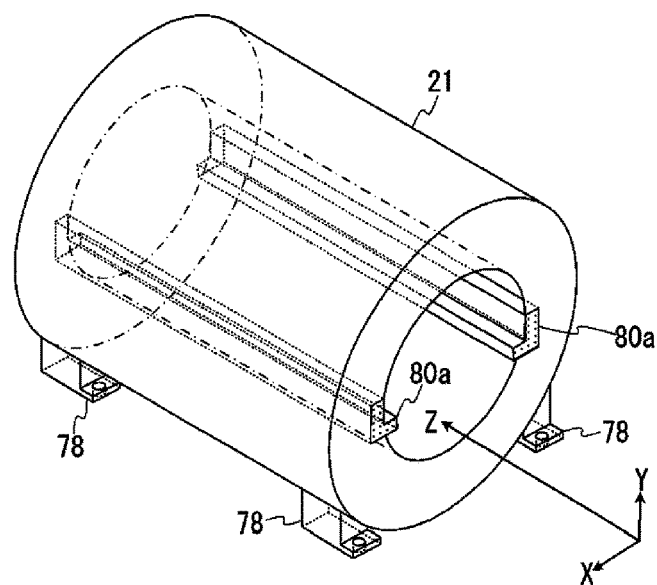
FIG. 2 is a schematic oblique drawing showing an overview of the gantry of the MRI apparatus of the first embodiment.

FIG. 2 is a schematic oblique drawing showing an overview of the gantry 21 of the MRI apparatus 20A of the first embodiment. As shown in FIG. 2, as an example here, the gantry 21 is in the form of a cylinder, and its interior space becomes the imaging space. In addition, the gantry 21 is fixed on the flooring of the imaging room (shield room) with its four legs 78, for example. For the sake of avoiding complication in FIG. 2, only three legs 78 are shown.

In addition, on the interior wall of the gantry 21, two rails 80a are formed at the common height in the vertical direction (the Y axis direction), along the Z axis direction of the apparatus coordinate system. When the table 34 is inserted inside the gantry 21, both ends of the table 34 are supported by the rails 80a.

Figure 3:
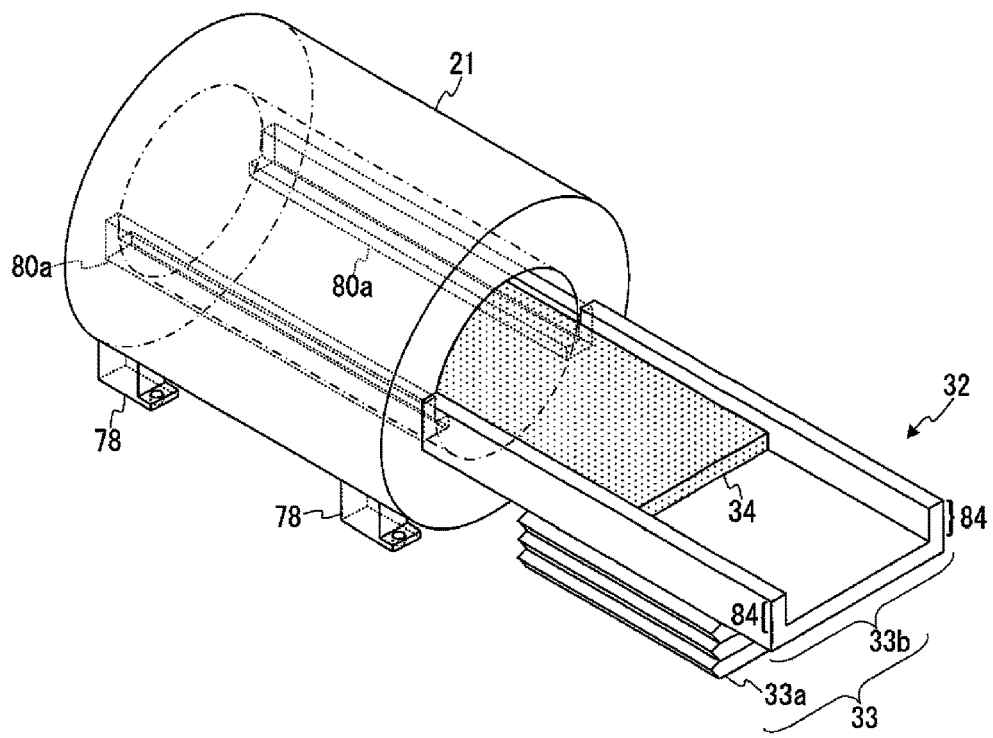
FIG. 3 is a schematic oblique drawing showing an overview of the gantry and the bed device of the MRI apparatus of the first embodiment.

FIG. 3 is a schematic oblique drawing showing an overview of the gantry 21 and the bed device 32 of the MRI apparatus 20A of the first embodiment. The supporting platform 33 includes a hoisting unit 33a and the table slide unit 33b. In the example of FIG. 3, the table 34 is the hatching region, a part of the table 34 is inside the gantry 21, and the rest of the table 34 is on the table slide unit 33b. The system control unit 52 moves the table 34 up and down in the Y axis direction by changing the height of the hoisting unit 33a, when the entirety of the table 34 is located outside the gantry 21.

The table slide unit 33b is a platform whose transverse section in the X-Y plane of the apparatus coordinate system is in the form of an angle bracket, for example. The table slide unit 33b has a structure obtained by integrally forming the projecting portions 84 respectively on both ends of a flat plate whose width is wider than the table 34, for example. The interval between the ambilateral projecting portions 84 is equal to the width of the table 34, or slightly wider than the width of the table 34. Thus, the table 34 slidably moves along the ambilateral rails 80a and the ambilateral projecting portions 84 in the Z axis direction of the apparatus coordinate system.

Concretely speaking, the system control unit 52 makes the table 34 move into and out of the imaging space in the gantry 21 in the Z axis direction, by controlling the table driving device 35. The system control unit 52 locates the imaging part of the object P near to the center of the magnetic field in the imaging space, by controlling the position of the table 34 in the above manner.

Figure 4:
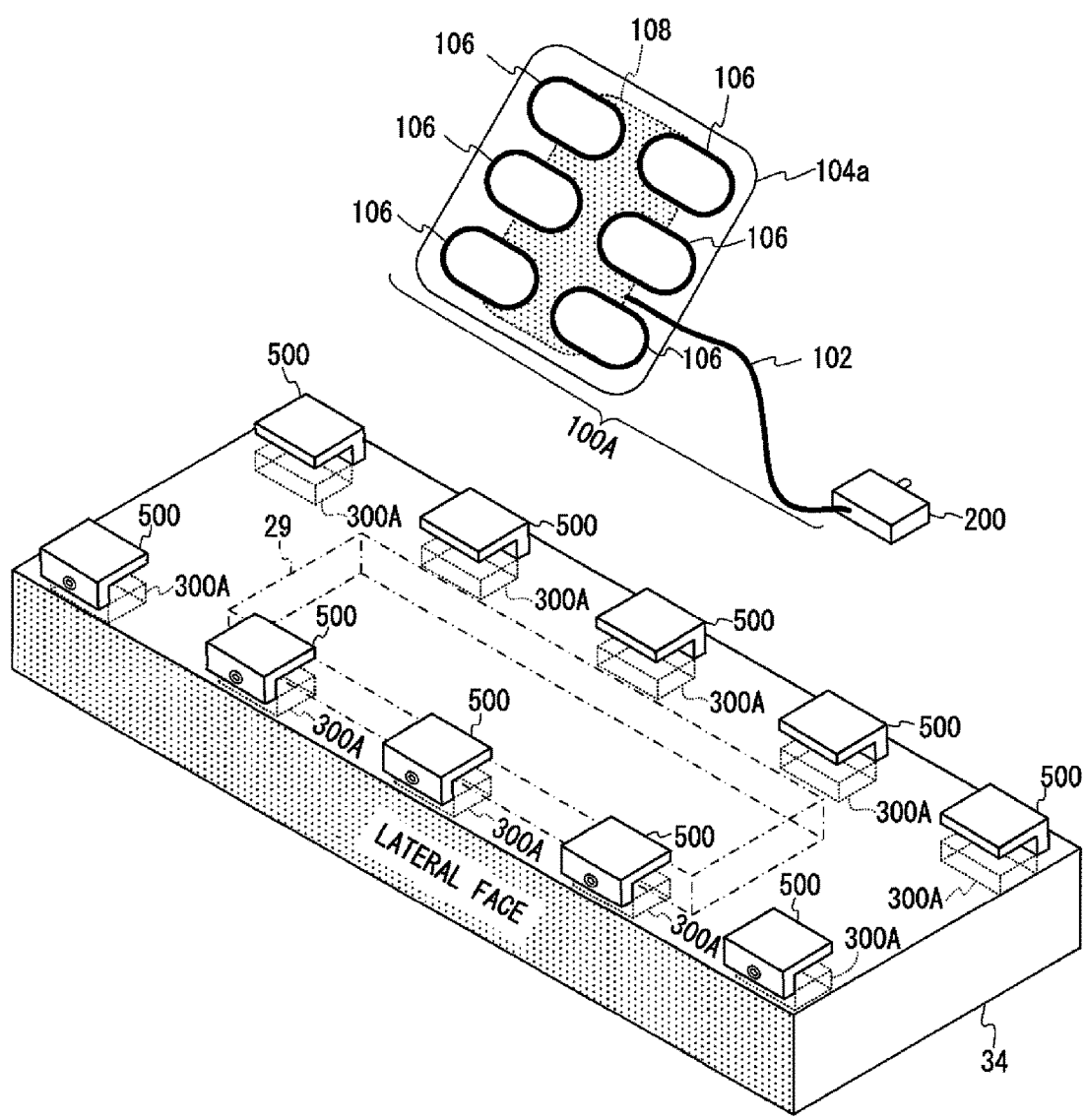
FIG. 4 is a schematic oblique drawing showing an example of the structure of the RF coil device and the arrangement of the control side radio communication devices in the first embodiment.

FIG. 4 is a schematic oblique drawing showing an example of the structure of the RF coil device 100A and the arrangement of the control side radio communication devices 300A in the first embodiment. As shown in FIG. 4, the RF coil device 100A includes a cable 102 and a cover member 104a. The cover member 104a is made of a flexible material and is capable of deformation such as folding. As such a deformable (flexible) material, for example, a flexible circuit board (Flexible Printed Circuit: FPC) described in Japanese Patent Application Laid-open (KOKAI) Publication No. 2007-229004 can be used.

Inside the cover member 104a, a plurality of coil elements (surface coils) 106 functioning as antennas which respectively detect MR signals from the object P are disposed. Although six coil elements 106 are shown in FIG. 4 as an example here, the number or shape of the coil elements 106 are not limited to the shown number or shape.

In addition, inside the cover member 104a, a selection control unit 108 which controls the operation of the RF coil device 100A such as selection of the coil elements 106 for detecting MR signals is disposed. Although there are other components such as A/D (analog to digital) converters 212 inside the cover member 104a, their details will be described later with FIG. 11.

As an example here, the coil side radio communication device 200 and the RF coil device 100A are assumed to be mutually separate components, but this is only an example of interpretation. The coil side radio communication device 200 may be interpreted as apart of the RF coil device 100A.

The cable 102 is connected to the coil side radio communication device 200 of the MRI apparatus 20A on its one end, and is connected to the selection control circuit 108 and so on inside the cover member 104a on its other end.

In addition, inside the cover member 104a of the RF coil device 100A, components such as preamplifiers for amplifying the MR signals detected by the coil elements 106 and bandpass filters for filtering may be disposed.

Note that, though it is not shown in FIG. 4, the structure of the RF coil device 100B is the same as the RF coil device 100A except the following two points. Firstly, the cover member of the RF coil device 100B is shaped in such a form that the cover member can be easily set on the pelvic part. Secondly, the number and the shape of the respective coil elements 106 of the RF coil device 100B are composed in such a manner that the coil elements 106 can easily detect MR signals from the pelvic part.

As an example here, ten of the control side radio communication devices 300A are arranged immediately beneath the surface of the table 34 on which the object P is loaded (hereinafter, this surface is referred to as the top face of the table 34). The object P is, for example, loaded in the middle of the width direction (the X axis direction in FIG. 1) of the table 34.

Thus, in this example, on both lateral faces sides of the table 34, five of the control side radio communication devices 300A are respectively arranged along the lateral faces in a row at intervals. That is, five of the control side radio communication devices 300A are disposed on each of the ambilateral faces sides along the longitudinal direction (the Z axis direction) of the table 34. Note that, one of the lateral faces of the table 34 is the region filled with the hatching in FIG. 4.

The number or arrangement position of the control side radio communication devices 300A is not limited to that of FIG. 4 (inside the table 34). For example, the control side radio communication devices 300A may be disposed and exposed on the table 34.

In the first embodiment, the table 34 includes, for example, ten of the fixing structures 500 fixed on its top face. Each supporting member 502a (see FIG. 5) of the ten fixing structures 500 is fixed to such a position that the ten fixing structures 500A respectively face the ten control side radio communication devices 300A in the thickness direction of the table 34. As to the fixing method, for example, bonding may be used. Alternatively, the fixing structures 500 may be integrally formed as a part of the top face of the table 34, by using the same material as the top face.

Figure 5:
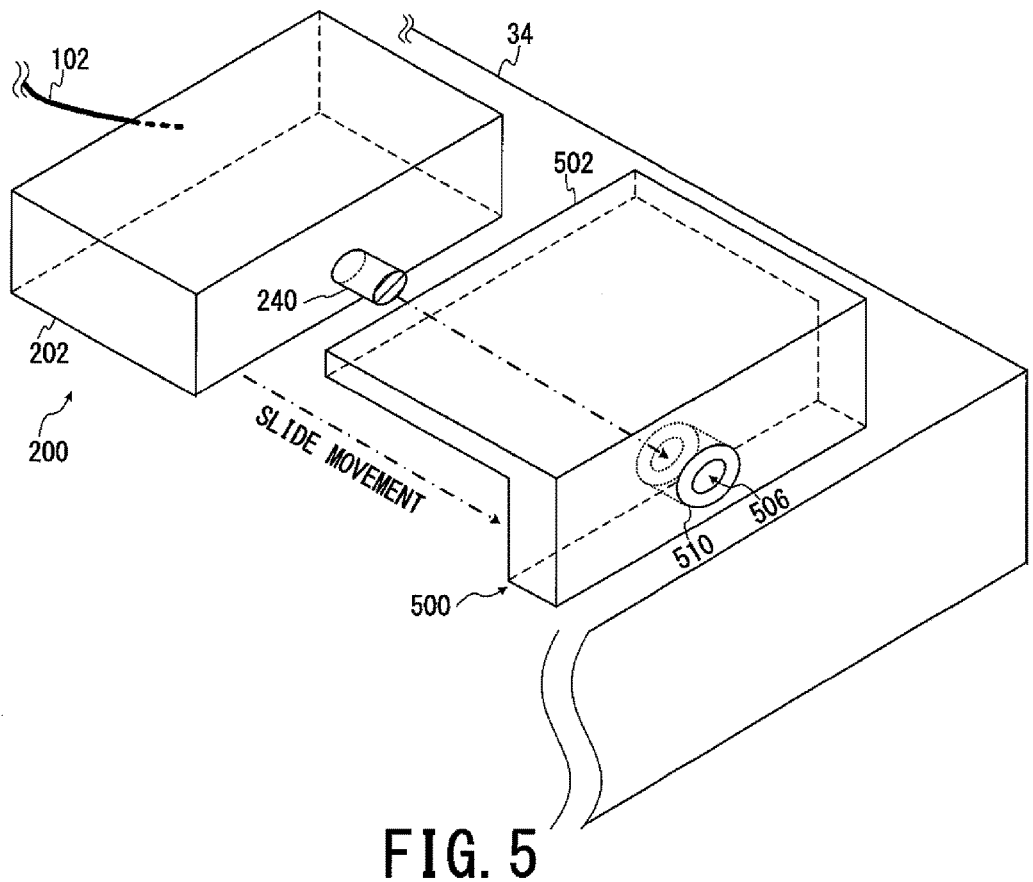
FIG. 5 is a schematic oblique drawing showing an example of a method of fixing the coil side radio communication device in the first embodiment.

FIG. 5 is a schematic oblique drawing showing an example of a method of fixing the coil side radio communication device 200 in the first embodiment. FIG. 5 shows an overview of the state in which the coil side radio communication device 200 and the fixing structure 500 are mutually separated. As shown in FIG. 5, the fixing structure 500 includes a supporting member 502 and an elastic member 510 covering an insertion hole 506 formed on the supporting member 502.

The coil side radio communication device 200 includes a chassis 202 and a columnar jut 240. As an example here, the jut 240a is disposed on the center of the surface opposite to "the surface to which the cable 102 is connected" of the chassis 202. This is so that the jut 240 can be easily interdigitated with the insertion hole 506 by sliding the coil side radio communication device 200 on the top face of the table 34.

The supporting member 502 of the fixing structure 500 has a shape obtained by bending a flat plate made of undeformable nonmagnetic material, and its transverse section is an L-letter shape. Note that, influence on the radio communication via an induced electric field can be avoided by forming the fixing structure 500 with nonmagnetic material.

In the supporting member 502, the insertion hole 506 is formed on the surface which is in parallel with the thickness direction of the table 34. The aperture of the insertion hole 506 is circular. The diameter and depth of the insertion hole 506 are such dimensions that the insertion hole 506 interdigitate the jut 240. The surrounding region of the insertion hole 506 is formed as the elastic member 510 having elasticity such as rubber. As an example here, the elastic member 510 is cylinder-shaped and can be made of, for example, silicone rubber, polyethylene or synthetic resin.

Figure 6:
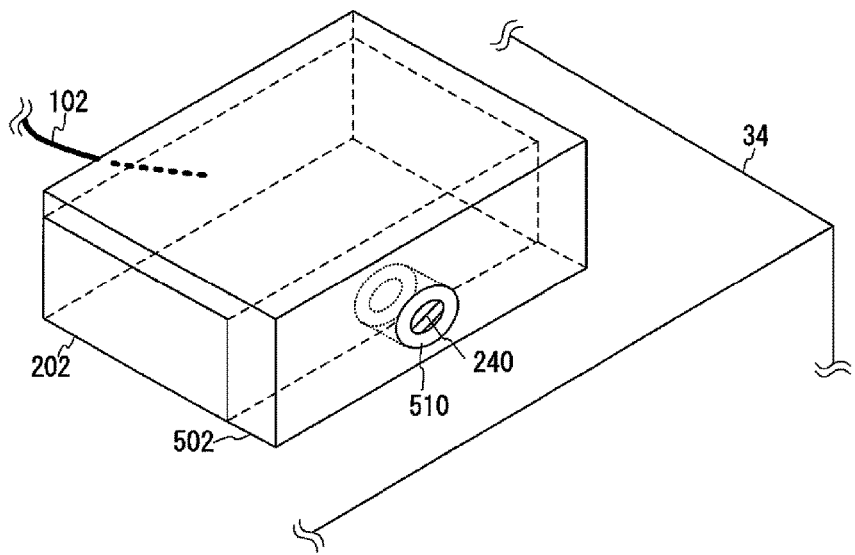
FIG. 6 is a schematic oblique drawing showing a state in which the coil side radio communication device is fixed in the first embodiment.

FIG. 6 is a schematic oblique drawing showing a state in which the coil side radio communication device 200 is fixed. The coil side radio communication device 200 can be interdigitated with the fixing structure 500 by sliding it from the state in which the coil side radio communication device 200 is placed on the top face of the table 34. That is, as shown in FIG. 6, the coil side radio communication device 200 and the fixing structure 500 are interdigitated with each other in such a manner that the jut 240 is interdigitated with the insertion hole 506, and thereby the coil side radio communication device 200 is unfailingly fixed on the table 34 by the frictional force of the elastic member 510.

Note that, the above interdigitation is only an example of methods of fixing the coil side radio communication device 200, and other detachable fixing methods may be alternatively used. For example, out of the male side and the female side of a hook-and-loop fastener such as Velcro (Trademark), one side may be fixed to the top face of the table 34 and the other side may be fixed to the bottom surface of the coil side radio communication device 200.

Figure 7:
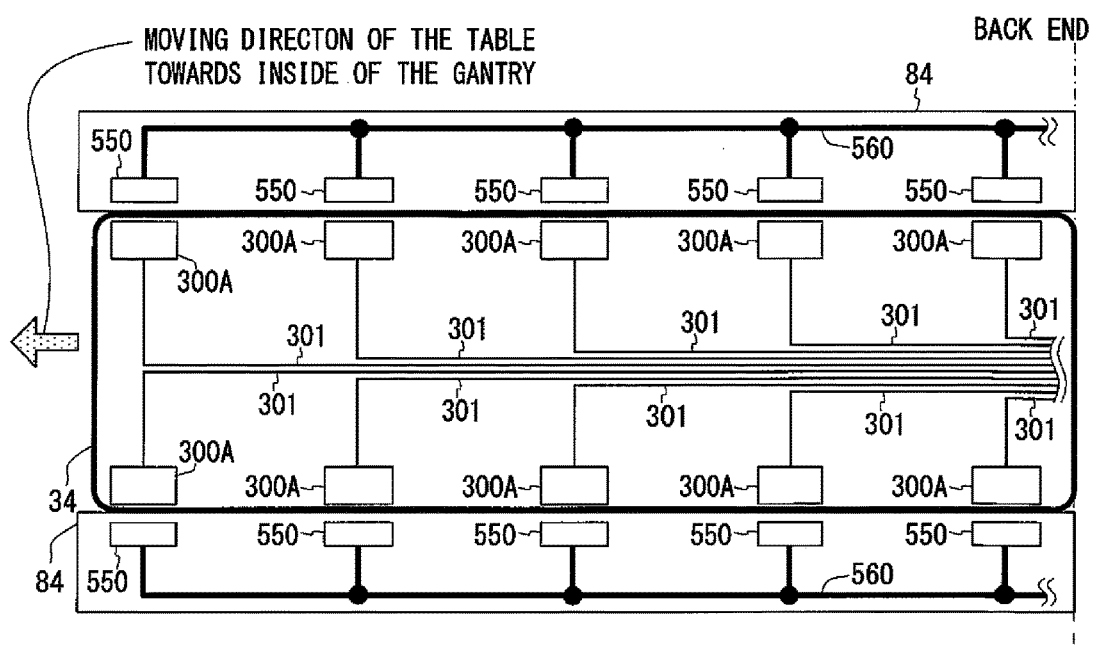
FIG. 7 is a schematic planimetric diagram showing an example of the arrangement of the control side radio communication devices and the bed side charging units in the first embodiment.

FIG. 7 is a schematic planimetric diagram showing an example of the arrangement of the control side radio communication devices 300A and the bed side charging units 550 in the first embodiment. As shown in FIG. 7, inside the ambilateral projecting portions 84 of the table slide unit 33b (see FIG. 3) of the supporting platform 33, totally ten bed side charging units 550 are disposed at regular intervals (i.e. five bed side charging units 550 are arranged for each projecting portion 84). A coli is included inside each of the control side radio communication devices 300A and each of the bed side charging units 550 (see later-described FIG. 10). An electric current for charging is supplied to the coil of each of the bed side charging units 550 by a power wire 560.

FIG. 7 shows the state in which the table 34 is positioned most backward, i.e. the state in which the table 34 is the most distant from the gantry 21. In this state, the back end of the table 34 accords with the back end ("BACK END" in FIG. 7) of the table slide unit 33b. Because the entirety of the table 34 is located outside the gantry 21 in this state, operation of moving up and down the table by the hoisting unit 33a is practicable in this position.

The ten bed side charging units 550 are arranged so as to respectively face the ten control side radio communication devices 300A when the table 34 is located at the above position. That is, in each lateral face side (facing the lateral face of the table 34) of the projecting portions 84, five bed side charging units 550 are disposed at regular intervals along the lateral face (along the Z axis direction of the apparatus coordinate system).

Concretely speaking, the ten bed side charging units 550 individually corresponds to the ten control side radio communication devices 300A, and each of the bed side charging units 550 wirelessly transmits electric power to the corresponding control side radio communication device 300A. The above "corresponding" means, for example, the nearest control side radio communication device 300A when the table 34 is located at the above predetermined position.

Thus, the control side radio communication devices 300A and the bed side charging units 550 are disposed in such a manner that the interval between "the coil in each of the control side radio communication devices 300A" and "the coil in the corresponding bed side charging unit 550" becomes an interval of elector-magnetically coupling the both sides when the table 34 is located at the above position. When the table 34 is located at the above position, transmission of electric power is performed between the control side radio communication devices 300A and the bed side charging units 550 by the induced magnetic fields penetrating the lateral faces of the table 34 and the lateral faces of the projecting portions 84. As to the electric power transmission, it will be explained later with FIG. 10.

In addition, though optical communication cables 301 individually connected to each of the control side radio communication devices 300A are disposed inside the table 34, any power wire is not disposed inside the table 34. Each of the optical communication cables 301 is a batch of a plurality of signal lines corresponding to the respective components inside the control side radio communication device 300A.

Figure 8:
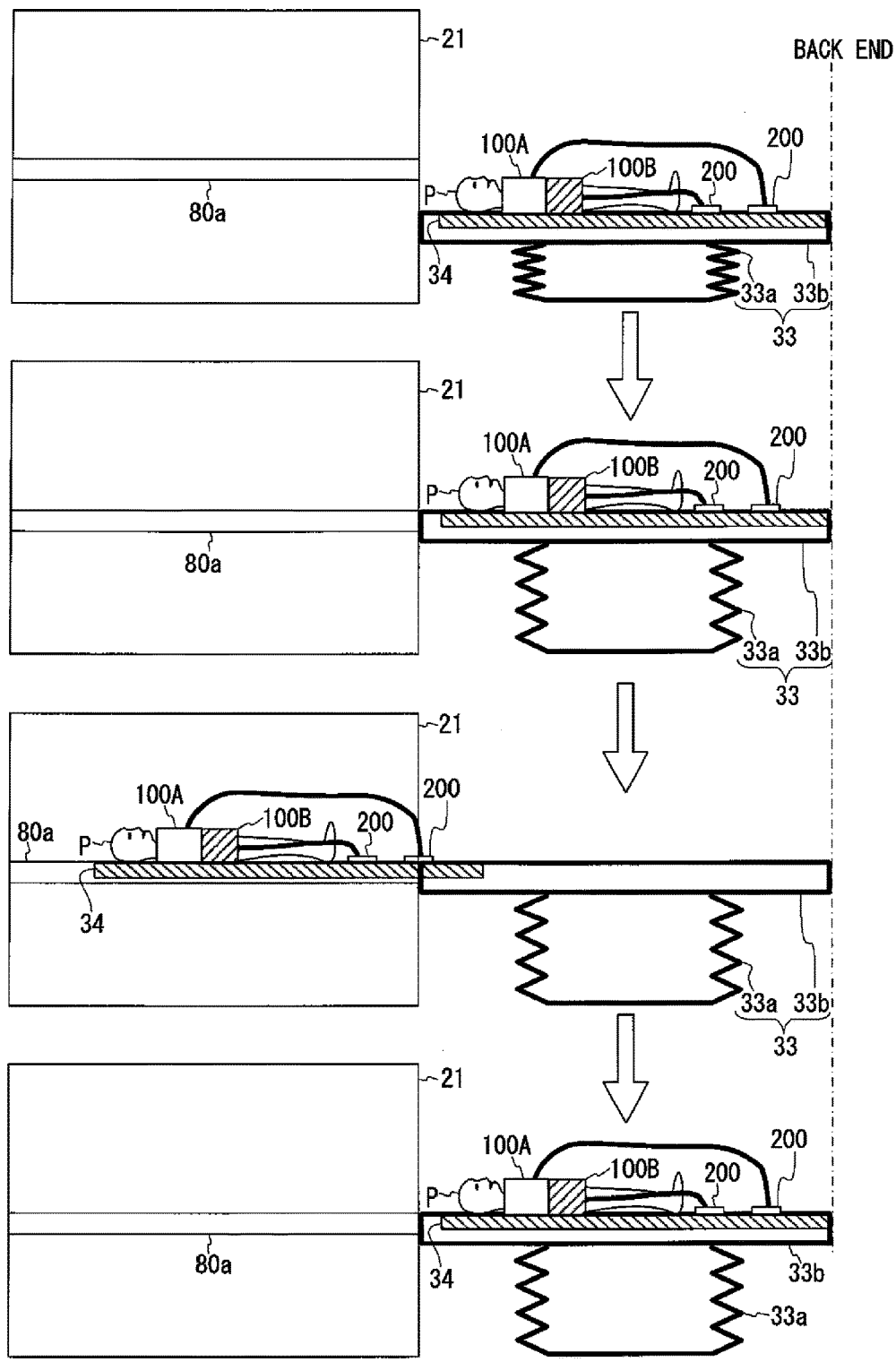
FIG. 8 is a schematic cross-sectional diagram in a Y-Z plane of the apparatus coordinate system, showing an example of the up-and-down operation of the supporting platform and the horizontal moving operation of the table in the first embodiment.

FIG. 8 is a schematic cross-sectional diagram in a Y-Z plane of the apparatus coordinate system, showing an example of the up-and-down operation of the supporting platform 33 and the horizontal moving operation of the table 34 in the first embodiment. As an example in FIG. 8, the flow of the motion of the table 34 is shown by four phases from top to bottom in order.

The top part of FIG. 8 shows the state in which the table 34 is the most distant from the gantry 21 and its back end accords with the back end of the table slide unit 33b. In addition, the top part of FIG. 8 shows the state in which the height of the supporting platform 33 is lowered by the hoisting unit 33a. For example, in this state, the object P is loaded on the table 34 and the RF coil devices 100A and 100B are set on the object P.

Next, the system control unit 52 raises the height of the supporting platform 33 by controlling the hoisting unit 33a in such a manner that the height of the projecting portions 84 of the table slide unit 33b accords with the height of the rails 80a. The second top part of FIG. 8 shows this state, and the table 34 can slide from the table slide unit 33b side to inside of the gantry 21 in this state.

Note that, setting of the RF coil devices 100A and 100B to the object P and a manipulation of fixing the coil side radio communication device 200 may be performed in the state in which the height of the supporting platform 33 is raised in this manner.

Next, the table driving device 35 (see FIG. 1) slides "the table 34 on which the object P is loaded" to inside of the gantry 21 in the Z axis direction of the apparatus coordinate system along the rails 80a, in accordance with control of the system control unit 52. At this time, the position of the table 34 is controlled in such a manner that the imaging part of the object P is positioned near to the center of the magnetic field inside the gantry 21. The third top part of FIG. 8 shows this state. In this state, the after-mentioned prescans and the main scan are performed.

Next, after completion of the main scan, the table driving device 35 slides the table 34 along the rails 80a in the Z axis direction of the apparatus coordinate system in accordance with control of the system control unit 52, so as to return its position to the supporting platform 33 side. The bottom part of FIG. 8 shows the state in which the table 34 is returned to the predetermined position of the top part of FIG. 8.

Figure 9:
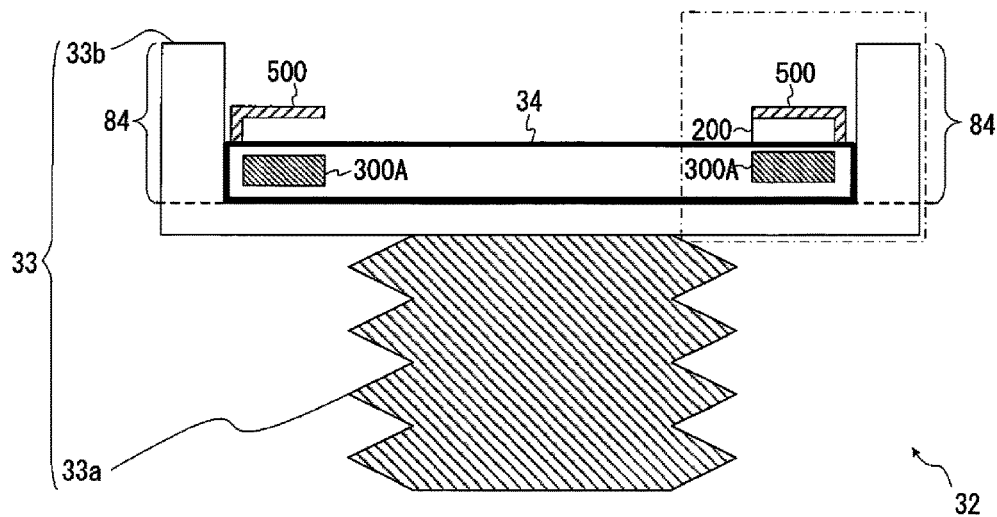
FIG. 9 is a schematic cross-sectional diagram in an X-Y plane of the apparatus coordinate system, showing an example of structure of the bed device in the first embodiment.

FIG. 9 is a schematic cross-sectional diagram in an X-Y plane of the apparatus coordinate system, showing an example of the structure of the bed device 32 in the first embodiment.

Figure 10:
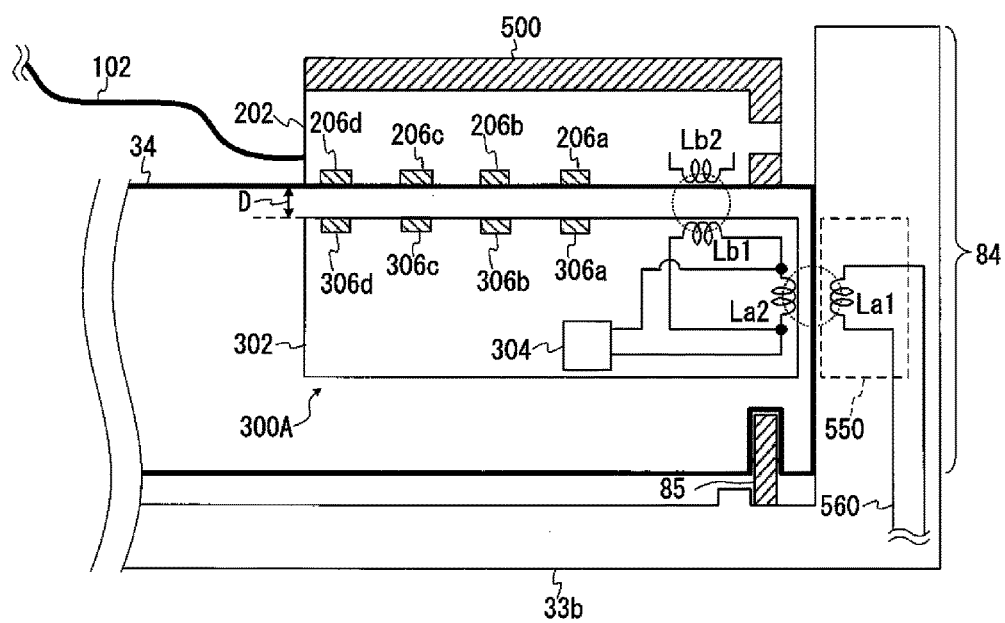
FIG. 10 is a schematic cross-sectional diagram showing an example of the structure of the coil side radio communication device, the control side radio communication device and the bed side charging unit by magnifying the frame part of a chain line in FIG. 9.

FIG. 10 is a schematic cross-sectional diagram showing an example of the structure of the coil side radio communication device 200, the control side radio communication device 300A and the bed side charging unit 550 by magnifying the frame part of a chain line in FIG. 9. FIG. 9 and FIG. 10 show the state in which one coil side radio communication device 200 connected to the RF coil device 100A or 100B is closely fixed to one control side radio communication device 300A by the fixing structure 500.

In the following, the radio communication between the coil side radio communication device 200 and the control side radio communication device 300A will be explained by reference to FIG. 9 and FIG. 10. As shown in FIG. 10, the control side radio communication device 300A includes a battery unit 304, a coil La2, a coil Lb1 and antennas 306a, 306b, 306c and 306d. The coil side radio communication device 200 includes a coil Lb2 and antennas 206a, 206b, 206c and 206d.

The short-distance radio communication via an induced electric field is performed on the pathway between the coil side radio communication device 200 and the control side radio communication device 300A. An induced electric field means an electric field caused by time change of magnetic flux density. As short-distance radio communication via an induced electric field, for example, "TransferJet (Trademark) which uses an induced electric field combined coupler as an antenna" can be used (see Japanese Patent Application Laid-open (KOKAI) Publication No. 2010-147922, for example).

More specifically, the induced electric field combined coupler includes a coupling electrode, a resonance stub, a ground and so on (not shown). If an electric signal is inputted to the resonance stub of the transmission side, electric charges are accumulated in the coupling electrode, and "virtual electric charges equal to the electric charges accumulated in the coupling electrode" are generated in the ground. Thereby, a micro electrical dipole is composed by these electric charges, and this micro electrical dipole functions as a transmission side antenna. That is, data are transmitted to the receiving side via an induced electric field of a longitudinal wave generated by the micro electrical dipole. Because a longitudinal wave vibrating in parallel with the traveling direction is not influenced by the direction of an antenna, stable data transmission can be achieved.

However, if the receiving side is separated from the transmission side beyond its limit, both sides are not electromagnetically coupled and data transmission cannot be performed. This is because induced electric fields formed by the induced electric field combined couplers rapidly attenuate if the interval between both sides of the couplers becomes distant.

The distance D in FIG. 10 is a distance between the coil side radio communication device 200 and the control side radio communication device 300A under the state in which the coil side radio communication device 200 is closely fixed on the upper side of one of the control side radio communication devices 300A by the fixing structure 500. The distance D is short enough as to be able to achieve "the radio communication via an induced electric field between the coil side radio communication device 200 and the control side radio communication device 300A" and "electric power transmission via an induced magnetic field between the coil side radio communication device 200 and the control side radio communication device 300A".

Each of the antennas 306a to 306d of the control side radio communication device 300A corresponds to each of the antennas 206a to 206d of the coil side radio communication device 200 so as to group into a pair (totally, four pairs). Out of the antennas 206a to 206d and 306a to 306d, at least the pathway between the antennas 206a and 306a is composed of, for example, the above induced electric field combined couplers. The antennas 206a to 206d are disposed so as to face the antennas 306a to 306d respectively, when the coil side radio communication device 200 is fixed so as to face the control side radio communication device 300A.

Although the antennas 206a to 206d are discretely disposed and the antennas 306a to 306d are discretely disposed in order to distinguish respective components in FIG. 10, this is only an example. Interference between each of the four radio communication pathways can be avoided without arranging them separately.

More specifically, the four radio frequencies respectively used in the pathway of the antennas 206a to 306, the pathway of the antennas 206b to 306b, the pathway of the antennas 206c to 306c and the pathway of the antennas 206d to 306d may be separated (their frequency values may be widely set apart). As to the radio communication frequency, it is preferable to avoid frequencies which are equal to numbers obtained by dividing "a center frequency of RF pulses transmitted to the object P" by a natural number, in each of the radio communication pathway.

It is preferable that installation positions of the control side radio communication devices 300A are not too deep from the top face of the table 34. If positions of the antennas 306a to 306d of each of the control side radio communication devices 300A in the table 34 are too deep, the interval D between the transmission side and the receiving side cannot be close enough to electro-magnetically couple "the antennas 206a to 206d of the transmission side" to "the antennas 306a to 306d of the receiving side". In this case, the radio communication via an induced electric field will be difficult to be achieved.

That is, it is preferable to dispose each of the control side radio communication devices 300A to such a position that "each control side radio communication device 300A can be fixed to the coil side radio communication device 200 close enough to be electro-magnetically coupled to the coil side radio communication device 200".

Note that, as long as "an electric dipole (antenna) of the coil side radio communication device 200 side" is not directly contacted to "an electric dipole (antenna) of the control side radio communication device 300A side", "the chassis covering the antennas of the coil side radio communication device 200 side" may be contacted to "the chassis covering the antennas of the control side radio communication device 300A side". This is because it is enough if the interval D causing an induced electric field is kept between the antennas of the transmission side and the antennas of the receiving side. Thus, the control side radio communication devices 300A may be exposed in such a manner that its surface of the antennas side becomes in line with the top face of the table 34.

In addition, if imaging time is long, for example, 30 minutes, a transmission span of the MR signals becomes long. During the transmission span, it is preferable to fix the transmission side and the receiving side each other so as not to jolt out of alignment. Thus, "configuration of including a component which fixes the transmission side and the receiving side so as not to move each other" is preferable like the fixing structure 500 of the present embodiment.

By equipping a fixing method, the MRI apparatus 20A becomes free from "the possibility that the RF coil devices 100A and 100B loaded on the object P are moved by movement of the object P during imaging and this moves the coil side radio communication devices 200, resulting in communication error of the MR signals detected from the object P".

Next, the wireless transmission of electric power will be explained. As shown in FIG. 10, the bed side charging unit 550 includes a coil La1. In addition, inside the control side radio communication device 300A, the coil La2 is connected to the coil Lb1 in series. FIG. 10 is a cross-section when the table 34 is located at the predetermined position shown in the bottom part of FIG. 8. In this case, the coil La1 of the bed side charging unit 550 is close enough to be electro-magnetically coupled to the coil La2 of the control side radio communication device 300A (the coil La1 of the bed side charging unit 550 and the coil La2 of the control side radio communication device 300A are arranged so as to achieve this condition).

When the coil side radio communication device 200 is closely fixed to the control side radio communication device 300A and the table 34 is located at the above predetermined position, the system control unit 52 supplies electric power (an excitation current) to the coil La1 via the power wire 560 disposed inside the projecting portions 84. Thereby, "an induced magnetic field penetrating the lateral face of the table 34 and the lateral face of the projecting portion 84" is generated, and an induced electric current flows in the coil La2 of the control side radio communication device 300A.

Here, as an example in the present embodiment, apart of the induced electric current flowing in the coil La2 is converted into direct-current electricity inside the battery unit 304 and charges a rechargeable battery (not shown) inside the battery unit 304. The control side radio communication device 300A operates by using the accumulated electric power of this rechargeable battery. On the other hand, the rest of the induced electric current flowing in the coil La2 flows into the coil Lb1 as an excitation current for the coil Lb2 of the coil side radio communication device 200.

An induced magnetic field penetrating the top face of the table 34 is caused by the electric current flowing in the coil Lb1, and an induced current flows in the coil Lb2 of the coil side radio communication device 200. The coil side radio communication device 200 charges the rechargeable battery BA (see later-described FIG. 11) inside the RF coil device (100A or 100B) by using the induced current flowing in the coil Lb2.

Note that, as an example here, a plurality of wheels 85 and wheel axes (not shown) are disposed to the bottom face of the table 34.

Figure 11:
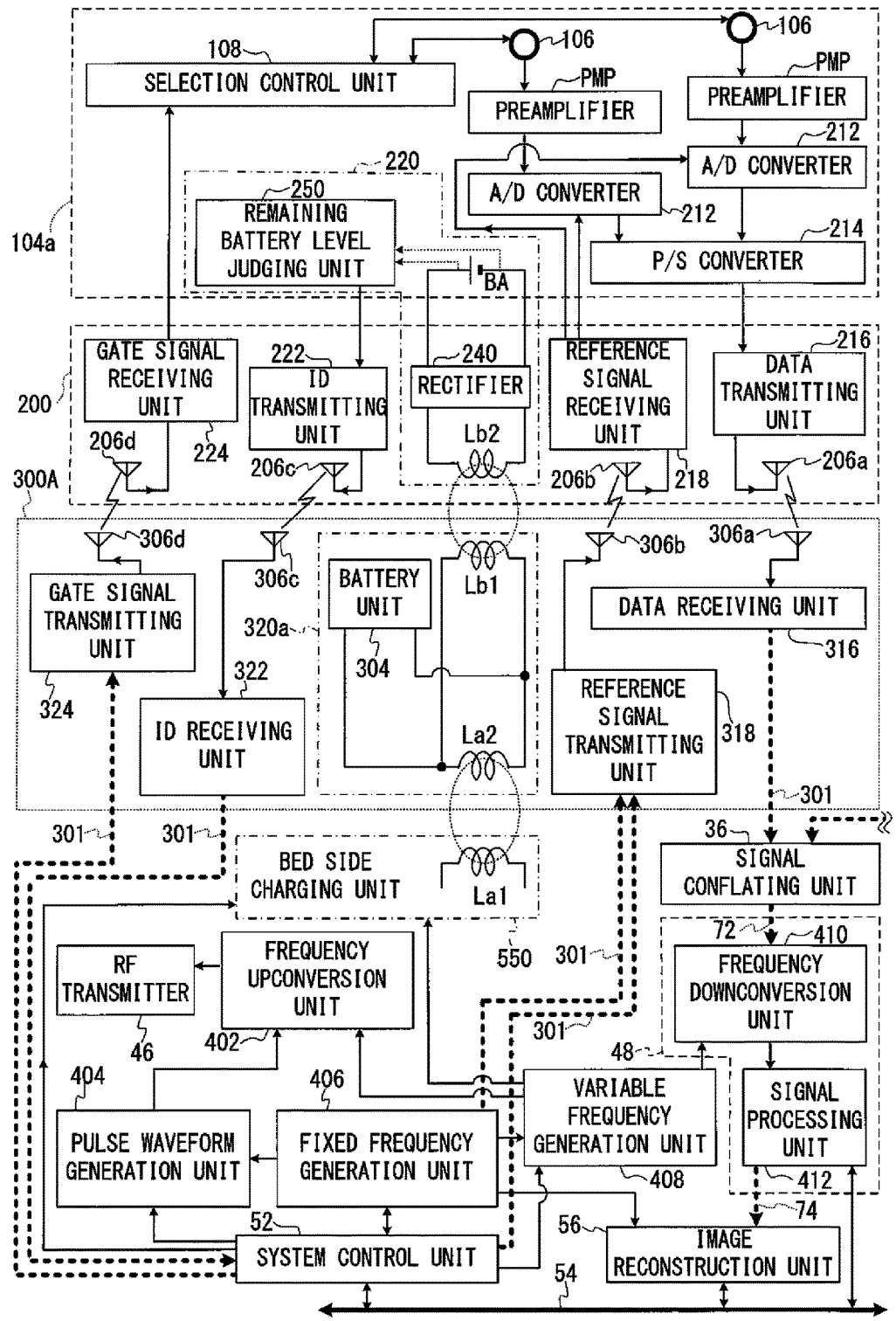
FIG. 11 is a schematic block diagram showing the power supply system to the RF coil device and the transmission system of MR signals detected by the RF coil device in the first embodiment.

FIG. 11 is a schematic block diagram showing the power supply system to the RF coil device 100A and the transmission system of the MR signals detected by the RF coil device 100A in the first embodiment. Although only two of the coil elements 106 inside the cover member 104a of the RF coil device 100A are shown in FIG. 11 in order to avoid complication, actually more coil elements 106 are arranged (see FIG. 4). As shown in FIG. 11, inside the cover member 104a, a plurality of preamplifiers PMP, a plurality of A/D converters 212, a P/S (Parallel/Serial) converter 214, the rechargeable battery BA and a remaining battery level judging unit 250 are disposed.

The coil side radio communication device 200 includes a data transmitting unit 216, a reference signal receiving unit 218, an ID (Identification Information) transmitting unit 222, a gate signal receiving unit 324, a rectifier 240, the aforementioned coil Lb2 and the antennas 206a to 206d.

A power receiving unit 220 is composed of "the rechargeable battery BA and the remaining battery level judging unit 250 inside the cover member 104a" and "the coil Lb2 and the rectifier 240 inside the coil side radio communication device 200". Note that, though only two preamplifiers PMP and two A/D converters 212 are shown in FIG. 11 in order to avoid complication, actually, for example, the same number of the preamplifiers PMP as the coil elements 106 are arranged and the same number of the A/D converters 212 as the coil elements 106 are arranged.

The control side radio communication device 300A further includes a data receiving unit 316, a reference signal transmitting unit 318, a power transferring unit 320a, an ID (Identification Information) receiving unit 322 and a gate signal transmitting unit 324. In addition, the power transferring unit 320a includes the battery unit 304, the coil La2 and the coil Lb1 explained in FIG. 10.

As described earlier, each of the control side radio communication devices 300A are arranged along the lateral face of the table 34 on the side of this lateral face at regular intervals (see FIG. 4 and FIG. 7). Therefore, the power transferring unit 320a and the coils La2 and Lb1 as its components of each of the control side radio communication devices 300A are arranged along the lateral face of the table 34 on the side of this lateral face.

In addition, the control system of the MRI apparatus 20A further includes a frequency upconversion unit 402, a pulse waveform generation unit 404, a fixed frequency generation unit 406, a variable frequency generation unit 408 and the bed side charging unit 550 explained with FIG. 10, in addition to the components explained with FIG. 1. In addition, the RF receiver 48 includes a frequency downconversion unit 410 and a signal processing unit 412.

As an example in the present embodiment, there are "a region where an induced magnetic field for charging is generated" and "four radio communication pathways" between the coil side radio communication device 200 and the control side radio communication device 300A. In the following, the above region and pathways will be explained in order.

As explained with FIG. 10, consider a case where "the interval between the bed side charging unit 550 and the power transferring unit 320a" and "the interval between the power transferring unit 320a and the power receiving unit 220" are both close enough to be electro-magnetically coupled. In this case, by providing an excitation current to the coil La1 of the bed side charging unit 550, an electric current flows in the coils La2 and Lb1 of the power transferring unit 320a, and thereby an induced current flows in the coil Lb2 of the power receiving unit 220. The rectifier 240 rectifies the induced current flowing in the coil Lb2 into direct-current electricity, and charges he rechargeable battery BA inside the cover member 104a with the use of the direct-current electricity.

Note that, the battery unit 304 of the power transferring unit 320a includes an rectifier (not shown), converts a part of the induced current flowing in the coil La2 into direct-current electricity, and charges the rechargeable battery (not shown) with the direct-current electricity. The control side radio communication device 300A operates by using the accumulated electric power of this rechargeable battery. This is so that any power wire is not included inside the table 34.

The remaining battery level judging unit 250 measures an index of the remaining battery level of the rechargeable battery BA. Concretely speaking, for example, the remaining battery level judging unit 250 detects the charging voltage of the rechargeable battery BA on a steady basis, and outputs a "charge completion signal" at the timing when the charging voltage of the rechargeable battery BA reaches the value at completion of charging. The system control unit 52 stops the charging by the bedside charging unit 550, when the system control unit 52 receives the "charge completion signal" (its details will be explained later with FIG. 12).

The power receiving unit 220 supplies the accumulated electric power of the rechargeable battery BA charged in the above manner to each component of the coil side radio communication device 200 via hard-wiring (not shown). In addition, the power receiving unit 220 supplies the accumulated electric power of the rechargeable battery BA to each component of the cover member 104a. The entirety of the cable 102 shown in FIG. 4 is not shown in FIG. 11 in order to avoid complication.

As to the frequency of electric currents flowing in the coils La1, La2, Lb1 and Lb2, it is preferably separated from the communication frequencies of the four radio communication pathways. This is so that the interference between "the above electric currents" and "the signals transmitted in the radio communication pathways between the antennas 206a to 206d and the antennas 306a to 306d" is avoided.

Note that, as a method of saving electric power of the RF coil device 100A, "a rechargeable battery that is embedded in the coil side radio communication device 200 and is charged during unused spans of the RF coil device 100A" and "the above power receiving unit 220" may be used in combination.

Next, the four radio communication pathways will be explained. Although the radio communication via an induced electric field is performed at least in the pathway between the antennas 206a and 306a, it may be performed in the pathway between the antennas 206b and 306, or the pathway between the antennas 206d and 306d.

Firstly, in the pathway between the antennas 206c and 306c, the identification information of the RF coil device 100A is transmitted from the coil side radio communication device 200 to the control side radio communication device 300A.

More specifically, for example, the above identification information is preliminarily stored in the ID transmitting unit 222. Note that, as to the identification information of the RF coil device 100A, the ID transmitting unit 222 may obtain it from the selection control unit 108 via the cable 102. If the antenna 306c of the ID receiving unit 322 comes close to the antenna 206c of the ID transmitting unit 222, the ID transmitting unit 222 automatically wirelessly transmits the identification information stored inside it as a digital signal from the antenna 206c to the antenna 306c. This radio communication of the identification information may be performed in the same way as RFID (Radio Frequency Identification) typified by, for example, IC (Integrated Circuit) tag.

The ID receiving unit 322 converts the identification information of the RF coil device 100A received by the antenna 306c into an optical signal, and inputs the identification information as an optical signal to the system control unit 52 via the optical communication cables 301. Thereby, the system control unit 52 recognizes the information on which of various types of RF coil devices such as the chest part RF coil device and the pelvic part RF coil device is(are) currently connected.

Secondly, in the pathway between the antennas 306d and 206d, a gate signal is continuously wirelessly transmitted from the gate signal transmitting unit 324 of the control side radio communication device 300A to the gate signal receiving unit 224 of the coil side radio communication device 200 during imaging.

More specifically, as a switch changing on/off state of each coil element 106 of the RF coil device 100A, for example, an active trap circuit including a PIN diode (p-intrinsic-n Diode) and so on are disposed to each coil element 106. The gate signal is a control signal of the above switch. Note that, as an alternative configuration, a trigger signal may be transmitted from the gate signal transmitting unit 324 to the gate signal receiving unit 224 and the gate signal is generated inside the gate signal receiving unit 224 on the basis of the trigger signal.

During a period in which RF pulses are transmitted to the object P, "the gate signal inputted to the RF coil device 100A via the gate signal transmitting unit 324, the antenna 306d, the antenna 206d and the gate signal receiving unit 224" is generally set to on-level. During the on-level span of the gate signal, the above switch becomes off state so as to disconnect the loop of each of the coil elements 106 and thereby each of the coil elements 106 cannot detect MR signals.

Except the span during which RF pulses are transmitted to the object P, the gate signal adjusted to off-level is wirelessly transmitted. While the gate signal is off-level, the above switch becomes on-state and each of the coil elements 106 can detect MR signals. The coupling effect between "the transmission RF coil 28 which transmits RF pulses to the object P" and "the coil elements 106 which respectively detect the MR signals from the object P" is prevented by the above on/off switching of the coil elements 106.

Thirdly, in the pathway between the antennas 306b and 206b, a digital reference signal is continuously wirelessly transmitted from the reference signal transmitting unit 318 of the control side radio communication device 300A to the reference signal receiving unit 218 of the coil side radio communication device 200 during imaging.

Concretely speaking, the reference signal is a signal that synchronizes "the coil side radio communication device 200 as a transmission side of the MR signals" with "a basic frequency of system based on the fixed frequency generation unit 406". The reference signal transmitting unit 318 generates the reference signal by performing processing such as modulation, frequency conversion, amplification and filtering on the criterion clock signal inputted from the fixed frequency generation unit 406.

The fixed frequency generation unit 406 generates the criterion clock signal whose frequency is constant. The fixed frequency generation unit 406 includes a crystal controlled oscillator with high degree of stability and so on, in order to generate the criterion clock signal. The fixed frequency generation unit 406 inputs the criterion clock signal to the reference signal transmitting unit 318 and the variable frequency generation unit 408.

Note that, the input of the criterion clock signal to the reference signal transmitting unit 318 is performed via the optical communication cables 301 with an optical signal. In addition, the fixed frequency generation unit 406 inputs the criterion clock signal to respective components performing clock synchronization inside the MRI apparatus 20A such as the image reconstruction unit 56 and the pulse waveform generation unit 404.

The variable frequency generation unit 408 includes PLL (Phase-Locked Loop), DDS (Direct Digital Synthesizer), a mixer and so on. The variable frequency generation unit 408 operates on the basis of the above criterion clock signal. The variable frequency generation unit 408 generates a local signal (clock signal) of variable frequency that accords with a setting value inputted from the system control unit 52 as a center frequency of RF pulses.

In order to achieve this, the system control unit 52 inputs a default value of the center frequency of the RF pulses to the variable frequency generation unit 408 before a prescan. In addition, the system control unit 52 inputs a corrected value of the center frequency of the RF pulses to the variable frequency generation unit 408 after the prescan.

The variable frequency generation unit 408 inputs the above local signal of variable frequency to the frequency downconversion unit 410 and the frequency upconversion unit 402.

In addition, "a trigger signal (A/D conversion start signal) that determines timing of sampling in the A/D converters 212 inside the cover member 104a" is inputted from the system control unit 52 to the reference signal transmitting unit 318. This trigger signal is also inputted to the reference signal transmitting unit 318 as an optical signal via the optical communication cables 301.

The above sampling means, for example, to extract intensity of an analog signal at regular time intervals so as to enable digital record. As an example here, the reference signal transmitting unit 318 wirelessly transmits both the reference signal and the trigger signal to the reference signal receiving unit 218, by superimposing the trigger signal on the reference signal.

Fourthly, in the pathway between the antennas 206a and 306a, the digitized MR signals are wirelessly transmitted from the data transmitting unit 216 of the coil side radio communication device 200 to the data receiving unit 316 of the control side radio communication device 300A via an induced electric field.

More specifically, for example, the number of the coil elements 106, the number of the preamplifiers PMP and the number of the A/D converters 212 are equal, each of the preamplifiers PMP corresponds to each of the coil elements 106, and each of the A/D converters 212 corresponds to each of the coil elements 106. Thus, MR signals detected by the coil element(s) selected for detection (at least one of the coil elements 106) are inputted to the corresponding preamplifier(s) PMP, then amplified by the preamplifier(s) PMP, and then inputted to the corresponding A/D converter(s) 212 as analog signals.

The A/D converter(s) 212 converts the inputted analog signals into digital signals. At this time, the reference signal and trigger signal are inputted to each of the A/D converters 212 from the reference signal receiving unit 218. Thus, each of the A/D converters 212 starts sampling and quantization on the basis of the reference signal (sampling clock signal) in synchronization with the timing when the trigger signal is transmitted. However, if at least one of coil elements 106 is(are) not selected for detection, the preamplifier(s) PMP and the A/D converter(s) 212 corresponding to the unselected coil element(s) do not operate as an example here.

Each of the A/D converters 212 inputs the digitized MR signals to the P/S converter 214. If a plurality of the coil elements 106 are selected for detection, "the MR signals which are detected by the plurality of the coil elements 106 and undergo A/D conversion respectively" are plural. In this case, the P/S converter 214 converts these plural MR signals from parallel signals into a serial signal for radio transmission, and inputs the serial signal to the data transmitting unit 216. This is because the number of antenna for transmitting the MR signals is only one (the antenna 206a) in the example of the present embodiment.

However, the present embodiment is not limited to the aspect of transmitting the MR signals as a serial signal. For example, the MR signals may be wirelessly transmitted as parallel signals by increasing the number of antennas for transmitting and receiving MR signals.

The data transmitting unit 216 generates MR signals for radio transmission (which are serial signals and digital signals) by performing processing such as error correction encoding, interleave, modulation, frequency conversion, amplification, and filtering on the inputted serial MR signals. The antenna 206a wirelessly transmits the MR signals for radio transmission inputted from the data transmitting unit 216 to the antenna 306a.

The data receiving unit 316 performs processing such as amplification, frequency conversion, demodulation, deinterleave and error correction decoding on the MR signals received by the antenna 306a. Thereby, the data receiving unit 316 extracts the original serial digital signal from the MR signals for radio transmission, and converts the extracted serial digital signal into an optical signal. The data receiving unit 316 inputs the serial signal as an optical signal to the signal conflating unit 36 via the optical communication cable 301 (this serial signal includes each of the MR signals detected in the RF coil device 100A).

Although the components of the RF coil device 100B are omitted in FIG. 11, a serial signal from the data receiving unit 316 of the RF coil device 100A side and a serial signal from the data receiving unit 316 of the RF coil device 100B side are respectively inputted to the signal conflating unit 36. The signal conflating unit 36 conflates the two serial signals respectively inputted from both data receiving units 316 into one serial signal. The signal conflating unit 36 converts the conflated serial signal from an electric digital signal into an optical digital signal. The signal conflating unit 36 inputs the serial signal as optical digital signal to the frequency downconversion unit 410 of the RF receiver 48 via the optical communication cable 72.

The frequency downconversion unit 410 converts the inputted serial signal into an electric signal for signal processing, as an example here. The frequency downconversion unit 410 extracts signals corresponding to the MR signals of the respective coil elements 106 from the electric serial signal.

The frequency downconversion unit 410 multiplies the extracted MR signals by the local signal inputted from the variable frequency generation unit 408, and makes an arbitrary signal band get through by filtering. Thereby, the frequency downconversion unit 410 performs frequency conversion (downconversion) on the MR signals, and inputs the MR signals whose frequency is lowered to the signal processing unit 412.

The signal processing unit 412 generates the raw data of the MR signals by performing predetermined signal processing on the above "MR signals whose frequency is lowered". The raw data of the MR signals are inputted to the image reconstruction unit 56 via the optical communication cable 74 as optical signals, and converted into k-space data and the k-space data are stored in the image reconstruction unit 56.

Note that, as to the gate signal, it may be superimposed on the reference signal in the way similar to the trigger signal. In this case, because the number of radio communication pathways can be decreased by one by omitting components such as the antennas 206d and 306d, configuration of the coil side radio communication device 200 and the control side radio communication device 300A can be streamlined.

The foregoing is an explanation of the four radio communication pathways. Note that, though the case of the RF coil devices 100A is explained in the above example, in the case of the RF coil device 100B, the power transmission and the radio communication are performed in the way similar to the case of the RF coil device 100A.

In FIG. 11, the system control unit 52 determines the imaging conditions such as a repetition time, a type of RF pulses, a center frequency of the RF pulses and a band width of the RF pulses in a pulse sequence, on the basis of the imaging conditions inputted by a user via the input device 62. The system control unit 52 inputs the imaging conditions determined in the above manner to the pulse waveform generation unit 404.

The pulse waveform generation unit 404 generates a pulse waveform signal of baseband by using the criterion clock signal inputted from the fixed frequency generation unit 406, depending on the imaging conditions inputted from the system control unit 52 in the above manner. The pulse waveform generation unit 404 inputs the pulse waveform signal of baseband to the frequency upconversion unit 402.

The frequency upconversion unit 402 multiplies the pulse waveform signal of baseband by the local signal inputted from the variable frequency generation unit 408, then makes an arbitrary signal band pass by filtering, and thereby performs frequency conversion (upconversion). The frequency upconversion unit 402 inputs the pulse waveform signal of baseband whose frequency is raised to the RF transmitter 46. The RF transmitter 46 generates the RF pulses on the basis of the inputted pulse waveform signal.

Figure 12:
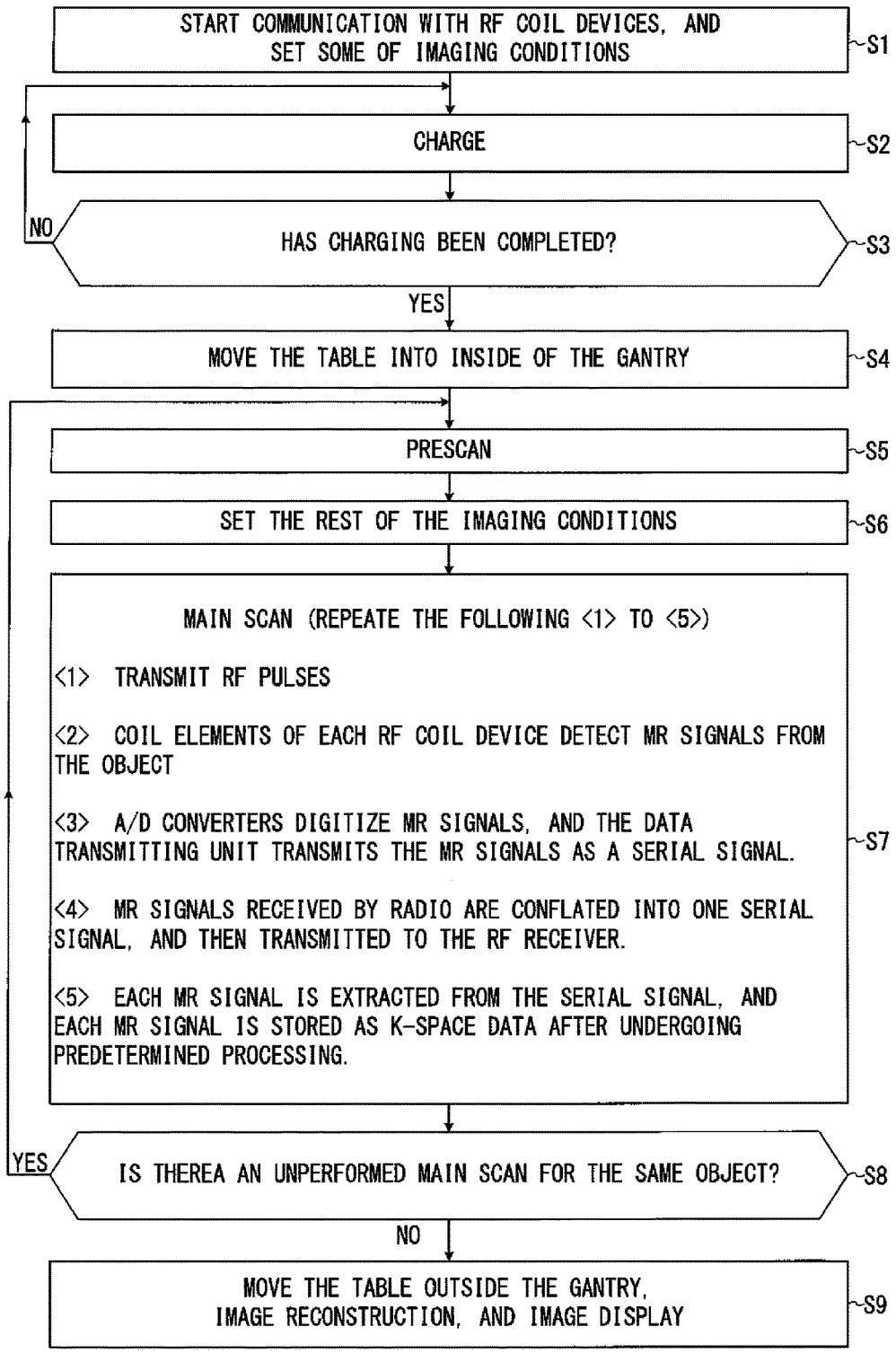
FIG. 12 is a flowchart illustrating an example of the flow of the imaging operation performed by the MRI apparatus of the first embodiment.

FIG. 12 is a flowchart illustrating an example of the flow of the imaging operation performed by the MRI apparatus 20A of the first embodiment.

Note that, though a case of respectively connecting the above RF coil devices 100A and 100B to two of the coil side radio communication devices 200 will be explained here, this is only an example. The same processing as the present embodiment will be performed in the case of using other RF coil devices such as a shoulder RF coil device and in the case of using one, three, or more than three of the coil side radio communication devices 200.

In the following, according to the step numbers in the flowchart shown in FIG. 12, an operation of the MRI apparatus 20A will be described by referring to the aforementioned FIG. 1 to FIG. 11 as required.

[Step S1] The table 34 is located at the predetermined position explained with the top part of FIG. 8. That is, the back end of the table 34 accords with the backend of the table slide unit 33*b*. For example, in this state, the object P is loaded on the table 34, and the RF coil devices 100A and 100B are set on the object P.

One coil side radio communication device 200 connected to the RF coil device 100A via the cable 102 is detachably and closely fixed to one control side radio communication device 300A (see FIG. 4 to FIG. 6). Similarly, another coil side radio communication device 200 connected to the RF coil device 100B via the cable 102 is detachably and closely fixed to another control side radio communication device 300A (see FIG. 4 to FIG. 6).

If the coil side radio communication devices 200 and the control side radio communication devices 300A fall within the range capable of mutual communication by the above short-distance fixation, the aforementioned electric power supply and communication are started between both sides.

Concretely speaking, in the connection example of FIG. 1, the ID transmitting unit 222 of one of the coil side radio communication devices 200A operates on the basis of electric power wirelessly transmitted from the ID receiving unit 322 of the control side radio communication device 300A which is the communication target, and wirelessly transmits the identification information of the RF coil device 100A to this ID receiving unit 322 (see FIG. 11). The ID transmitting unit 222 of another of the coil side radio communication devices 200 operates on the basis of electric power wirelessly transmitted from the ID receiving unit 322 of another control side radio communication device 300A which is the communication target, and wirelessly transmits the identification information of the RF coil devices 100B to this ID receiving unit 322.

The system control unit 52 respectively acquires the identification information of these RF coil devices 100A and 100B from the ID receiving units 322 of the respective control side radio communication devices 300A. Thereby, the system control unit 52 recognizes "which of the control side radio communication devices 300A are in connection with 'the coil side radio communication devices 200 respectively connected with the RF coil devices 100A and 100B'".

By acquiring the identification information, the system control unit 52 outputs a permission of further communication between the control side radio communication devices 300A and the coil side radio communication devices 200 fixed thereto. In addition, the system control unit 52 sets some of the imaging conditions of the main scan on the basis of "the imaging conditions inputted to the MRI apparatus 20A via the input device 62" and "information on the currently used RF coil devices (in this example, information indicating that the RF coil devices 100 and 100B are used)".

Note that, wireless transmission of the identification information of the RF coil devices 100A and 100B from each of the ID receiving units 322 is continuously performed at constant time interval until the communication between each of the coil side radio communication devices 200 and each of the control side radio communication devices 300A stops. Thereby, the system control unit 52 judges that the communication status between each of the coil side radio communication devices 200 and each of the control side radio communication devices 300A is normal. After this, the process proceeds to Step S2.

[Step S2] Because the table 34 is located at the aforementioned predetermined position in Step S1, the coils La1 of the bed side charging units 550 and the coils La2 of the power transferring units 320*a* are in such positions that they are electro-magnetically coupled. Thus, after outputting the above permission of communication, the system control unit 52 makes each component start power supply from the bed side charging units 550 to the power receiving units 220 via the power transferring units 320*a*.

Thereby, as explained with FIG. 10 and FIG. 11, the rechargeable batteries BA in the RF coil devices 100A and 100B are charged. The respective power receiving units 220 start electric power supply to each component of the coil side radio communication devices 200 and each component of the RF coil devices 100A and 100B by using the accumulated electric power of the rechargeable batteries BA.

In addition, the reference signal transmitting unit 318 of each of the control side radio communication devices 300A starts inputting the digital reference signal to the reference signal receiving unit 218 of each of the coil side radio communication devices 200 through the radio communication pathway between the antennas 306*b* and 206*b*, in accordance with the communication permission outputted by the system control unit 52 (the reference signal is continuously wirelessly transmitted). Note that, the trigger signal for determining sampling timing is superimposed on the transmitted reference signal.

Incidentally, setting of some of the imaging conditions of the main scan may be performed during the charging period in this Step S2. In this case, the system control unit 52 sets some of the undetermined imaging conditions of the main scan on the basis of information inputted via the input device 62. After this, the process proceeds to Step S3.

[Step S3] Each of the remaining battery level judging units 250 of the RF coil devices 100A and 100B detects the charging voltage of the rechargeable battery BA on a steady basis, and outputs the charge completion signal at the timing when the charging voltage of the rechargeable battery BA reaches the voltage at completion of charging. The charge completion signal is, for example, inputted to the ID transmitting unit 222. In this case, the ID transmitting unit 222 wirelessly transmits the charge completion signal to the ID receiving unit 322. The charge completion signal transmitted by the ID transmitting unit 222 may be, for example, another signal which is obtained by substitution such as shortening the time interval of transmission of the identification information of the RF coil device 100A.

When the input of the charge completion signals from both remaining battery level judging units 250 of the RF coil devices 100A and 100B to the system control unit 52 completes, the system control unit 52 stops the charging operation by the bed side charging units 550 and proceeds with the process to Step S4. Until the above charging completes, the system control unit 52 makes each component continue charging.

Note that, as to the input of the charge completion signal to the system control unit 52, it may be performed by another method. For example, a sound sensor may be disposed inside the table 34 and the remaining battery level judging unit 250 may output a predetermined sound when the charging completes. In this case, at the timing when the sound sensor received the trunk tone, the sound sensor may input the charge completion signal to the system control unit 52 via internal hard-wiring.

In addition, the charging may finish before the charging voltage of the rechargeable battery BA reaches the voltage at completion of charging. For example, the system control unit 52 calculates the electric power consumed by the RF coil device 100A and the coil side radio communication device 200 in the case of performing the pulse sequence on the same object P on the basis of the some of the imaging conditions selected up to Step S2, and adds a predetermined margin to this calculation result so as to obtain an estimated consumed power. The system control unit 52 calculates the charging voltage that is enough to output the estimated consumed power as a "charge finish voltage".

The system control unit 52 inputs "the charge finish voltage" to the remaining battery level judging unit 250 through any of the radio communication pathways. For example, "the charge finish voltage" may be inputted to the remaining battery level judging unit 250 from the gate signal transmitting unit 324 via the gate signal receiving unit 324. In this case, the remaining battery level judging unit 250 outputs the above charge completion signal at the timing when the charging voltage of the rechargeable battery BA reaches "the charge finish voltage", and then similarly operates as described above. After finishing the charging operation in the above manner, the process proceeds to Step S4.

[Step S4] The table driving device 35 moves the table 34 into inside of the gantry 21, in accordance with the control of the system control unit 52 (see FIG. 8). After this, the process proceeds to Step S5.

[Step S5] The system control unit 52 makes the MRI apparatus 20A perform prescans by controlling each component of the MRI apparatus 20A. In the prescans, for example, a corrected value of the center frequency of the RF pulses is calculated, and a sensitivity distribution map of each of the coil elements 106 of the RF coil devices 100A and 100B is generated. After this, the process proceeds to Step S6.

[Step S6] The system control unit 52 sets the rest of the imaging conditions on the basis of the execution results of the prescans. The imaging conditions include information on which of the coil elements 106 are used for detection in the main scan.

Thus, the system control unit 52 inputs the information on the coil elements 106 used for the main scan into the selection control unit 108 of the RF coil device 100A via any one of the radio communication pathways. The information on the coil elements 106 used for detection in the main scan is, for example, wirelessly transmitted from the gate signal transmitting unit 324 to the gate signal receiving unit 224, and then inputted into the selection control unit 108 from the gate signal receiving unit 224. The same applies to the RF coil device 100B. After this, the process proceeds to Step S7.

[Step S7] The system control unit 52 makes the MRI apparatus 20A perform the main scan by controlling each component thereof.

More specifically, a static magnetic field is formed in the imaging space by the static magnetic field magnet 22 excited by the static magnetic field power supply 40. In addition, an electric current is supplied from the shim coil power supply 42 to the shim coil 24, and thereby the static magnetic field formed in the imaging space is uniformed. Note that, during the implementation term of the main scan, the aforementioned gate signal is continuously transmitted between the antennas 306d and 206d from the gate signal transmitting unit 324 to the gate signal receiving unit 224.

After this, when the system control unit 52 receives a command of start of imaging from the input device 62, the MR signals from the object P are acquired (collected) by repeating the following processes of <1> to <5> in series. In order to simplify the explanation here, it is assumed that two of the coil elements 106 are selected for detecting MR signals for each of the RF coil devices 100A and 100B (note that, in the case where one or more than two coil elements 106 are selected for each of the RF coil devices 100A and 100B, the operation is the same as the following explanation).

<1> The system control unit 52 drives the gradient magnetic field power supply 44, the RF transmitter 46 and the RF receiver 48 in accordance with the pulse sequence, thereby the gradient magnetic fields are formed in the imaging region including the imaging part of the object P, and the RF pulses are transmitted from the transmission RF coil 28 to the object P. Only during the transmission period of the RF pulses, the gate signal is set to, for example, on-level.

That is, the on-level gate signal is inputted from the gate signal receiving unit 224 of one of the coil side radio communication devices 200 to the selection control unit 108 of the RF coil device 100A. In addition, the on-level gate signal is inputted from the gate signal receiving unit 224 of the other one of the coil side radio communication devices 200A to the selection control unit 108 of the RF coil device 100B. Thereby, the coil elements 106 of the RF coil devices 100A and 100B are set to off-state so as to prevent the aforementioned coupling effect.

<2> Each of the gate signals is switched over to, for example, off-level after the transmission of the RF pulses, and each of the coil elements 106 of the RF coil devices 100A and 100B selected for detection in Step S6 detects the MR signals caused by the nuclear magnetic resonance inside the object P. Each of the detected analog MR signals is inputted from each of the coil elements 106 to the corresponding the preamplifier PMP, amplified by the corresponding preamplifier PMP, and then inputted to the corresponding A/D converter 212, respectively (see FIG. 11).

<3> Each of the A/D converters 212 corresponding to the coil elements 106 selected for detection starts sampling and quantization of the MR signals on the basis of the reference signal, in synchronization with the timing when the trigger signal is wirelessly transmitted. Each of the A/D converters 212 inputs the digitized MR signals to the P/S converter 214, respectively.

The P/S converter 214 of one side of the coil side radio communication devices 200 converts the plurality of the MR signals respectively inputted from the plurality of the A/D converters 212 of the RF coil device 100A into a serial signal, and inputs this serial signal to the data transmitting unit 216. The P/S converter 214 of the other side of the coil side radio communication devices 200 converts the plurality of the MR signals respectively inputted from the plurality of the A/D converters 212 of the RF coil device 100B into a serial signal, and inputs this serial signal to the data transmitting unit 216.

Each of the data transmitting units 216 of the RF coil device 100A side and the RF coil device 100B side generates the MR signals for wireless transmission by performing predetermined processing on the serial MR signal, and wirelessly transmits the generated MR signals from the antenna 206a to antenna 306a via an induced electric field, respectively.

<4> The data receiving unit 316 of one side of the control side radio communication devices 300A extracts the original digital serial signal from the received MR signals for wireless transmission, and converts the extracted MR signals into an optical signal, and inputs the optical signal to the signal conflating unit 36 (each of the original digital serial and the optical signal includes the respective MR signals detected by the RF coil device 100A). The data receiving unit 316 of the other side of the control side radio communication devices 300A extracts the original digital serial signal from the received MR signals for wireless transmission, converts the extracted MR signals into an optical signal, and inputs the optical signal to the signal conflating unit 36 (each of the original digital serial and the optical signal includes the respective MR signals detected by the RF coil device 100B).

The signal conflating unit 36 conflates (synthesizes) two serial signals as two optical signals inputted from both of the data receiving units 316 into one serial signal as one optical signal. As to conflation, it may be performed after converting the signal into an electric signal. In this manner, two serial signals respectively received by the two radio communication pathway of the RF coil device 100A side and the RF coil device 100B side are conflated into one serial signal. By the conflation, the signal length becomes twice as long as the original signals, for example.

The conflated serial signal includes the MR signals detected by the two coil elements 106 of the RF coil device 100A and the MR signals detected by the two coil elements 106 of the RF coil device 100B. The signal conflating unit 36 inputs the serial signal as the conflated optical signal to the frequency downconversion unit 410 of the RF receiver 48 via the optical communication cable 72.

<5> As an example here, the frequency downconversion unit 410 converts the inputted serial signal into an electrical signal for performing signal processing. The frequency downconversion unit 410 extracts signals respectively corresponding to the MR signals of the four coil elements 106 from the electrical serial signal. The frequency downconversion unit 410 performs frequency downconversion on the MR signals detected by the four coil elements 106, and inputs "the MR signals whose frequency is lowered" to the signal processing unit 412.

The signal processing unit 412 generates the raw data of the MR signals by performing predetermined processing on the inputted MR signals. The signal processing unit 412 converts the raw data of the MR signals from electrical digital signals into optical digital signals. The signal processing unit 412 inputs the raw data of the MR signals as optical digital signals into the image reconstruction unit 56 (which is disposed in the control room, for example) via the optical communication cable 74. The image reconstruction unit 56 converts the raw data of the MR signals from optical digital signals into electrical digital signals, further converts the electrical digital signals into k-space data, and stores the k-space data.

After completion of acquisition of the MR signals detected by the selected coil elements 106 of the RF coil devices 100A and 100B by repeating the above <1> to <5> processes, the process proceeds to Step S8.

[Step S8] The system control unit 52 judges as to whether there is an unperformed main scan for the same the object P as "the imaging target right before this Step S8 (i.e. Step S7)". If there is an unperformed main scan for the same the object P, the system control unit 52 makes the MRI apparatus 20A return to Step S15. If this is not the case, the system control unit 52 makes the MRI apparatus 20A proceed to Step S19.

[Step S9] The table driving device 35 moves the table 34 out of the gantry 21, and returns the table 34 to the predetermined position on the supporting platform 33 (see the bottom part of FIG. 8), in accordance with the control of the system control unit 52.

In addition, the image reconstruction unit 56 reconstructs image data by performing image reconstruction processing including Fourier transformation on the k-space data. The image reconstruction unit 56 performs the luminance correction processing on the reconstructed image data with the use of the sensitivity distribution maps generated in the prescan. The image reconstruction unit 56 stores "the image data subjected to the luminance correction processing" in the image database 58 (see FIG. 1).

The image processing unit 60 obtains the image data from the image database 58 and generates display image data by performing predetermined image processing on the obtained image data. The image processing unit 60 stores the display image data in the storage device 66. Then, the system control unit 52 transmits the display image data to the display device 64, and makes the display device 64 display images indicated by the display image data.

After completion of imaging, the coil side radio communication devices 200 are detached from the control side radio communication devices 300A, respectively. When both sides are moved beyond the range capable of radio communication, the radio communication and the electric power supply between both sides are concluded.

Note that, as an example in FIG. 12, the input of the reference signal starts in Step S1. However, this is only an example. For example, the input of the reference signal may start just before the prescans in Step S5.

The foregoing is a description of the operation of the MRI apparatus 20A according to the first embodiment.

As just described, charging of the rechargeable batteries BA inside the RF coil devices 100A and 100B is automatically started via an induced magnetic field in the first embodiment, when the table 34 is located at the predetermined position which is the most distant from the gantry 21, i.e. at the position capable of moving up and down of the supporting platform 33 (see Step S2, FIG. 10 and FIG. 11). Thus, in a structure of wirelessly transmitting the digitized MR signals from the RF coil devices 100A and 100B side to the control side (the RF receiver 48 side) of the MRI apparatus 20A, electric power of the RF coil devices 100A and 100B can be unfailingly saved without imposing a manipulation burden on a user.

In addition, electric power is wirelessly transferred from the bed side charging unit 550 to the power transferring unit 320a via an induced magnetic field, then electric power is wirelessly transferred from the power transferring unit 320a to the power receiving unit 220 via an induced magnetic field, and the rechargeable battery BA is charged inside the power receiving unit 220. In the above charging structure, any power wire is not disposed inside the table 34.

That is, in a structure of wirelessly transmitting the digitized MR signals, electric power of the RF coil devices 100A and 100B can be unfailingly saved without including a power wire inside the table 34.

Moreover, the power wires 560 are fixedly disposed inside the table slide unit 33b of the supporting platform 33 so that the power wires 560 never move in association with the horizontal motion of the table 34. Furthermore, "the bed side charging units 550 and the power transferring unit 320a of the control side radio communication device 300A both of which function as the power supply units" are fixedly disposed inside the table slide unit 33b and the table 34 respectively so as not to move when the table 34 moves, and these bed side charging units 550 and the power transferring unit 320a wirelessly transmit (transfer) electric power received from the power wire 560. Thus, because "the stretching state of the power wire connecting the supporting platform 33 to the table 34 of the bed device 32" does not change regardless of the position of the table 34, variation of power of the excitation RF pulses due to difference of the table position becomes extremely small.

In addition, variation of "the high-frequency coupling effect between (the whole body coil of) the transmission RF coil 28 inside the gantry 21 and the power wire" is considerably reduced than conventional technology and becomes extremely small. Similarly, variation of "the coupling effect between the power wire and the coil elements 106 for detection" becomes extremely small. Moreover, because the input of the gate signal to each of the control side radio communication devices 300A inside the table 34, the transmission of MR signals from each of the control side radio communication devices 300A and so on are performed via the optical communication cables 301, electrical signal line is not included inside the table 34. As a result of the above structure, SAR can be accurately calculated.

In addition, because a power wire is not included in the table 34 in the above charging structure, signal lines of MR signals are separated from the power wires. Therefore, digitized MR signals wirelessly received from the side of the RF coil devices 100A and 100B can be transmitted as optical signals from "the signal conflating unit 36 and the RF receiver 48 inside the imaging room" to "the image reconstruction unit 56 outside the gantry 21". Thus, influence of external noise in time of transmission can be reduced.

In addition, the coil side radio communication device 200 as the side of transmitting the MR signals and the control side radio communication device 300A as the side of receiving the MR signals are closely fixed to each other in time of radio communication, and the short-distance radio communication via an induced electric field is performed. Therefore, because output power of the radio communication can be more lowered than the digital radio communication of conventional technology, the MRI apparatus 20A of the present embodiment easily accommodates to legal regulations in various countries.

In addition to the mutually closely-situated transmission side and receiving side, output power of the radio communication can be lowered. Therefore, "the problem that the transmitted radio waves are reflected off surrounding areas and this degrades own data of radio communication" does not occur. Thus, digitized MR signals can be wirelessly transmitted satisfactorily from the RF coil devices (100A and 100B) side to the control side (the RF receiver 48 side) of the MRI apparatus 20A.

In addition, a plurality of the MR signals respectively detected by the plurality of the coil elements 106 are converted into a serial signal and then wirelessly transmitted. Thus, the necessary number of an antenna for transmitting the MR signals (radio communication pathway) is only one pair in each pair of the coil side radio communication device 200A and the control side radio communication device 300A, and frequency separation for preventing interference is not necessary between each of the MR signals.

On the other hand, in the remote radio communication of digital MR signals in conventional technology, the receiving side is located far away from the transmission side. Thus, in the remote radio communication of digital MR signals in conventional technology, frequency separation and time-multiplexed communication are performed, because interference such as cross talk occurs if a plurality of coil elements for receiving MR signals are simultaneously connected. In a short-distance radio communication like the first embodiment, it is not necessary to perform time-multiplexed communication.

In addition, the control side radio communication devices 300A are respectively disposed to mutually separated positions, and it is enough to fix the coil side radio communication device 200 to any one of the control side radio communication devices 300A. Thus, no matter which part of the object P an RF coil device is set on (i.e. no matter where the RF coil devices 100A and 100B are located on the table 34), the coil side radio communication device 200 and the control side radio communication device 300A can be closely fixed to each other, and accordingly MR signals can be wirelessly transmitted satisfactorily.

In addition, because (A) the electric power supply to the RF coil devices 100A and 100B, (B) the transmission of the gate signal and (C) the transmission of the trigger signal are wirelessly performed, configuration of the MRI apparatus 20A can be simplified. As a result, cost of manufacturing the MRI apparatus 20A can be reduced.

In addition, the plurality of the MR signals detected by each of the coil elements 106 of the RF coil devices 100A and 100B are conflated into one serial signal by the signal conflating unit 36, and then inputted to the RF receiver 48 outside the bed device 32. Therefore, the number of cables for the RF receiver 48 is lessened, and accordingly, checkup, maintenance and repair (component replacement) become easier. The reason is as follows.

In general, the MRI apparatus is shipped in the state resolved into each component, and operation of assembling, installment adjustment and so on are performed at the place where it is installed. In many cases, the supporting platform 33 and the table 34 are shipped in the combined state as the bed device 32 (bed unit). The number of connection cables between the RF coil devices set on the object P and the control side (the RF receiver 48 side) of the MRI apparatus has been increasing due to the prevailing multichannel structure.

For example, in the conventional MRI apparatus which cannot perform wireless transmission of MR signals via an induced electric field, it is assumed that eight connection ports for connecting RF coil devices are disposed on a table and signal wires of sixteen channels can be connected to the respective connection ports. In this case, for example, 128 signal wires (obtained by 16 times 8) are linked by cable connection between the bed device side and the RF receiver side in the assembling operation.

However, in the structure of the present embodiment, the number of signal wires on the supporting platform 33 side is reduced to one by the signal conflating unit 36 in the minimum case. Therefore, operation of linking the signal wires between the supporting platform 33 side and the RF receiver 48 inside the gantry 21 becomes easy. Thus, checkup, maintenance and repair (component replacement) become easier.

Moreover, recently, there are many bed devices which have casters and are able to dock with the gantry 21 in an imaging room. This type is used for the purpose of carrying a patient to the imaging room after loading the patient onto the table in another room. By applying the present embodiment to such a dockable type of bed devices, the docking operation just before imaging becomes easier and its labor time is shortened, because the number of signal wires coming out of a bed device side is small. As a result, working time immediately before an MRI examination can be shortened, and accordingly a prompt examination is enabled.

According to the aforementioned embodiment, electric power of an RF coil device can be saved in a structure of transmitting MR signals from the RF coil device side to a control side of an MRI apparatus without imposing a manipulation burden on a user.

As to the first embodiment, the following six points are supplemented.

Firstly, in the first embodiment, an example in which digitized MR signals detected by totally four of the coil elements 106 are conflated into one serial signal has been explained. However, embodiments of the present invention are not limited to such an aspect. If the number of the signal wires is drastically lessened, the effects similar to the present embodiment are obtained. For example, consider a case where not less than three RF coil devices are set on the object P and there are many MR signals respectively detected by many of the coil elements 106. In this case, if all of these MR signals are conflated into one serial signal by the signal conflating unit 36 so as to input it into the RF receiver 48 as one serial signal, longer time corresponding to the length of the serial signal is needed for communication.

Thus, it is preferable to lessen the number of the signal wires in such a manner that the transmission of the MR signals to the RF receiver 48 is completed within a permissible time. For example, "the signal conflating units 36 each of which conflates a plurality of digitized MR signals into one serial signal" may be disposed as many as the number of signal wires connected to the RF receiver 48. Then, the respective signal wires from the signal conflating units 36 may be connected to the RF receiver 48. This point applies to the second embodiment and the third embodiment.

Secondly, "an example in which information on the coil elements 106 used for detection of MR signals is wirelessly transmitted from the gate signal transmitting unit 324 to the side of the RF coil devices 100A and 100B before the main scan and only the MR signals detected by the selected the coil elements 106 are wirelessly transmitted" has been explained. However, embodiments of the present invention are not limited to such an aspect.

For example, each component of the MRI apparatus may be configured so that information on the coil elements 106 used for reception may not be inputted to the RF coil devices 100A and 100B. In this case, the MR signals respectively detected by all the coil elements 106 are converted into a digital serial signal, and then wirelessly transmitted in the aforementioned manner. Then, only the MR signals detected by the coil elements 106 selected for detection are extracted from the MR signals received by the antennas 206a and 306a, and the extracted MR signals are used for image reconstruction. This point holds true for the second embodiment and the third embodiment.

Thirdly, an example in which electric power is wirelessly transmitted from the bed side charging units 550 to the control side radio communication devices 300A via the lateral face of the table 34 (see FIG. 4) has been explained. However, embodiments of the present invention are not limited to such an aspect. For example, the bed side charging units 550 and the control side radio communication devices 300A may be disposed in such a manner that electric power is wirelessly transmitted via another surface of the table 34 such as the bottom face. This point holds true for the second embodiment and the third embodiment.

Fourthly, an example in which the power transferring unit 320a is disposed inside the control side radio communication device 300A has been explained. However, embodiments of the present invention are not limited to such an aspect. For example, inside the table 34, the power transferring unit 320a may be disposed as a component independent from the control side radio communication device 300A. This point holds true for the second embodiment.

Fifthly, an example in which the rechargeable battery BA and the remaining battery level judging unit 250 are disposed inside each of the RF coil devices 100A and 100B has been explained. However, embodiments of the present invention are not limited to such an aspect. The rechargeable battery BA and the remaining battery level judging unit 250 may be disposed inside the coil side radio communication device 200. Similarly, the A/D converters 212 and the P/S converter 214 may be disposed not inside the RF coil devices (100A and 100B) but inside each of the coil side radio communication devices 200. This point holds true for the second embodiment and the third embodiment.

Sixthly, though the rechargeable battery BA is, for example, a secondary battery such as a lithium-ion rechargeable battery or a nickel hydride rechargeable battery, other charge/discharge elements such as an electric double layer capacitor may be alternatively used. The "charge/discharge element" herein refers to a circuit element that can be repeatedly charged and discharged, such as a capacitor, a secondary battery and so on. This point holds true for the second embodiment and the third embodiment.

The Second Embodiment

The MRI apparatus 20B of the second embodiment can wirelessly transmit electric power to the RF coil devices 100A and 100B, even if the table 34 is located inside the gantry 21. Because the other functions are approximately the same as the first embodiment, it will be explained by focusing on the difference between the second embodiment and the first embodiment.

Because the block diagram of the entirety of the MRI apparatus 20B is approximately the same as the structure explained with FIG. 1 in the first embodiment, overlapping explanation is omitted. In addition, the panoramic structures of the gantry 21 and the bed device 32, configuration of the RF coil devices 100A and 100B, and arrangement and configuration of the fixing structures 500 are the same as what is explained with FIG. 2 to FIG. 6.

Figure 13:
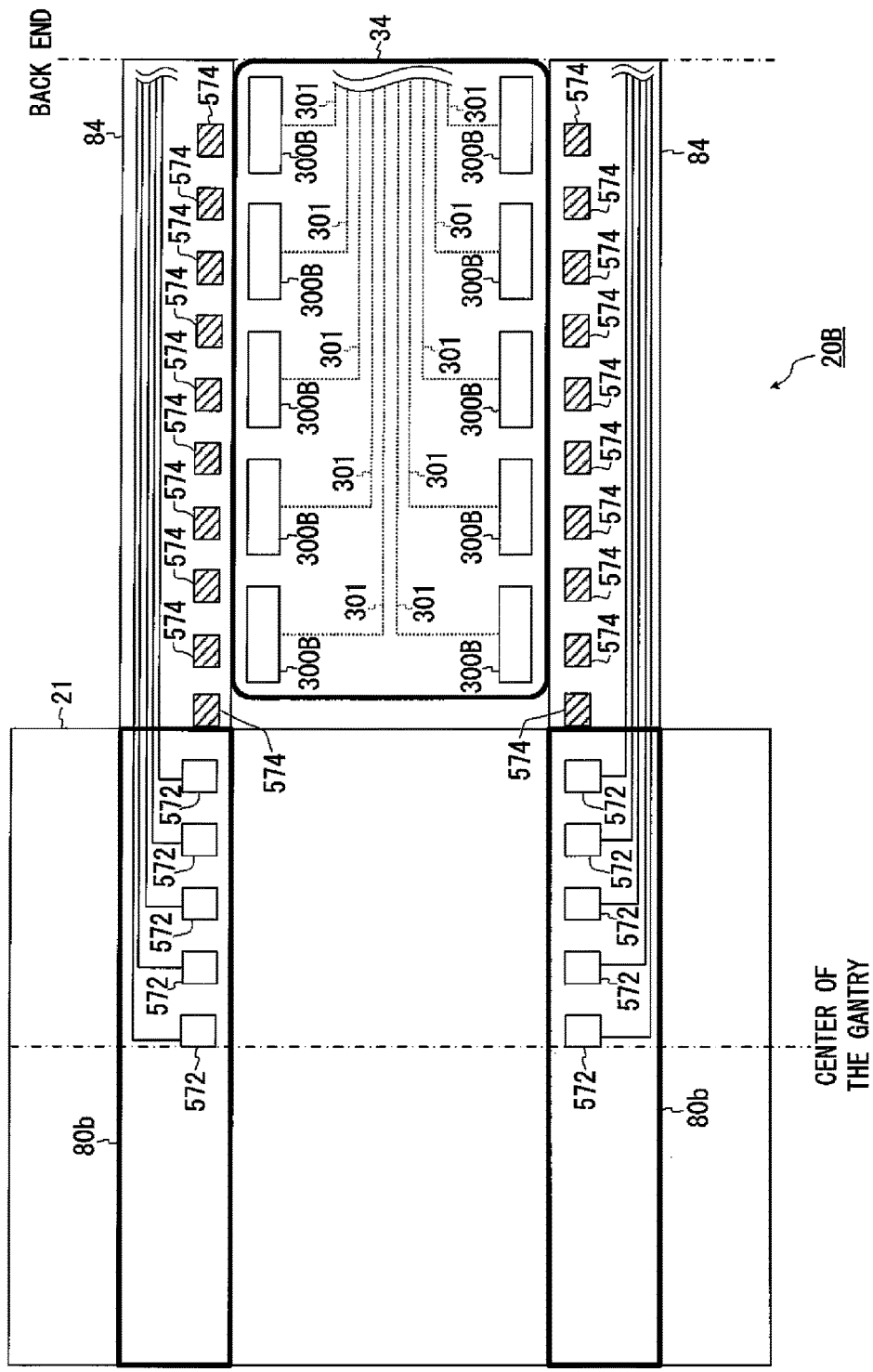
FIG. 13 is a schematic planimetric diagram in an X-Z plane of the apparatus coordinate system, showing an example of arrangement of the gantry side charging units and the bed side charging units of the MRI apparatus of the second embodiment.

FIG. 13 is a schematic planimetric diagram in an X-Z plane of the apparatus coordinate system, showing an example of the arrangement of gantry side charging units 572 and bed side charging units 574 of the MRI apparatus 20B of the second embodiment.

Figure 14:
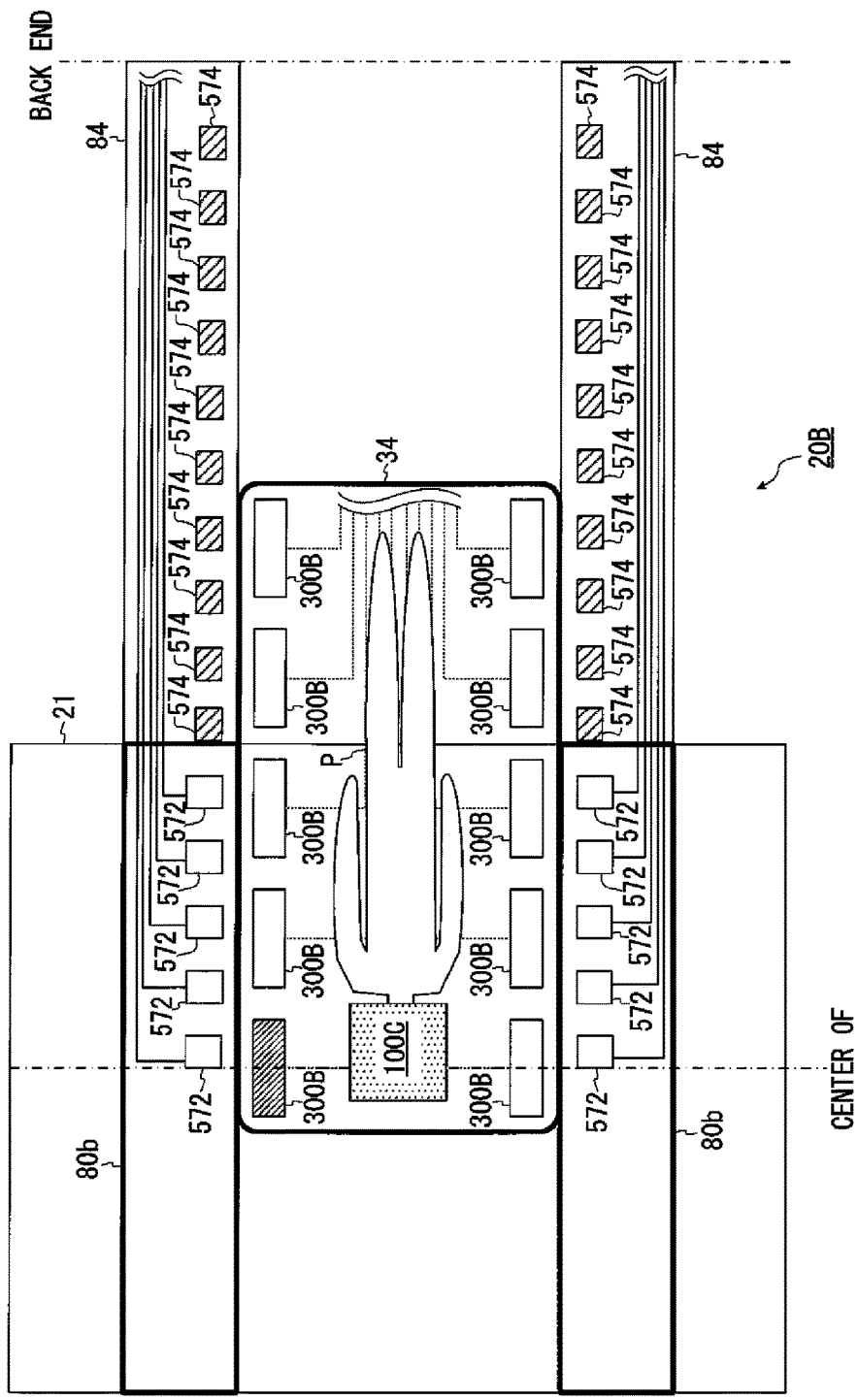
FIG. 14 is a schematic planimetric diagram showing a state obtained by moving the table in the Z axis direction of the apparatus coordinate system from the state of FIG. 13.

FIG. 14 is a schematic planimetric diagram showing a state obtained by moving the table 34 in the Z axis direction of the apparatus coordinate system from the state of FIG. 13.9

Figure 15:
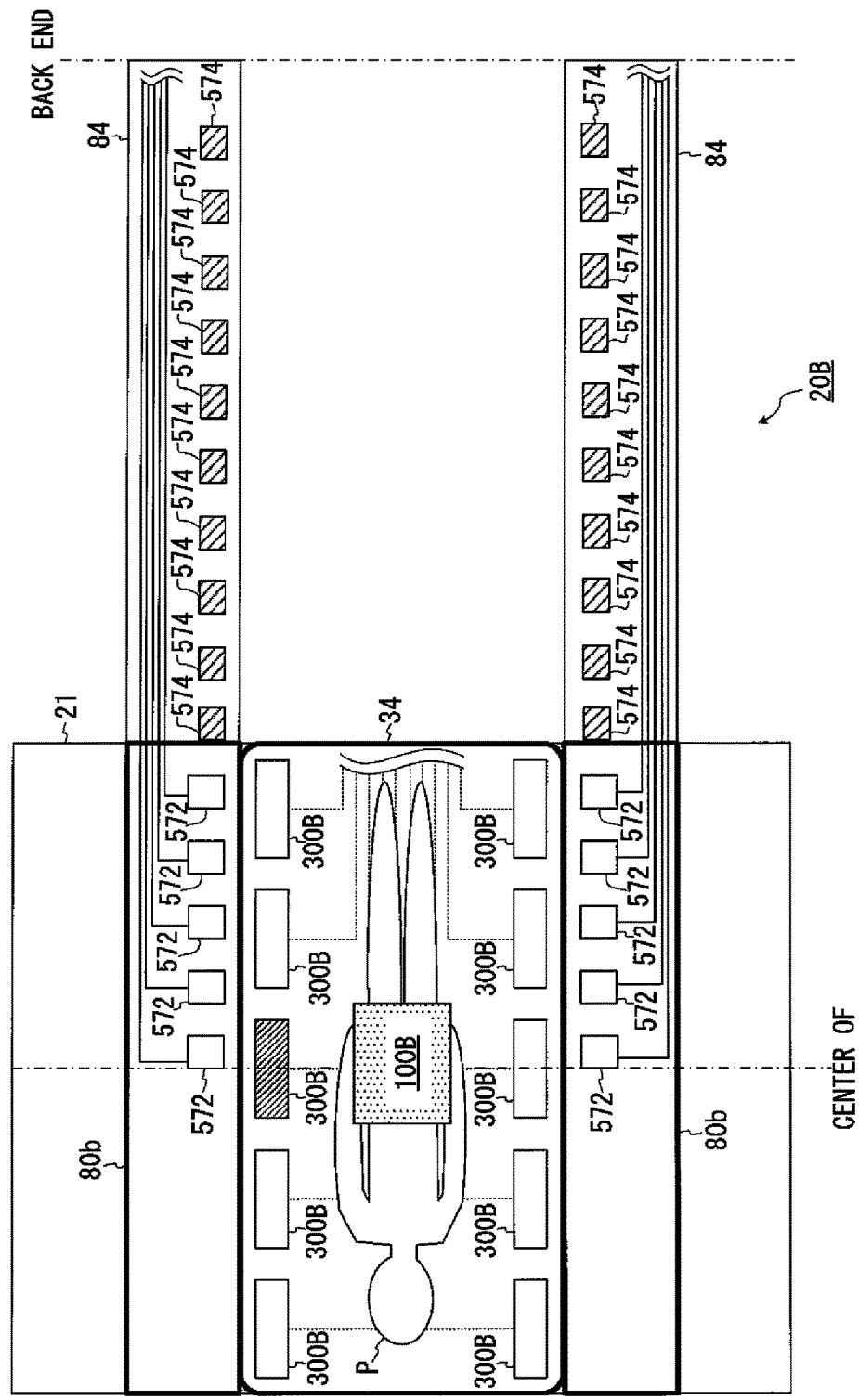
FIG. 15 is a schematic planimetric diagram showing a state obtained by moving the table further inward from the state of FIG. 14 so that the entire table is included in the gantry.

FIG. 15 is a schematic planimetric diagram showing a state obtained by moving the table 34 further inward from the state of FIG. 14 so that the entire table 34 is included in the gantry 21.

As shown in FIG. 13, the arrangement of the ten control side radio communication devices 300B inside the table 34 is approximately the same as the arrangement of the control side radio communication devices 300A in the first embodiment (see FIG. 7). Each of the control side radio communication devices 300B is separately connected to one of the optical communication cables 301, in the way similar to the first embodiment.

Here, the table 34 moves from the top of the table slide unit 33b into inside of the gantry 21 along the projecting portions 84 of the table slide unit 33b of the supporting platform 33 and along the rails 80b of the gantry 21 (see FIG. 3 and FIG. 9). In the second embodiment, the rechargeable battery BA of each of the RF coil devices 100A and 100B can be charged by the charging structure inside the gantry 21 or the charging structure inside the supporting platform 33, regardless of the (horizontal) position of the table 34.

More specifically, as shown in FIG. 13, ten bed side charging units 574 are respectively disposed inside of each of the ambilateral projecting portions 84 of the table slide unit 33b of the supporting platform 33. As an example here, the bed side charging units 574 are disposed at regular intervals on the side of the lateral face of the projecting portions 84 (the surface facing the lateral face of the table 34), along the lateral face (along the Z axis of the apparatus coordinate system). The bed side charging units 574 are twenty diagonal rectangle regions in FIG. 13. That is, the bed side charging units 574 are disposed at regular intervals from one end to the other end of each of the projecting portions 84. A charging current is supplied to each of the bed side charging units 574 via individual fixed hard-wiring (not shown) inside the projecting portions 84.

In addition, as shown in FIG. 13, inside each of the ambilateral rails 80b of the gantry 21, five of the gantry side charging units 572 are disposed. Note that, the stereoscopic shape of the rails 80b is the same as the rails 80a in the first embodiment (see FIG. 2). As an example here, the gantry side charging units 572 are disposed at regular intervals on the side of the lateral face of the rail 80b (the surface facing the lateral face of the table 34 when the table is moved inside the gantry), along the lateral face (along the Z axis direction). Power wires are individually wired to the gantry side charging units 572 from the projecting portions 84 of the supporting platform 33 via the later-described connectors 580 and 582 (see FIG. 18).

Here, it is preferable to decrease the number of the power wires inside the gantry 21 and the length of each power wire, in order to weaken the degree of coupling effect with reception coils. As an example in the second embodiment, in order to keep a sufficient charging function and avoid the above coupling effect as far as possible, the gantry side charging units 572 are disposed to a half region of the entire rails 80b. Concretely speaking, the gantry side charging units 572 are disposed from the entrance side of the gantry 21 (the supporting platform 33 side) to the center of the gantry 21, at regular intervals. The reason why such a partial arrangement can provide a sufficient charging function will be explained as follows.

Firstly, in the following explanation, a "width" and an "interval" are respectively assumed to be a width and an interval in the moving direction of the table 34 (in the Z axis direction). In the second embodiment, the width of the control side radio communication device 300B is larger than the sum of "the width of the gantry side charging unit 572" and "the interval between the two adjacent gantry side charging units 572".

In addition, the width of the bed side charging unit 574 is equal to the width of the gantry side charging unit 572, and the interval between the two adjacent bed side charging units 574 is equal to the interval between the two adjacent gantry side charging units 572.

Thus, the width of the control side radio communication device 300B is larger than the sum of "the width of the bed side charging units 574" and "the interval between the two adjacent bed side charging units 574".

Assume a case where the gantry side charging units 572 are disposed at regular intervals in not a half region of the rails 80b but in the entire region of the rails 80b. In this case, because "the control side radio communication device 300B which is the communication target of the RF coil device (100A or 100B)" faces "at least one of the gantry side charging units 572 and the bed side charging units 574" regardless of the position of the table 34 in Z axis direction, it is located to an electrifiable position.

This is because the width of the gantry side charging unit 572, the width of the bedside charging unit 574, the interval between the two adjacent gantry side charging units 572 and the interval between the two adjacent bed side charging units 574 are selected as described above compared with the width of the control side radio communication device 300B. Note that, the above "face" as a verb means "a coil inside the gantry side charging units 572 or the bed side charging units 574" and "a coil inside the control side radio communication device 300B" get close enough to be mutually electro-magnetically coupled. In the following explanation, "face" as a verb is used for meaning that "both sides get close enough to be mutually electro-magnetically coupled".

However, in the second embodiment, the gantry side charging units 572 are disposed to the half region of the rails 80b. Thus, if "the entire table 34 is located inside the gantry 21 (see FIG. 15)" and "the control side radio communication device 300B located at the innermost of the gantry 21 is the communication target for the RF coil device (100A or 100B)", this control side radio communication device 300B cannot be charged. However, the reason why such a situation is unlikely to happen in actual imaging will be explained as follows.

Firstly, the closer the imaging region is to the center of the magnetic field, the more ideal and linear magnetic field is formed around the imaging region, and MR signals are acquired under such an ideal and linear magnetic field. This is preferable in terms of image quality. Therefore, in actual imaging, the system control unit 52 and the table driving device 35 appropriately move the table 34 in such a manner that the imaging region approximately accords with the center of the magnetic field which is approximately the center of the inside of gantry 21.

Secondly, it is considered to be the most convenient and general that the coil side radio communication device 200 connected to the RF coil device 100A or 100B is closely fixed to the nearest control side radio communication device 300B on the table 34.

Considering the above two points, if the gantry side charging units 572 are disposed up to the center of the gantry 21, the control side radio communication device 300B of the communication target faces "at least one of the plurality of the gantry side charging units 572 and the bed side charging units 574" regardless of the position of the table 34 in the Z axis direction. That is, if the gantry side charging units 572 are disposed up to the center of the gantry 21, the control side radio communication device 300B can be charged. In the following, this logic will be explained with the two examples of FIG. 14 and FIG. 15.

For example, consider a case of imaging the head part. In this case, as shown in FIG. 14, the object P is loaded in such a manner that the head part is directed toward the innermost of the gantry 21 and the body axis direction accords with the sliding direction of the table 34, for example. Then, the RF coil device 100C exclusively for the head part is loaded on the object P, and the position of the table 34 is controlled in such a manner that the head part is located at the center of the magnetic field. In this case, "the coil side radio communication device 200 (not shown) connected to the RF coil device 100C" is connected to, for example, the nearest control side radio communication device 300B to the loading position of the RF coil device 100C, i.e. the control side radio communication device 300B shown as a diagonal region in FIG. 14.

In the arrangement case of FIG. 14, the control side radio communication device 300B shown as the diagonal region faces the gantry side charging unit 572 that is located at the nearest position to the center of the gantry 21, and is electro-magnetically coupled to this gantry side charging units 572 in terms of position. Thus, in the arrangement case of FIG. 14, the control side radio communication device 300B shown as the diagonal region can receive electric power from this gantry side charging units 572 during imaging.

Consider a case of imaging the pelvic part as another example. In this case, as shown in FIG. 15, the object P is loaded in such a manner that the head part is directed toward the innermost of the gantry 21 and the body axis direction accords with the sliding direction of the table 34, for example. Then, the RF coil device 100B exclusively for the pelvic part is loaded on the object P, and the position of the table 34 is controlled in such a manner that the pelvic part is located at the center of the magnetic field. In this case, "the coil side radio communication device 200 connected to the RF coil device 100B" is connected to, for example, the nearest control side radio communication device 300B to the loading position of the RF coil device 100B, i.e. the control side radio communication device 300B shown as a diagonal region in FIG. 15.

In the arrangement case of FIG. 15, "the control side radio communication device 300B shown as the diagonal region" is at the position to be electro-magnetically coupled with "the gantry side charging unit 572 that is located at the nearest position to the center of the gantry 21", and can receive electric power during imaging.

As can be seen from the above explanation, it is not necessary to arrange the gantry side charging units 572 over the entire rails 80b to make the control side radio communication device 300B of the communication target face at least one of the plurality of the bed side charging units 574 and the gantry side charging units 572. It is considered that a practically sufficient charging function can be obtained by arranging the gantry side charging units 572 up to the center of the gantry 21 inside the rails 80b like the second embodiment.

Note that, though five of the gantry side charging units 572 are arranged inside each of the ambilateral rails 80b in the examples of FIG. 13 to FIG. 15, these are only examples. The arrangement number may be, for example, six, two, three or four.

Figure 16:
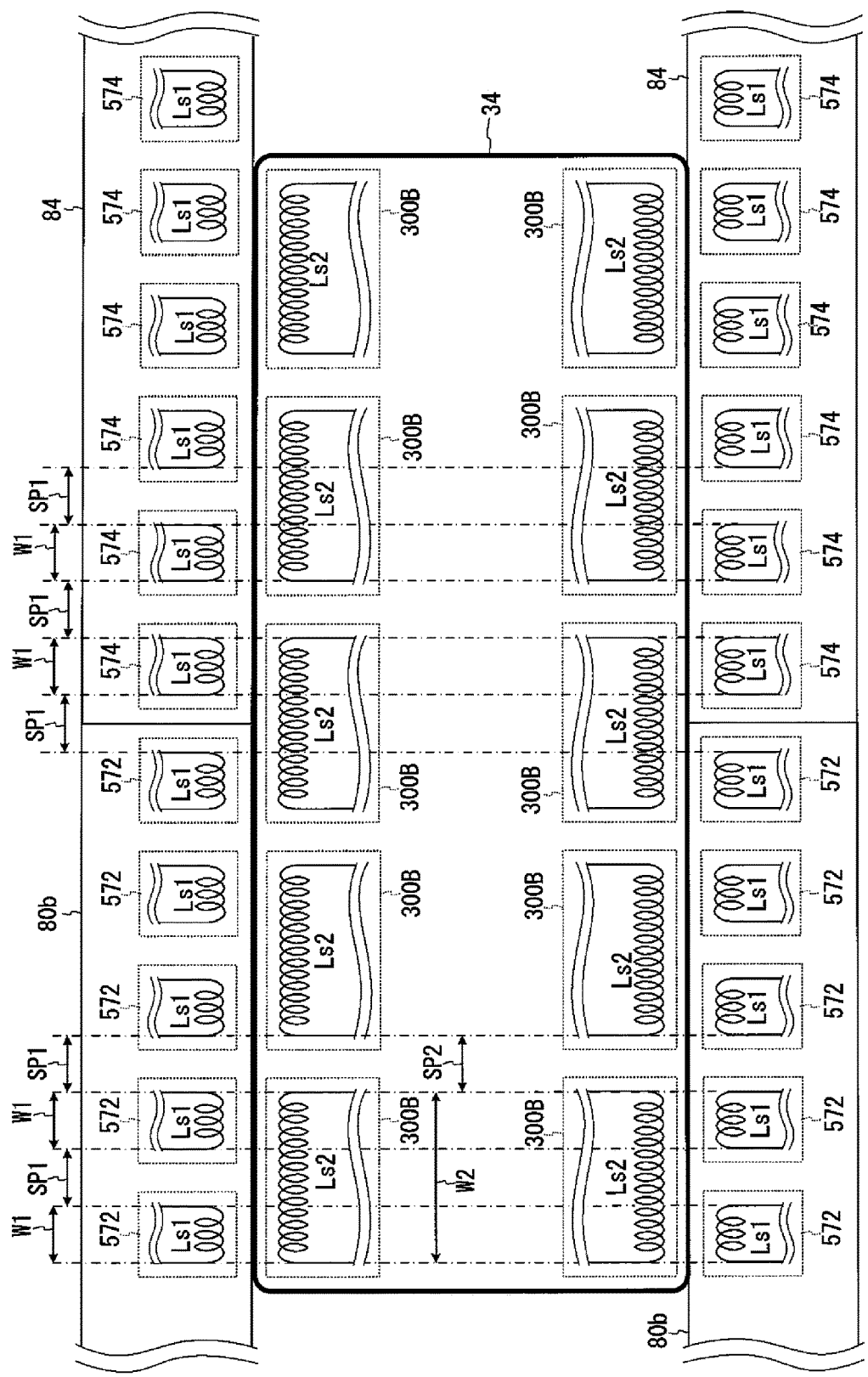
FIG. 16 is a schematic planimetric diagram in an X-Z plane of the apparatus coordinate system, showing each coil length of the power transmission coils of the respective gantry side charging units, the power transmission coils of the respective bed side charging units and the power reception coils of the respective control side radio communication devices and their arrangement interval.

FIG. 16 is a schematic planimetric diagram in an X-Z plane of the apparatus coordinate system, showing each coil length of the coils Ls1 for power transmission inside the respective gantry side charging units 572, the coils Ls1 for power transmission inside the respective bed side charging units 574 and the coils Ls2 for power reception inside the respective control side radio communication devices 300B and their arrangement intervals. Note that, the optical communication cables 301 for the control side radio communication devices 300B, the individual power wires for the gantry side charging units 572 and the bed side charging units 574 are omitted in FIG. 16 in order to avoid complication.

As shown in FIG. 16, each of the gantry side charging units 572 includes the coil Ls1, each of the control side radio communication devices 300B includes the coil Ls2, and each of the bed side charging units 574 includes the coil Ls1. Here, it is assumed that the length direction of coils is the normal direction of the cross-section that is in parallel with an external diameter and an internal diameter of coils. In addition, it is assumed that "the direction of each interval between the adjacent two coils Ls1" and "the direction of each interval between the adjacent two coils Ls2" are the same as the length direction of coils. The coils Ls1 and Ls2 are disposed in such a manner that their length directions accord with the Z axis direction of the apparatus coordinate system (the extending direction of the rails 80b, i.e. the slide movement direction of the table 34).

The length of each coil Ls1 is defined as W1, and the length of each coil Ls2 is defined as W2. In addition, because the interval between two adjacent gantry side charging units 572 is equal to the interval between two adjacent bedside charging units 574 and both are arranged at regular intervals, every interval between two adjacent coils Ls1 becomes SP1.

In addition, each of control side radio communication devices 300B embedded inside the table 34 are disposed at regular intervals on the side of the lateral face of the table 34 along the lateral face, in the way similar to the first embodiment (see FIG. 4). That is, inside the control side radio communication device 300B, the power transferring unit 320b (see later-described FIG. 21) including the coil Ls2, Lb1 and the battery unit 304 and the coil Ls2 itself are also disposed at regular intervals on the side of the lateral face of the table 34 along the lateral face. Therefore, every interval between two adjacent coils Ls2 becomes SP2.

As an example here, the interval SP1, the interval SP2 and the coil length W1 are equal to each other, and the coil length W2 is three times as long as the coil length W1. By setting the intervals SP1, SP2 and the coil lengths W1, W2 in this manner, the coil Ls2 in each of the control side radio communication devices 300B faces the entirety of at least one coil Ls1 of the gantry side charging units 572 and the bed side charging units 574, up to the center of inside of the gantry 21.

In the above arrangement, one coil Ls2 faces the entirety of two coils Ls1 as shown in FIG. 16, depending on the position of the table 34. As an example in the second embodiment, when the coil Ls2 of the control side radio communication device 300B of the communication target faces the entirety of two coils Ls1, an excitation current is supplied to only one of the coils Ls1 each of which wholly faces this coil Ls2. The reason is as follows. If excitation currents are supplied to both coils Ls1, their effects are reversed with each other depending on a phase and a frequency of the excitation currents flowing in both coils Ls1 and this result in causing an insufficient induced current in the coil Ls2.

However, "the control of supplying an excitation current only to one coil Ls1 that wholly faces the coil Ls2 as electric power transmission to this coil Ls2" is merely an example of simplifying the control. The excitation current may be supplied to two coils Ls1 by setting phases and frequencies of the excitation currents so as to cause a sufficient induced current in one coil Ls2.

Figure 17:
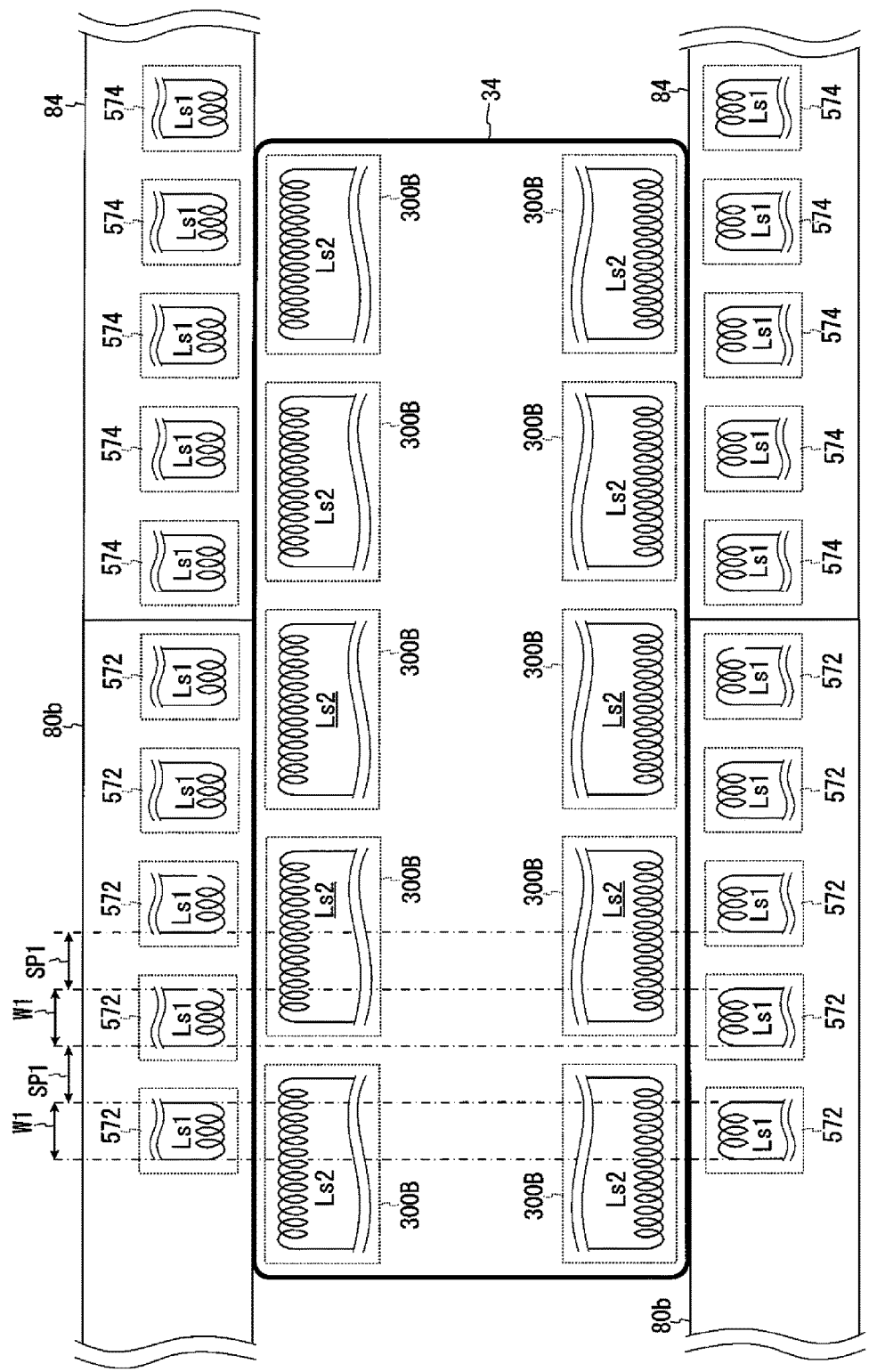
FIG. 17 is a schematic planimetric diagram showing a state obtained by moving the table slightly inward from the state of FIG. 16.

FIG. 17 is a schematic planimetric diagram showing a state obtained by moving the table 34 slightly inward from the state of FIG. 16. In the state of FIG. 17, each of the two coils Ls2 on the left side of FIG. 17 faces the entirety of one coil Ls1 of the gantry side charging unit 572.

In addition, in the state of FIG. 17, each of the four coils Ls2 whose symbols are underlined in FIG. 17 faces "the entirety of the coil Ls1 of one gantry side charging unit 572" and "a part of the coil Ls1 of another gantry side charging unit 572".

In addition, in the state of FIG. 17, each of the four coils Ls2 on the right side of FIG. 17 faces "the entirety of the coil Ls1 of one bedside charging unit 574" and "a part of the coil Ls1 of another bed side charging unit 574".

As an example in the second embodiment, "the coils Ls1 each of which partially faces the coil Ls2 of the control side radio communication device 300B of the communication target" are not used for transmission of electric power. An excitation current is supplied to the coil Ls1 that wholly faces the coil Ls2 of the control side radio communication device 300B of the communication target. This is because a larger induced magnetic field is caused and a larger induced current is generated by supplying an excitation current to the coil Ls1 facing the entirety of the coil Ls2 than supplying an excitation current to the coil Ls1 partially facing the coil Ls2.

Here, the coil length W2 is preferably selected so that the coil Ls2 faces at least one coil Ls1 partially or wholly even if the position of the table 34 in the Z axis direction of the apparatus coordinate system moves little by little. As "the condition A" for achieving this, the coil length W2 of the coil Ls2 as the power receiving side is desirably equal to or larger than the sum of "the coil length W1 of the coil Ls1 as the power transmitting side" and "the interval SP1 between two adjacent coils Ls1".

More preferably, the coil length W2 is selected so that the coil Ls2 always faces the entirety of at least one coil Ls1 even if the position of the table 34 in the Z axis direction of the apparatus coordinate system moves little by little. This is because an induced current can be efficiently generated in the coil Ls2 by supplying an excitation current to "one coil Ls1 that wholly faces the coil Ls2" in this case. That is, electric power can be wirelessly transmitted efficiently. As "the condition B" for achieving this, the coil length W2 of the coil Ls2 is desirably equal to or larger than the sum of "the double of the coil length W1 of the coil Ls1 as the power transmitting side" and "the interval SP1 between two adjacent coils Ls1". However, as to the coil lengths W1, W2, and the intervals SP1, SP2, they are not limited to the aspect of FIG. 16 but may be arbitrarily changed within the range of satisfying the above "condition A", for example.

Figure 18:
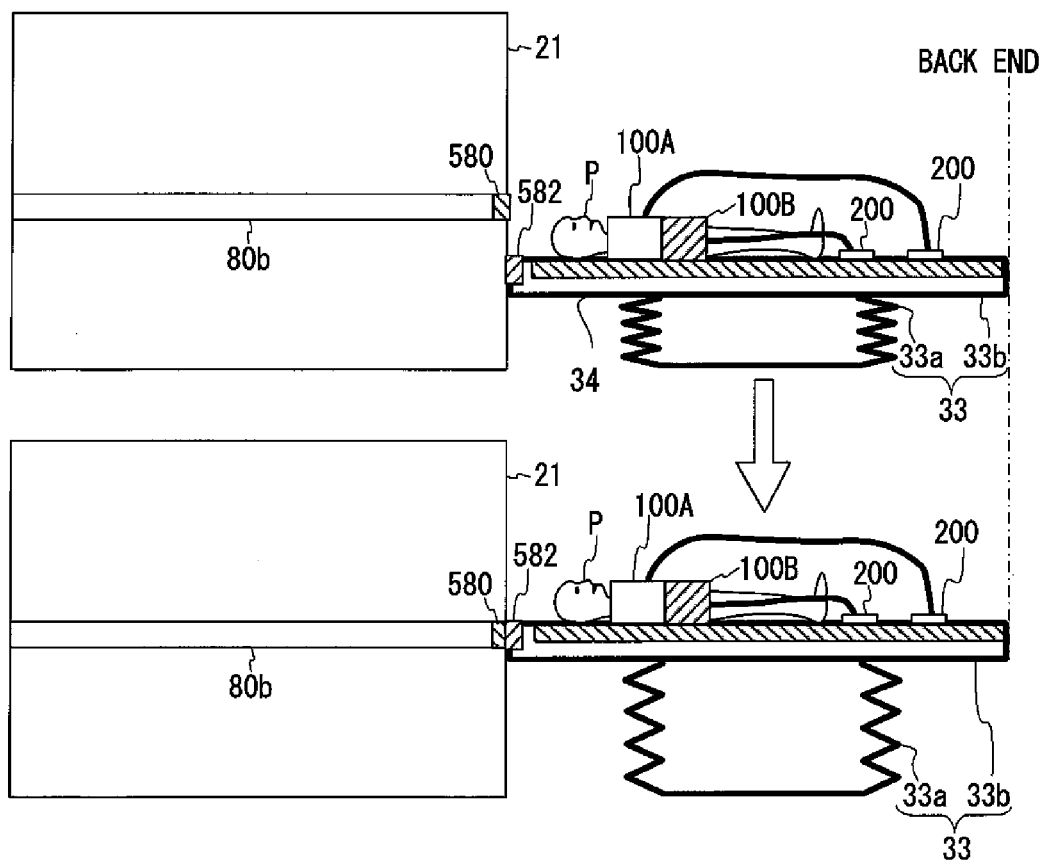
FIG. 18 is a schematic cross-sectional diagram of the gantry and the bed device of the MRI apparatus of the second embodiment in a Y-Z plane of the apparatus coordinate system.

FIG. 18 is a schematic cross-sectional diagram of the gantry 21 and the bed device 32 of the MRI apparatus 20B of the second embodiment in a Y-Z plane of the apparatus coordinate system. The top part of FIG. 18 shows a state in which the height of the supporting platform 33 is lowered by the hoisting unit 33a. The bottom part of FIG. 18 shows a state in which the height of the supporting platform 33 is raised by the hoisting unit 33a in such a manner that the height of the projecting portions 84 (see FIG. 3) of the table slide unit 33b accords with the height of the rails 80b. That is, the bottom part of FIG. 18 shows a state in which the table 34 can slide from the table slide unit 33b side into inside of the gantry 21.

In the second embodiment, a connector 580 is disposed to one end of the rails 80b on the side of the table slide unit 33b, and a connector 582 is disposed to one end of the projecting portions 84 of the table slide unit 33b on the side of the rails 80b.

As shown in the bottom part of FIG. 18, under the state in which the height of the supporting platform 33 is raised so as to slidably move the table 34 into inside of the gantry 21, the connector 580 of on the side of the rails 80b and the connector 582 on the side of the projecting portions 84 of the table slide unit 33b are connected with each other. Each of the gantry side charging units 572 is individually connected to the power wire via "hard-wiring (not shown) inside the hoisting unit 33a and the projecting portions 84 of the table slide unit 33b" by the connection of the connectors 580 and 582 (see FIG. 13).

Figure 19:
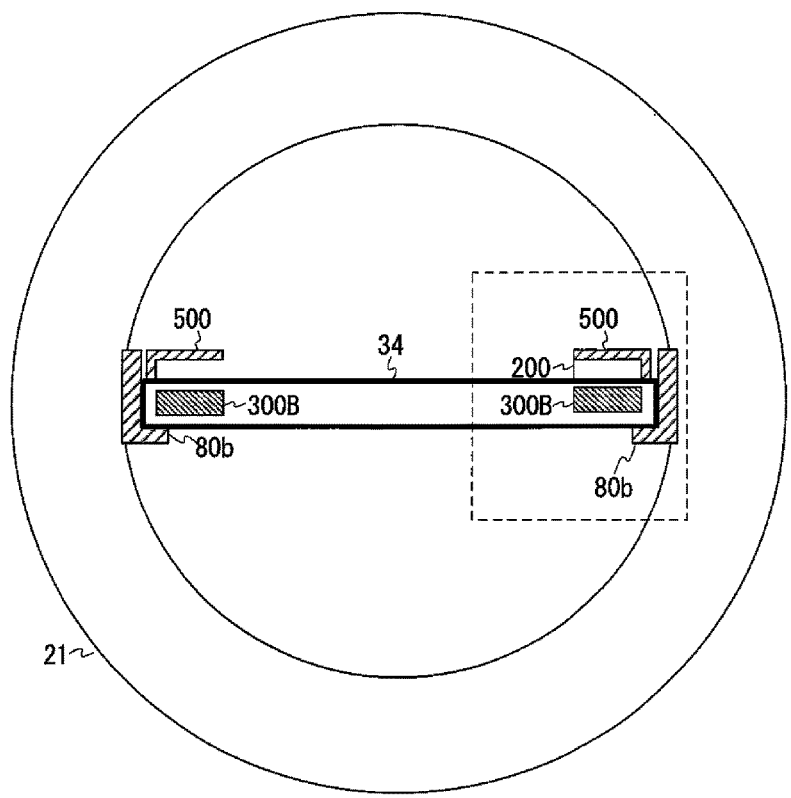
FIG. 19 is a schematic cross-sectional diagram of the gantry of the MRI apparatus of the second embodiment in an X-Y plane of the apparatus coordinate system.

FIG. 19 is a schematic cross-sectional diagram of the gantry 21 of the MRI apparatus 20B of the second embodiment in an X-Y plane of the apparatus coordinate system.

FIG. 19 shows a cross-section of a state in which the table 34 is inserted into the gantry 21.

Figure 20:
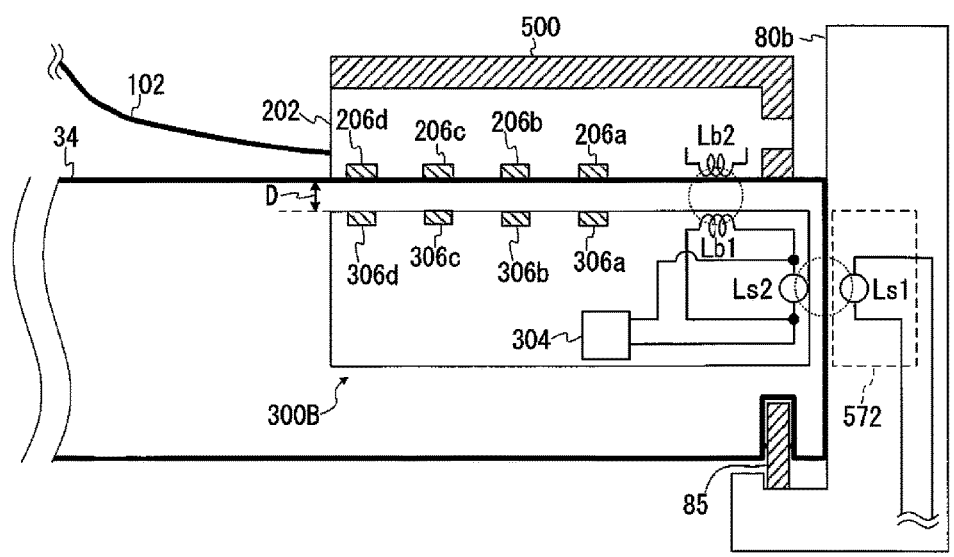
FIG. 20 is a schematic cross-sectional diagram showing an example of the structure of the coil side radio communication device, the control side radio communication device and the gantry side charging unit by magnifying the frame part of a dashed line in FIG. 19.

FIG. 20 is a schematic cross-sectional diagram showing an example of the structures of the coil side radio communication device 200, the control side radio communication device 300B and the gantry side charging unit 572 by magnifying the frame part of a dashed line in FIG. 19.

FIG. 19 and FIG. 20 show a state in which one the coil side radio communication device 200 connected to the RF coil device 100A or 100B is closely fixed to one control side radio communication device 300B by the fixing structure 500.

In the following, "wireless transmission of electric power when the table 34 is inside the gantry 21" will be explained by reference to FIG. 19 and FIG. 20. The structure of the control side radio communication device 300B is the same as the control side radio communication device 300A of the first embodiment, except that the coil Ls2 is disposed so as to satisfy the above conditions A and B instead of the coil La2 of the first embodiment.

Consider a case where the coil Ls2 faces the entirety of the coil Ls1 of any one of the gantry side charging units 572 inside the rails 80b. That is, as shown in FIG. 20, consider a case where the coils Ls1 and Ls2 are elector-magnetically coupled to each other.

In this case, the system control unit 52 controls each component of the MRI apparatus 20B in such a manner that an excitation current is supplied to the coil Ls1 facing the coil Ls2 via "the power wire inside the rail 80b" and "the power wire (not shown) inside the hoisting unit 33a, the projecting portion 84 and the connectors 580 and 582". Thereby, "an induced magnetic field penetrating the lateral face of the table 34 and the lateral face of the rail 80" is generated, and an induced current flows in the coil Ls2.

As an example here, "a part of the induced current flowing in the coil Ls2" is converted into direct-current electricity inside the battery unit 304 and charges the rechargeable battery (not shown) in the battery unit 304. The control side radio communication device 300B operates by using the accumulated electric power of this rechargeable battery.

On the other hand, the rest of the induced current generated in the coil Ls2 flows into the coil Lb1 as an excitation current for the coil Lb2 of the coil side radio communication device 200.

An induced magnetic field penetrating the top face of the table 34 is generated by the electric current flowing in the coil Lb1. Accordingly, an induced current flows in the coil Lb2 of the coil side radio communication device 200. The coil side radio communication device 200 charges the rechargeable battery BA inside the RF coil device (100A or 100B) by using the induced current flowing in the coil Lb2.

Note that, if the table 34 is located on the table slide unit 33b, the transmission operation of electric power from the coil Ls1 of the bedside charging units 574 to the rechargeable battery BA of each of the RF coil devices 100A and 100B is the same as above. That is, electric power is wirelessly transmitted via an induced magnetic field by way of the coils Ls2 and Lb1 of the control side radio communication device 300B and the coil Lb2 of the coil side radio communication device 200. The cross-section in this case is equivalent to the modified FIG. 10 of the first embodiment obtained by substituting the coil Ls1 for the coil La1 in FIG. 10 and substituting the coil Ls2 for the coil La2 in FIG. 10, and thus its diagramatic representation is omitted.

Figure 21:
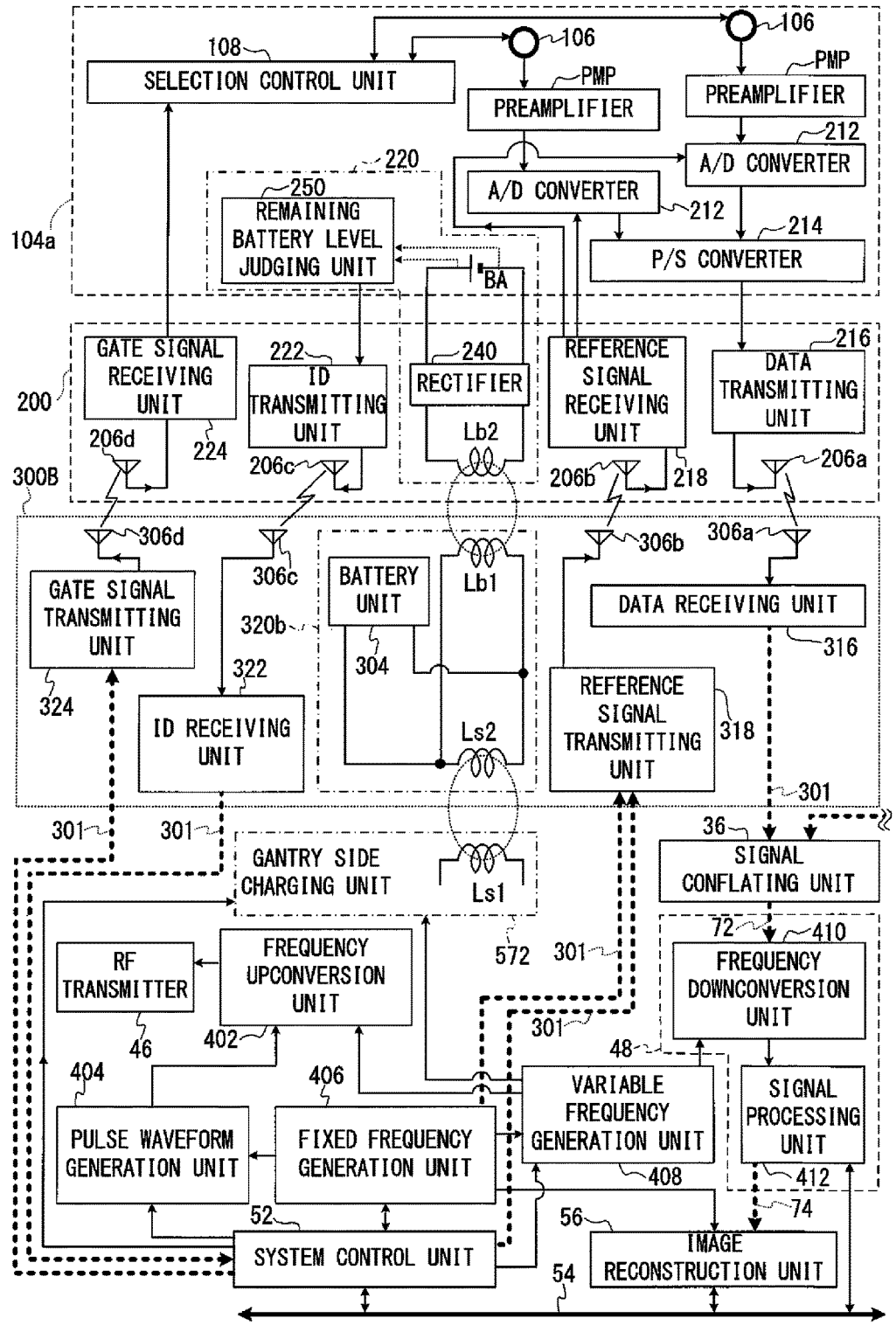
FIG. 21 is a schematic block diagram showing the power supply system to the RF coil device and the transmission system of MR signals detected by the RF coil device in the way similar to FIG. 11, when the table is located inside the gantry.

FIG. 21 is a schematic block diagram showing the power supply system to the RF coil device 100A and the transmission system of the MR signals detected by the RF coil device 100A in the way similar to FIG. 11, when the table 34 is located inside the gantry 21. In FIG. 21, the power transferring unit 320b of the control side radio communication device 300B is the same as the power transferring unit 320a in the first embodiment, except that the coil Ls2 is disposed instead of the coil La2 as described above.

In addition, in order to show transmission of electric power from the rails 80b when the table 34 is located inside the gantry 21, the gantry side charging units 572 is shown in FIG. 21 instead of the bed side charging unit 550 in FIG. 11. As explained with FIG. 20, electric power for charging is wirelessly transmitted to the rechargeable battery BA of the RF coil device 100A from the gantry side charging units 572 via the power transferring unit 320b.

In addition, because the transmission operations of the gate signal, the identification information of the RF coil device 100A, the reference signal and MR signals are the same as the first embodiment, overlapping explanation is omitted. Although communication with the cover member 104a of the RF coil device 100A and the electric power transmission for the RF coil device 100A are shown in FIG. 21, the same applies to the RF coil device 100B side.

In addition, "the power supply system to the rechargeable battery BA when the table 34 is located on the table slide unit 33b of the supporting platform 33" is equivalent to the modified FIG. 11 of the first embodiment obtained by substituting the coil Ls1 for the coil La1 and substituting the coil Ls2 for the coil La2, and thus its diagramatic representation is omitted.

Figure 22:
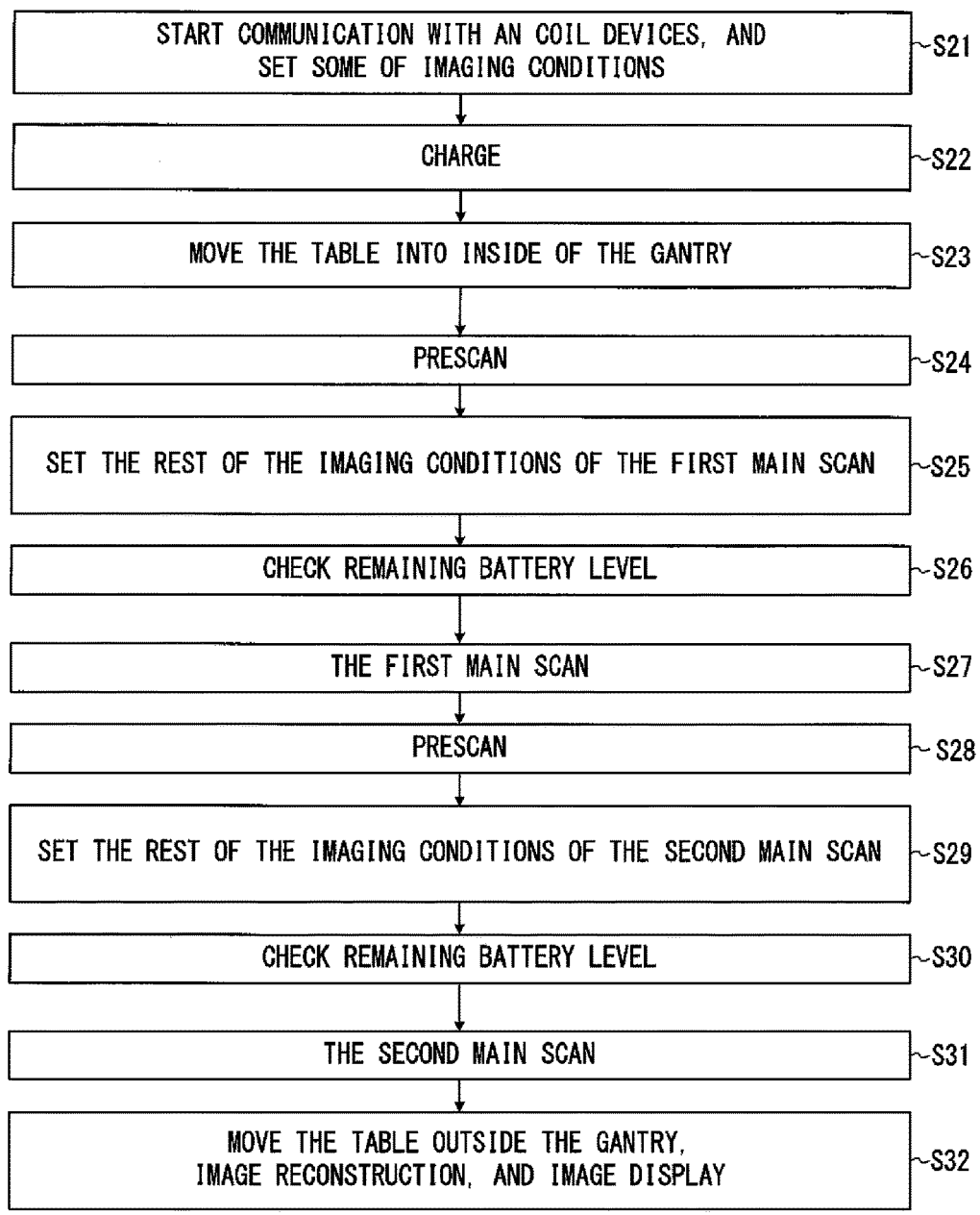
FIG. 22 is a flowchart illustrating an example of the flow of the imaging operation performed by the MRI apparatus of the second embodiment.

FIG. 22 is a flowchart illustrating an example of the flow of the imaging operation performed by the MRI apparatus 20B of the second embodiment. Although a case of respectively connecting the above RF coil devices 100A and 100B to two coil side radio communication devices 200 will be explained here, this is only an example. The same processing as the present embodiment will be performed in the case of using other RF coil devices and in the case of using one, three, or more than three of the coil side radio communication devices 200. In the following, according to the step numbers in the flowchart shown in FIG. 22, an operation of the MRI apparatus 20B will be described by referring to the aforementioned FIG. 13 to FIG. 21 as required.

[Step S21] The processing of Step S21 is the same as Step S1 in FIG. 12 of the first embodiment. The gist is as follows. Each of the two coil side radio communication devices 200 connected to the RF coil device 100A or 100B and the control side radio communication device 300B fall within a range capable of communication, and the identification information of the RF coil devices 100A and 100B is inputted into the system control unit 52.

The system control unit 52 identifies "the control side radio communication devices 300B respectively in communication with the RF coil devices 100A and 100B" by judging which control side radio communication device 300B transfers the identification information to the system control unit 52, and outputs per a permission of further communication. Wireless transmission of the identification information is continued at constant time interval. The system control unit 52 sets some of the imaging conditions of the main scan. After this, the process proceeds to Step S22.

[Step S22] In Step S21, the table 34 is located at the position most distant from the gantry 21. The system control unit 52 calculates "the coordinate position of the coil Ls2 in each of the control side radio communication devices 300B respectively in communication with the RF coil devices 100A and 100B" in apparatus coordinate system on the basis of the current position of the table 34. The system control unit 52 calculates (determines) which coils Ls1 of the bed side charging units 574 wholly face these coils Ls2, on the basis of the coordinate position of each of the coils Ls2

When two coils Ls1 wholly faces one coil Ls2, the system control unit 52 selects one of these two coils Ls1 for supplying an excitation current. Then, the excitation current is supplied to "one coil Ls1 facing 'the coil Ls2 of the control side radio communication device 300B that is the communication target of the RF coil device 100A'", under the control of the system control unit 52. Similarly, the excitation current is supplied to "one coil Ls1 facing 'the coil Ls2 of the control side radio communication device 300B that is the communication target of the RF coil device 100B'".

Therefore, the rechargeable battery BA of each of the RF coil devices 100A and 100B is charged by the operation explained with FIG. 20. The power receiving unit 220 on the RF coil device 100A side supplies electric power to each component of the coil side radio communication device 200 and each component of the RF coil devices 100A. The same applies to and the power receiving unit 220 on the RF coil device 100B side.

In addition, the hoisting unit 33a raises the height of the supporting platform 33 in such a manner that the height of the rails 80b accords with the height of the projecting portions 84. Thereby, the connector 580 on the rails 80b side and the connector 582 on the projecting portions 84 side are connected with each other (see FIG. 18), and the charging currents can be supplied to the gantry side charging units 572. Note that, the above adjustment of the height of the supporting platform 33 may be performed in Step S21 or in the beginning of the next Step S23.

In addition, the reference signal transmitting unit 318 of each of the control side radio communication device 300B starts input of the reference signal in accordance with the above permission of communication in the way similar to Step S2 of the first embodiment (the reference signal is wirelessly transmitted consecutively). The trigger signal is superimposed on the transmitted reference signal.

Note that, setting of some of the imaging conditions of the main scan may be continuously performed during the charging period in this Step S22. In this case, the system control unit 52 sets "some of the imaging conditions of the main scan which have not been set yet", on the basis of conditions inputted via the input device 62.

After this, the process proceeds to Step S23 without judging whether charging of the respective rechargeable batteries BA of the RF coil devices 100A and 100B has completed or not. This is because charging is possible in the second embodiment when the table 34 is located in the gantry 21 and it is not necessarily to complete the charging before a prescan.

[Step S23] The table driving device 35 moves the table 34 into inside of the gantry 21, in accordance with the control of the system control unit 52.

Note that, light may be irradiated on the imaging part of the object P from a projector (not shown) disposed at the entrance of the gantry 21 and the position adjustment of the object P may be performed the table 34 in Step S23. In this case, the table driving device 35 moves the table 34 in accordance with the control of the system control unit 52 in such a manner that the imaging part of the object P is located immediately beneath the projector, and the position of the table 34 is fixed during the period of the position adjustment. While the position of the table 34 is fixed in this manner, the system control unit 52 makes the bed side charging units 574 charge the rechargeable batteries BA in the above manner.

Concretely speaking, the system control unit 52 updates the current position of the table 34, and updates the coordinate positions of the coils Ls2 of the control side radio communication devices 300B as the communication targets. The above update is an operation of shifting the Z axis coordinate position by the movement amount of the table 34. The system control unit 52 calculates "which coil Ls1 of the bed side charging unit 574 wholly faces "the coil Ls2 of the control side radio communication device 300B of the communication target, on the basis of the coordinate position of this coil Ls2.

Then, an excitation current is supplied to one coil Ls1 facing the coil Ls2 of the control side radio communication device 300B in communication with the RF coil device 100A, as described earlier. Similarly, an excitation current is supplied to one coil Ls1 facing the coil Ls2 of the control side radio communication device 300B in communication with the RF coil device 100B.

If the above position adjustment is performed, the final position of the table 34 is controlled after the position adjustment. As an example here, because the first main scan in the later-described Step S27 is a renal examination, the coil elements 106 of the RF coil device 100B for the pelvic part are used more than the coil elements 106 of the RF coil device 100A. Thus, in Step S23 that is before the first main scan, the final position of the table 34 is controlled in such a manner that the pelvic part as the imaging part is located near to the center of the magnetic field. After this, the process proceeds to Step S24.

[Step S24] The system control unit 52 controls each component of the MRI apparatus 20B so as to perform prescans for the first main scan. In the prescans, for example, a corrected value of an RF pulse is calculated, and sensitivity distribution maps for the respective coil elements 106 of the RF coil devices 100A and 100B are generated.

Note that, in Step S24, at least a part of the table 34 is located inside the gantry 21, and each of the coils Ls2 of the control side radio communication devices 300B as the communication target faces the entirety of at least one coil Ls1 of the gantry side charging units 572. That is, in Step S24, as explained with FIG. 20 and FIG. 21, each component is under the state in which the rechargeable battery BA of each of the RF coil devices 100A and 100B can be charged from the gantry side charging unit 572 via the power transferring unit 320b.

Here, as "the first condition" of a charging period, it is preferable that charging is not performed during a transmission period of an RF pulse by the transmission RF coil 28. The reason is as follows. If the first condition is not satisfied, there is a possibility that power of an RF pulse may be fluctuated.

In addition, as "the second condition" of a charging period, it is preferable that charging is not performed during an application period of a magnetic field. The reason is as follows. If the second condition is not satisfied, there is a possibility that a magnetic field is generated around the power wire by the excitation current flowing in the power wire in the rail 80b and this disturbs linearity of the magnetic field.

In addition, as "the third condition" of a charging period, it is preferable that charging is not performed during a detection period of MR signals by the reception RF coil 29, the coil elements 106 and so on. The reason is as follows. Because MR signals are weak, there is a possibility that electric currents flowing in the rails 80b influence the detection sensitivity of the reception RF coil 29 and the coil elements 106, if the third condition is not satisfied.

During implementation term of the later described main scan, the period that satisfies the above first to third conditions, i.e. "a problem-free period for charging" are, for example, "a period between a plurality of sequences" and "an interval period in a sequence".

As an example in the second embodiment, after the table 34 is inserted into the gantry 21, the rechargeable batteries BA are charged by the gantry side charging units 572 during periods which satisfy all of the first to third conditions. However, if "charging only during periods which satisfy all of the first to third conditions" results in electric power shortage of the RF coil device 100A or 100B, charging may be performed during a period including a detection period of MR signals so as to satisfy the first and second conditions (and avoid electric power shortage).

Thus, during implementation term of prescans in this Step S24, if a period of satisfying the above first to third conditions exists, each of the rechargeable batteries BA are charged by the gantry side charging units 572.

Concretely speaking, the system control unit 52 updates the coordinate position of each of the respective coils Ls2 in the control side radio communication devices 300B in communication with the RF coil devices 100A and 100B. On the basis of the updated coordinate positions of the respective coils Ls2, the system control unit 52 calculates (determines) which coil Ls1 of the gantry side charging unit 572 wholly faces these coils Ls2.

Then, an excitation current is supplied to "one coil Ls1 of one gantry side charging unit 572 that faces the coil Ls2 of the control side radio communication device 300B in communication with the RF coil device 100A". Similarly, an excitation current is supplied to "another coil Ls1 of another gantry side charging unit 572 that faces the coil Ls2 of the control side radio communication device 300B in communication with the RF coil device 100B".

Note that, periods of transmitting an RF pulse, periods of applying a gradient magnetic field and periods of detecting MR signals are determined by the system control unit 52 that controls the entirety of the MRI apparatus 20B. That is, the system control unit 52 judges whether an arbitrary period satisfies the above first to third conditions or not, and the system control unit 52 controls each components of the MRI apparatus 20B so as to supply electric currents to the coils Ls1 of the gantry side charging units 572. After this, the process proceeds to Step S25.

[Step S25] The system control unit 52 sets the rest of the imaging conditions of the first main scan on the basis of the execution results of the prescans, in the way similar to Step S6 of the first embodiment. In the period of this Step S25, the above first to third conditions are satisfied because any scan is performed. Thus, in the period of this Step S25, each of the rechargeable batteries BA is charged by the gantry side charging unit 572 in the above manner. After this, the process proceeds to Step S26.

[Step S26] The system control unit 52 calculates "the estimated consumed power consumed by the RF coil device 100A and the coil side radio communication device 200" in the case of performing the first main scan, on the basis of the imaging conditions of the first main scan in the way similar to Step S3 of the first embodiment. The system control unit 52 calculates "a charging voltage that is enough to output the calculated estimated consumed power", as "the charge finish voltage".

The system control unit 52 inputs the charge finish voltage to the remaining battery level judging unit 250 of the RF coil device 100A via any one of the radio communication pathways. For example, the charge finish voltage may be inputted to the remaining battery level judging unit 250 from the gate signal transmitting unit 324 by way of the gate signal receiving unit 324. The remaining battery level judging unit 250 detects the charging voltage of the rechargeable battery BA on a steady basis, and outputs "a target arrival signal" at the timing when the charging voltage of the rechargeable battery BA reaches the value of the charge finish voltage. "The target arrival signal" is inputted to the system control unit 52 via the same pathway as "the charge completion signal" in the first embodiment.

The system control unit 52 similarly calculates the estimated consumed power consumed by the RF coil device 100B and the coil side radio communication device 200 in the case of performing the first main scan, and the same operation as above is performed. The system control unit 52 proceeds to the next Step S27 at the timing when the system control unit 52 finishes receiving "the target arrival signals" respectively from the remaining battery level judging units 250 of the RF coil devices 100A and 100B. Until the reception of "the target arrival signals" is completed, the system control unit 52 makes the gantry side charging unit 572 and so on continue charging the rechargeable battery BA.

[Step S27] As an example of the first main scan here, MR signals for images of the first group as a renal examination are acquired. In the first group, for example, "the first series of acquiring fifty slices of renal artery images" and "the second series of acquiring fifty slices of renal vein images" are performed. Here, acquisition operation of the MR signals is the same as Step S7 of the first embodiment and overlapping explanation is omitted.

In implementation term of the first main scan, during periods in which the above first to third conditions are satisfied, the system control unit 52 makes the gantry side charging unit 572 wirelessly transmit the charging power for each of the rechargeable batteries BA. For example, during the period after finishing "the pulse sequence of the first series" before "start of the pulse sequence of the second series", the above first to third conditions are satisfied and the charging is performed. After completion of acquisition of the MR signals of the first main scan, the process proceeds to Step S28.

[Step S28] The system control unit 52 controls each component of the MRI apparatus 20B so as to perform prescans for the second main scan. As an example of the second main scan here, MR signals for images of the second group as a pulmonary examination are acquired in the late-described Step S31.

As described earlier, because the first main scan of acquiring the MR signals for the images of the first group is a renal examination, the position of the table 34 is controlled before performance of the first main scan in such a manner that the pelvic region of the imaging part is located near to the center of the magnetic field.

On the other hand, because the second main scan is a pulmonary examination, the coil elements 106 of the RF coil device 100A for the chest part are used more than the coil elements 106 of the RF coil device 100B for the pelvic part. Therefore, the system control unit 52 controls he table driving device 35 in such a manner that the imaging part is located near to the center of the magnetic field.

Every time the table 34 is moved like the above manner, the system control unit 52 recalculates "which coil Ls1 wholly faces the coil Ls2 of each of the control side radio communication devices 300B of the communication targets", by updating the current position of the table 34 and the coordinate position of each of the control side radio communication devices 300B of the communication targets. Out of the plurality of the gantry side charging units 572, "the gantry side charging unit 572 whose coil Ls1 wholly faces the coil Ls2" is used for charging.

Then, in implementation term of the prescans in this Step S28, if there is a period of satisfying the above first to third conditions, each of the rechargeable batteries BA is similarly charged by the gantry side charging unit 572. After this, the process proceeds to Step S29.

[Step S29] The system control unit 52 sets the rest of the imaging condition of the second main scan, on the basis of the execution results of the prescans in Step S28. Because a scan is not performed in this Step S29 and the period of Step S29 satisfies the above first to third conditions, each of the rechargeable batteries BA is similarly charged by the gantry side charging unit 572 during the implementation term of Step S29. After this, the process proceeds to Step S30.

[Step S30] The system control unit 52 calculates "the estimated consumed power consumed by the RF coil device 100A and the coil side radio communication device 200 in the case of performing the second main scan" and "the charge finish voltage that is enough to output the estimated consumed power", and inputs the charge finish voltage to the remaining battery level judging unit 250 of the RF coil device 100A. This method is similar to Step S26. Similarly, the charge finish voltage is inputted to the remaining battery level judging unit of the RF coil device 100B.

Then, in the way similar to Step S26, the system control unit 52 proceeds to the next Step S31 at the timing when the system control unit 52 finishes receiving "the target arrival signals" respectively from the remaining battery level judging units 250 of the RF coil devices 100A and 100B. Until the reception of "the target arrival signals" is completed, the system control unit 52 makes the gantry side charging unit 572 continue charging the rechargeable battery BA.

[Step S31] As an example of the second main scan, MR signals for the images of the second group are acquired. In the second group, for example, "the first series of acquiring MR signals for fifty slices of T1 weighted images" and "the second series of acquiring MR signals for fifty slices of T2 weighted images" are performed.

Note that, the above first main scan and the second main scan (a renal examination and a pulmonary examination) are only examples for making the above explanation easy-to-understand, imaging for another part or other sorts of images such as proton density weighted images may be alternatively obtained. In addition, acquisition operation of MR signals is similar to the previous explanation.

In implementation term of the second main scan, during periods in which the above first to third conditions are satisfied, the system control unit 52 makes the gantry side charging unit 572 wirelessly transmit the charging power to each of the rechargeable batteries BA. For example, during the period after completion of the pulse sequence of the first series before start of the pulse sequence of the second series, the charging is performed. After completion of acquisition of the MR signals of the second main scan, the process proceeds to Step S32.

[Step S32] The table driving device 35 moves the table 34 out of the gantry 21 and returns it to the predetermined position on the supporting platform 33, in accordance with the control of the system control unit 52. After this, the same processing as the first embodiment such as the image reconstruction processing is performed on the k-space data generated in the first main scan and the second main scan, thereby display image data are stored in the storage device 66, and images indicated by the display image data are displayed on the display device 64 in the way similar to the first embodiment.

After completion of imaging, the coil side radio communication devices 200 are detached from the control side radio communication devices 300B, respectively. When both sides are moved beyond the range capable of radio communication, the radio communication and electric power supply between both sides are concluded.

The foregoing is a description of the operation of the MRI apparatus 20B according to the second embodiment.

In the following, difference in effects between the first embodiment and the second embodiment will be explained. Because the gantry side charging units 572 are disposed in the rails 80b in the second embodiment, the rechargeable batteries BA in the RF coil devices 100A and 100B can be charged when the table 34 is located inside the gantry 21, i.e. when imaging is performed.

In the second embodiment, the width of the power receiving element in the power receiving side is larger than the sum of "the width of the power transmitting element in the power transmitting side" and "the interval between two adjacent power transmitting elements". Concretely speaking, the coil length W2 of the coil Ls2 of the power transferring unit 320b is appropriately selected so as to become larger than the sum of "the width of the coil length W1 of each coil Ls1 of the gantry side charging units 572 and the bed side charging units 574" and "the interval between two of the adjacent coils Ls1" (see FIG. 16).

Therefore, at least "one coil Ls1 of the gantry side charging units 572 and the bed side charging units 574" wholly faces the coil Ls2, (A) when the entirety of the table 34 is located on the table slide unit 33b of the supporting platform 33, (B) when a part of the table 34 is located inside the gantry 21, and (C) when the entirety of the table 34 is located inside the gantry 21.

Thus, even if the position of the table 34 in the Z axis direction varies by, for example, 1 mm unit, i.e. regardless of the horizontal position of the table 34, the rechargeable batteries BA in the RF coil devices 100A and 100B can be charged from the gantry side charging units 572 or the bed side charging units 574 via the coils Ls2 of the power transferring units 320b. As a result, it is not necessary to return the table 34 to the predetermined position on the table slide unit 33b for charging the RF coil devices 100A and 100B, and thus flexibility of charging is improved.

In addition, charging by the gantry side charging units 572 is performed by avoiding the period of transmitting an RF pulse, the period of applying a gradient magnetic field and the period of detecting MR signals. Thus, the RF coil devices 100A and 100B can be charged by efficiently using "a period between sequences", "an interval period in a sequence" and "a setting period of imaging conditions", without degrading image quality. As a result, charging time can be secured (kept) without increasing imaging time and without degrading image quality.

Although the second embodiment is inferior to the first embodiment only in that the coupling effect occurs between the power wires connected to the gantry side charging units 572 inside the rails 80b and the coil elements 106 for detection, the second embodiment has the same effects as the first embodiment in other points.

However, in terms of this coupling effect, the second embodiment is superior to the structure of conventional technology. The reason is as follows. Because "the power wires transmitting electric power to the gantry side charging units 572 in the rails 80b" are fixed regardless of the position of the table 34, stretching condition of the power wires in the rails 80b never changes regardless of the motion of the table 34.

Thus, as to (1) power of an excitation RF pulse, (2) the coupling effect between the transmission RF coil 28 in the gantry 21 and the power wires and (3) the coupling effect between the power wires and the coil elements 106 for detection, variation in association with the table position becomes extremely small.

On the other hand, in the conventional technology, there are "cables linking the RF coil devices loaded on the object to connectors disposed to a bed" between the bed and the table, the cables are stretched when the table moves toward innermost of the gantry, and the cables are folded when the table returns on the bed. That is, the second embodiment is different from the conventional structure in which degree of coupling varies depending on the table position, and SAR can be accurately calculated in the second embodiment for the same reason as the first embodiment.

Especially, in the second embodiment, the length of each of the cables is short in order to lessen the degree of the coupling effect. Concretely speaking, the gantry side charging units 572 and the power wires are disposed to only a half region of the entire rails 80b, from the entrance side of the gantry 21 to the center of the gantry 21.

Considering that the table 34 is moved so as to locate the imaging part near to the center of the magnetic field, any one of the plurality of the gantry side charging units 572 and the bed side charging units 574 faces the control side radio communication device 300B of the communication target inmost cases even in the above structure, and thus charging can be performed. As just described, the gantry side charging units 572 are disposed over the minimum range in which a practically sufficient charging function is secured after inserting the table 34 into the gantry 21. Therefore, in the second embodiment, the degree of coupling effect becomes smaller than the conventional structure.

The following three points are supplemented as to the second embodiment.

Firstly, the gantry side charging units 572 may be disposed inside the rails 80b over the entire rails 80b (from the entrance side of the gantry 21 to the innermost of the gantry 21), in order to ensure charging of the RF coil device regardless of (a) the imaging part, (b) the table position and (c) the connection position of the coil side radio communication device 200. In this case, though the degree of the coupling effect becomes larger than the above embodiment, this structure is superior to the conventional technology in that the degree of the coupling effect never varies.

Secondly, an example in which the coil length and the interval between two adjacent coils are mutually equal as to the plurality of the bed side charging units 574 and the plurality of the gantry side charging units 572 has been explained. This is merely an example for simplifying the explanation. The coil of the bed side charging units 574 may be different from the coil Ls1 of the gantry side charging units 572, the interval between coils of the bed side charging units 574 may be different from the interval SP1 between the coils Ls1 of the gantry side charging units 572.

Thirdly, in the structure of the second embodiment, the bedside charging unit 550 of the first embodiment may be disposed in the same arrangement as the first embodiment, instead of disposing the bed side charging units 574. That is, on the supporting platform 33 side, the rechargeable battery BA is charged only when the table 34 is located at the predetermined position, and the rechargeable battery BA is charged by the gantry side charging unit 572 after inserting the table 34 into the gantry 21.

The Third Embodiment

Out of the signals transmitted between the control side (the RF receiver 48 side) of the MRI apparatus 20C and the RF coil devices (100A and 100B), signals except MR signals are transmitted by way of hard-wiring inside rails via other induced electric field combined couplers in the third embodiment. The above "signals except MR signals" are, for example, control signals such as the gate signal, the reference signal and the signal of the identification information of the RF coil devices 100A and 100B, and these are transmitted by electric hard-wiring. Thereby, an effect of decreasing the amount of signals converted into optical signals can be obtained.

The third embodiment is a varied example of the second embodiment, and its structure is the same as the second embodiment except the structure for obtaining the above effect. Thus, the following explanation is focused on the different points and overlapping explanation is omitted.

Figure 23:
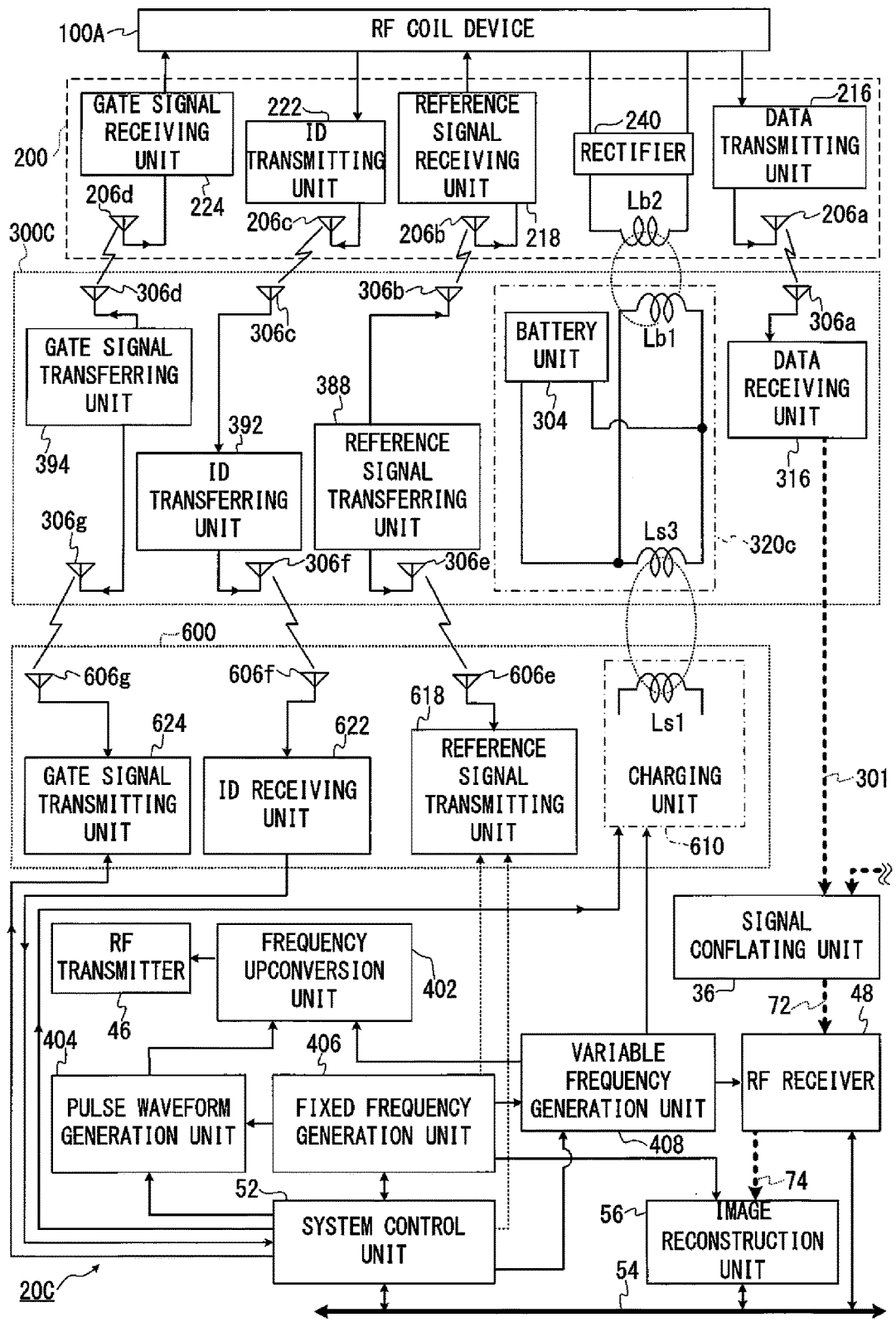
FIG. 23 is a schematic block diagram showing (a) the power supply system to the RF coil device, (b) the transmission system of control signals to the RF coil device, (c) the transmission system of the identification information from the RF coil device and (d) the transmission system of the MR signals, when the table of the MRI apparatus of the third embodiment is located inside the gantry.

FIG. 23 is a schematic block diagram showing (a) the power supply system to the RF coil device 100A, (b) the transmission system of the control signals to the RF coil device 100A, (c) the transmission system of the identification information from the RF coil device 100A and (d) the transmission system of the MR signals, when the table 34 is located inside the gantry 21.

In the MRI apparatus 20C of the third embodiment, the table side radio communication device 300C and the rail side radio communication device 600 are disposed instead of the control side radio communication device 300B of the second embodiment. Thus, in FIG. 23, all the components except the table side radio communication device 300C and the rail side radio communication device 600 are the same as the second embodiment except difference of hard-wiring (interconnection).

The table side radio communication device 300C includes antennas 306a to 306g, the data receiving unit 316, a power transferring unit 320c, a reference signal transferring unit 388, an ID transferring unit 392 and a gate signal transferring unit 394. The power transferring unit 320c includes a battery unit 304, and coils Ls3 and Lb1 for transferring electric power. A plurality of the table side radio communication devices 300C are disposed inside the table 34 in the way similar to the control side radio communication device 300B of the second embodiment (see later-described FIG. 25).

The rail side radio communication device 600 includes antennas 606e, 606f, 606g, a charging unit 610, a reference signal transmitting unit 618, an ID receiving unit 622 and a gate signal transmitting unit 624. The charging unit 610 includes the coil Ls1 for transmitting electric power. A plurality of the rail side radio communication devices 600 are disposed inside the rails 80c of the gantry 21 (see later-described FIG. 25).

The communication targets of the antennas 606e, 606f and 606g of the rail side radio communication device 600 are respectively the antennas 306e, 306f and 306g of the table side radio communication device 300C. The antennas 306e, 306f, 306g, 606e, 606f and 606g are, for example, induced electric field combined couplers.

As to transmission of MR signals, the MRI apparatus 20C of the third embodiment operates by using the same pathway as the first embodiment and the second embodiment. That is, the data receiving unit 316 obtains MR signals from the coil side radio communication device 200 via an induced electric field, converts the MR signals into optical signals, and transmits the optical signals to the signal conflating unit 36.

In addition, as to transfer of electric power to the RF coil devices 100A and 100B, the MRI apparatus 20C of the third embodiment operates by using the same pathway as the second embodiment. Concretely speaking, when the table 34 is located inside the gantry 21, the power transferring unit 320c receives "electric power wirelessly transmitted from the coil Ls1 of the charging unit 610 of the rail side radio communication device 600 via an induced magnetic field" with its coil Ls3. The power transferring unit 320c charges a rechargeable battery (not shown) inside the battery unit 304 with apart of the received electric power, and wirelessly transmits the rest of the received electric power for charging the rechargeable batteries BA of the RF coil device (100A or 100B) in the way similar to the second embodiment.

On the other hand, as to (1) the reference signal, (2) the gate signal and (3) the identification information of the RF coil devices 100A and 100B, they are transmitted via pathways different from the first embodiment and the second embodiment. In the following, the above pathways will be explained in order.

Firstly, the reference signal transmitting unit 618 of the rail side radio communication device 600 generates the reference signal, on the basis of the criterion clock signal inputted from the fixed frequency generation unit 406, in the way similar to the reference signal transmitting unit 318 of the first embodiment. In addition, the reference signal transmitting unit 618 superimposes the trigger signal inputted from the system control unit 52 on the reference signal. Thereby, the reference signal transmitting unit 618 wirelessly transmits both of the reference signal and the trigger signal from the antenna 606e to the antenna 306e.

The wireless transmission between the antenna 606e and the antenna 306e is performed via an induced electric field. That is, the above communication is performed when the table 34 is located inside the gantry 21 at such a position that the antenna 606e of the rail side radio communication device 600 inside the rails 80c is elector-magnetically coupled to the antenna 306e of the table side radio communication device 300C. Note that, "the later described wireless communication between the antenna 306f and the antenna 606f" and "the wireless communication between the antenna 306g and the antenna 606g" are performed via an induced electric field in the above manner.

The reference signal transferring unit 388 adjusts "the radio output power of the reference signal and the trigger signal received by the antenna 306e" to an appropriate level. Then, the reference signal transferring unit 388 wirelessly transmits "the reference signal and the trigger signal whose output level are adjusted" from the antenna 306b to the antenna 206b via an induced electric field. The reference signal and the trigger signal after received by the antenna 206b are subjected to the same processing as the first embodiment.

Secondly, the gate signal transmitting unit 624 wirelessly transmits the gate signal from the antenna 606g to the antenna 306g via an induced electric field in the way similar to the gate signal transmitting unit 324 of the first embodiment. The gate signal transferring unit 394 adjusts "the radio output power of the gate signal received by the antenna 306g" to an appropriate level, and then wirelessly transmits the adjusted gate signal from the antenna 306d to the antenna 206d via an induced electric field. The gate signal received by the antenna 206d is subjected to the same processing as the first embodiment.

Thirdly, the ID transferring unit 392 converts "the identification information of the RF coil device (100A or 100B) received with the antenna 306c by using RFID in the way similar to the first embodiment" into a signal for digital radio transmission via an induced electric field, and then wirelessly transmits the converted signal from the antenna 306f to the antenna 606f. The ID receiving unit 622 extracts the identification information of the RF coil device (100A or 100B) from the digital radio signal received with the antenna 606f, and transmits this identification information to the system control unit 52.

Figure 24:
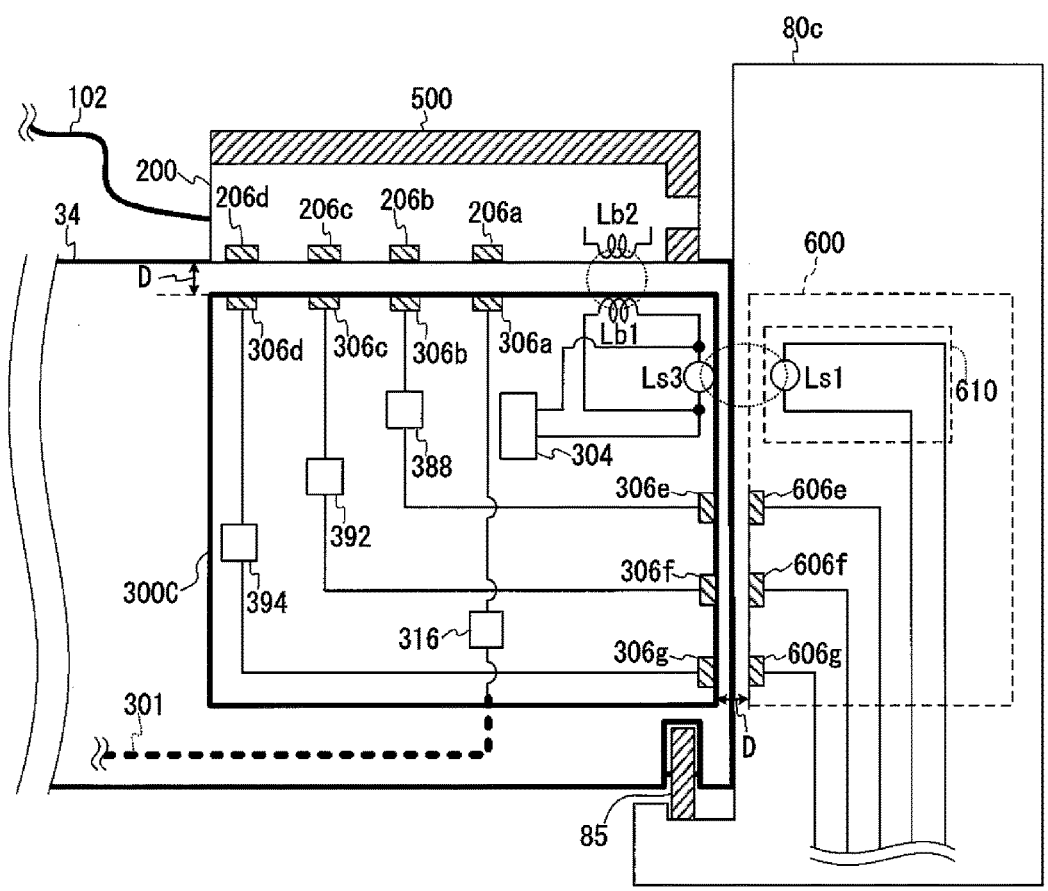
FIG. 24 is a schematic cross-sectional diagram in an X-Y plane of the apparatus coordinate system, showing the main part of the transmission systems of signals and electric power, when the table of the MRI apparatus of the third embodiment is located inside the gantry.

FIG. 24 is a schematic cross-sectional diagram in an X-Y plane of the apparatus coordinate system, showing the main part of the transmission systems of signals and electric power, when the table 34 of the MRI apparatus 20C of the third embodiment is located inside the gantry 21. As shown in FIG. 24, the coil side radio communication device 200 is closely fixed to the table side radio communication device 300C on the top face of the table 34 by the fixing structure 500 in the way similar to the first embodiment and the second embodiment.

That is, inside the table side radio communication device 300C, the antennas 306a to 306d and the coil Lb1 are disposed on the side of the top face of the table 34, so as to be respectively electro-magnetically coupled to the antennas 206a to 206d and the coil Lb2 when the coil side radio communication device 200 is fixed in the above manner. Inside the table side radio communication device 300C, the antennas 306e to 306g and the coil Ls3 are disposed on the side of lateral face of the table 34, so as to be respectively electro-magnetically coupled to the antennas 606e to 606g and the coil Ls1 of the rail side radio communication device 600.

Each of the intervals between the antennas 306a to 306d and the antennas 206a to 206d is, for example, the same as the interval D in the first embodiment. Each of the intervals between the antennas 306e to 306g and the antennas 606e to 606g is, for example, the same as the above interval D.

Inside the rail side radio communication device 600, the antennas 606e to 606g and the coil Ls1 are disposed on the side of lateral face of the rail 80c (the surface facing the lateral face of the table 34), so as to be respectively electro-magnetically coupled to the antennas 306e to 306g and the coil Ls3 of the table side radio communication device 300C.

Figure 25:
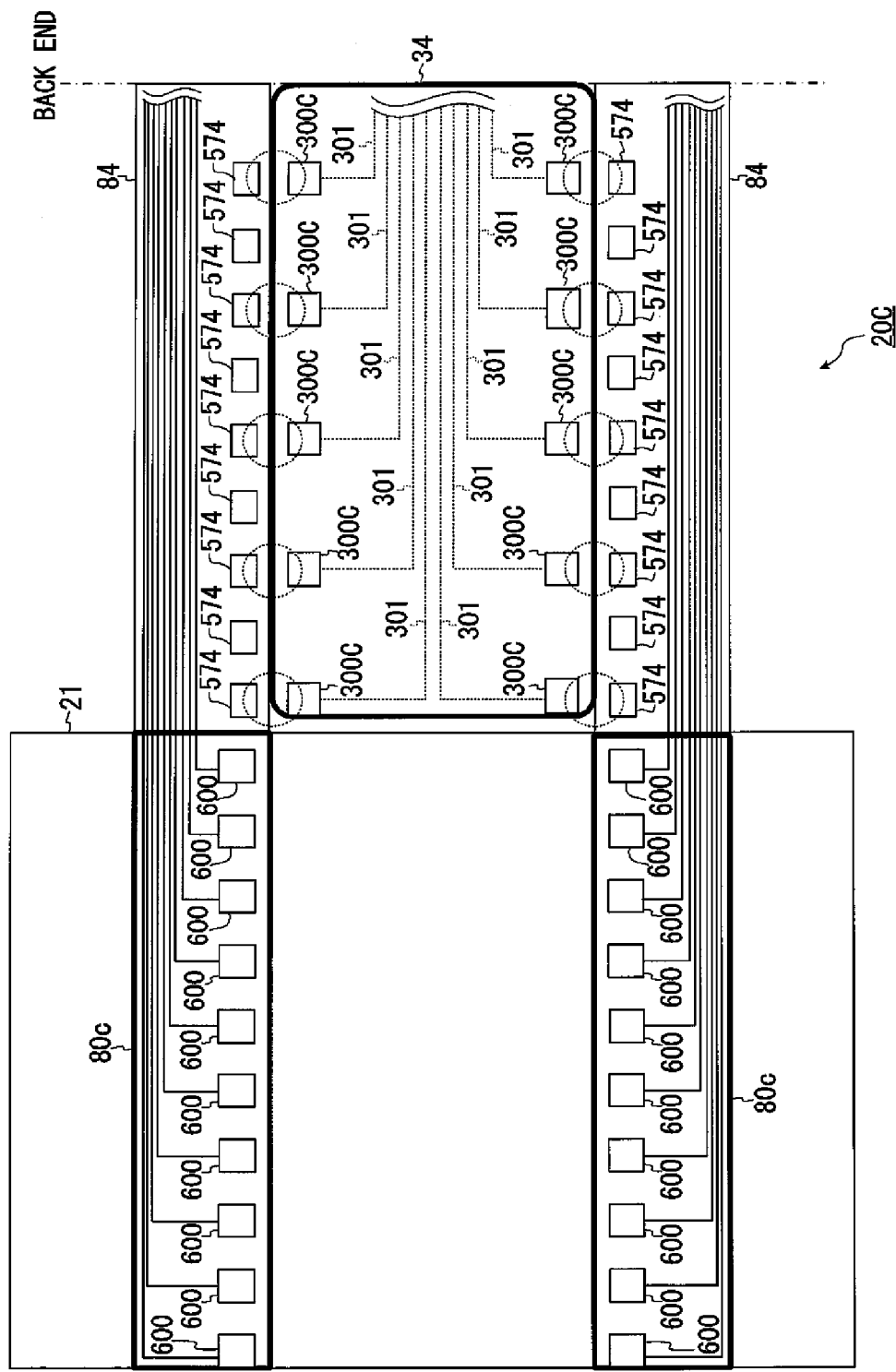
FIG. 25 is a schematic planimetric diagram in an X-Z plane of the apparatus coordinate system, showing an example of arrangement of the table side radio communication devices, the rail side radio communication devices and the bed side charging units of the MRI apparatus of the third embodiment.

FIG. 25 is a schematic planimetric diagram in an X-Z plane of the apparatus coordinate system, showing an example of the arrangement of the table side radio communication devices 300C, the rail side radio communication devices 600 and the bed side charging units 574 of the MRI apparatus 20C of the third embodiment.

In the following, (1) transmission and reception of control signals, and (2) "the moving positions of the table 34 where the rechargeable batteries BA in the RF coil devices 100A and 100B can be charged" will be explained by reference to FIG. 25 to FIG. 27.

As shown in FIG. 25, ten of the bed side charging units 574 are respectively disposed in one of the ambilateral projecting portions 84 and in the other projecting portion 84, for example. These bed side charging units 574 are disposed along the lateral face of the projecting portion 84 in such a manner that the coils Ls1 of the bed side charging units 574 are placed at equal intervals and this interval becomes SP1 like the second embodiment.

As an example here, ten of the table side radio communication devices 300C are disposed inside the table 34 with the same arrangement as the control side radio communication device 300B of the second embodiment. Thus, the rechargeable battery BA of each of the RF coil devices 100A and 100B can be charged from the bed side charging unit 574 via the table side radio communication device 300C and the coil side radio communication device 200, not only in the case where the table 34 is at the predetermined position (i.e. at the most distant position from the gantry 21) but also in other cases.

That is, when the coil Ls3 of the table side radio communication device 300C is located at such a position that the coil Ls3 faces any one of the coil Ls1 of the bed side charging unit 574, the rechargeable battery BA can be charged by the bed side charging units 574. In FIG. 25, "the table side radio communication devices 300C and the bed side charging units 574 which are in a positional relationship to face each other as a pair" are shown with circular dashed frames which link both sides of each pair.

In addition, as shown in FIG. 25, ten of the rail side radio communication devices 600 are respectively disposed inside one of the ambilateral rails 80c of the gantry 21 and inside the other rail 80c. Note that, the stereoscopic shape of the rails 80c is similar to the rails 80a of the first embodiment (see FIG. 2). As an example here, the rail side radio communication devices 600 are disposed at regular intervals on the side of the lateral face of the rail 80c along this lateral face (along the Z axis direction) from the entrance of the gantry 21 to the innermost of the gantry 21.

Each of the rail side radio communication devices 600 are disposed, for example, in such a manner that the direction of coil length of the coil Ls1 inside them is along the Z axis direction and the coils Ls1 are placed at equal intervals and this interval becomes SP1. In addition, they are disposed in such a manner that the interval between "the coil Ls1 of the nearest rail side radio communication device 600 to the entrance side of the gantry 21" and "the coil Ls1 of the nearest bed side charging unit 574 to the gantry 21" becomes SP1. That is, twenty coils Ls1 are disposed at regular intervals from "the coil Ls1 in the rail 80b at the innermost of the gantry 21" to "the coil Ls1 in the projecting portion 84 at the most distant position from the gantry 21".

Individual power wires and individual signal lines are wired to the respective rail side radio communication devices 600 from the projecting portions 84 of the supporting platform 33 via the connectors 580 and 582 (see FIG. 18) that are similar to the second embodiment.

The coils Ls3 of the respective table side radio communication devices 300C are disposed in such a manner that their length direction is along the Z axis direction, and the coil length of the coil Ls3 is equal to the coil length W1 of the coil Ls1, for example. Thus, in the third embodiment, though the coil Ls3 of the table side radio communication device 300C faces one coil Ls1 of the bed side charging unit 574 or the rail side radio communication device 600, the coil Ls3 never faces a plurality of coils Ls1.

When the table 34 is inserted into the gantry 21 for imaging, the table driving device 35 controls the position of the table 34 in accordance with the control of the system control unit 52. That is, the position in the Z axis direction of the table 34 is controlled in such a manner that each of the table side radio communication devices 300C in communication with the RF coil devices 100A or 100B faces any one of the rail side radio communication device 600.

This is so that control signals and electric power are wirelessly transmitted from the rail side radio communication device 600 to the table side radio communication device 300C and the above identification information is obtained from this table side radio communication device 300C via the rail side radio communication device 600 during implementation term of a scan.

Thus, the table 34 moves stepwise in the Z axis direction in such a manner that the table side radio communication device 300C of the communication target faces any one of the rail side radio communication devices 600. Therefore, the number of the positional patterns of the table 34 inside the gantry 210 is the same as the number of the rail side radio communication devices 600, and it is ten patterns in this example.

However, this is merely an example for simplifying the explanation. The number of the positional patterns of the horizontal movement of the table 34 inside the gantry 21 may be increased by disposing more rail side radio communication devices 600 (and the bed side charging units 574) along the Z axis direction at regular intervals. In order to achieve this, for example, (A) each coil length of the coils Ls1 and Ls3 may be shortened, (B) each width of the rail side radio communication devices 600, the table side radio communication devices 300C and the bed side charging units 574 may be shortened, and (C) each arrangement interval of the rail side radio communication devices 600, the table side radio communication devices 300C and the bed side charging units 574 may be shortened. Thereby, the number of the positional patterns of the horizontal movement of the table 34 inside the gantry 21 may be increased to a degree of practically functioning well.

Figure 26:
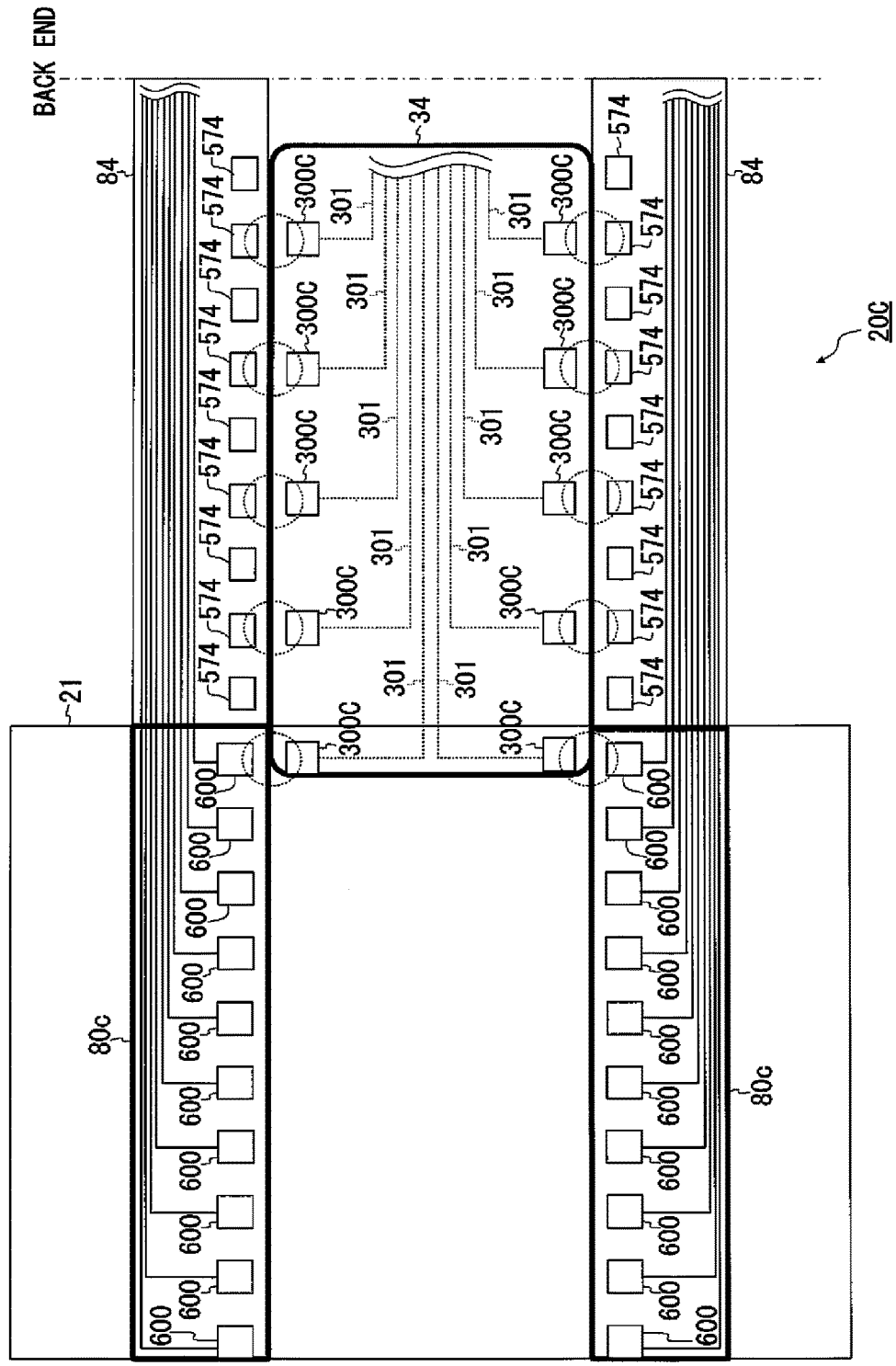
FIG. 26 is a schematic planimetric diagram showing a state obtained by moving the table in the Z axis direction of the apparatus coordinate system from the state of FIG. 25.

FIG. 26 is a schematic planimetric diagram showing a state obtained by moving the table 34 in the Z axis direction of the apparatus coordinate system from the state of FIG. 25. For example, when communication is performed between "the nearest table side radio communication device 300C to the innermost of the gantry 21 inside the table 34" and "the nearest rail side radio communication device 600 to the entrance of the gantry 21", the table 34 is moved to the position shown in FIG. 26.

Figure 27:
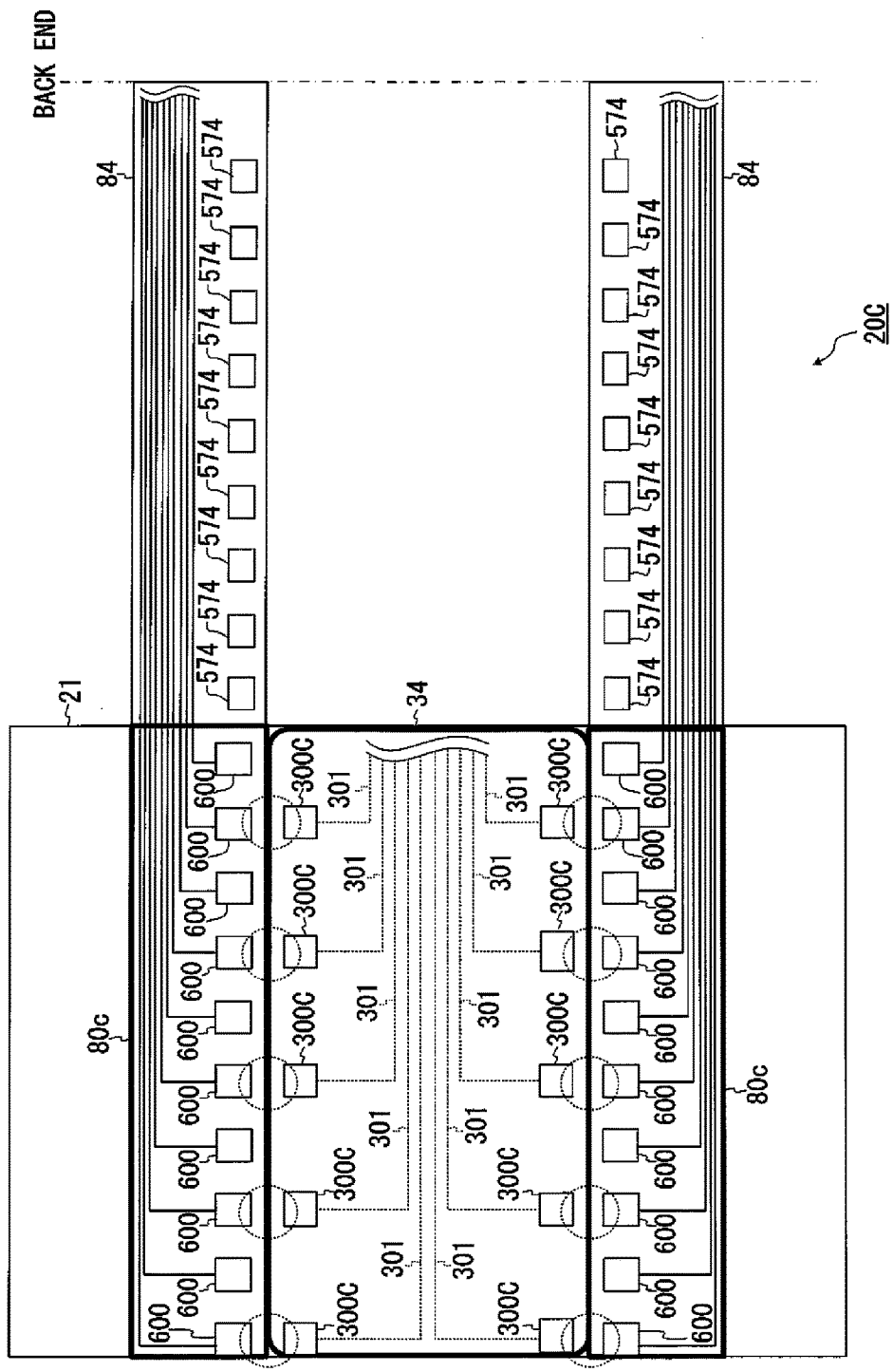
FIG. 27 a schematic planimetric diagram showing a state obtained by moving the table further inward from the state of FIG. 26 so that the entire table is included in the gantry.

FIG. 27 a schematic planimetric diagram showing a state obtained by moving the table 34 further inward from the state of FIG. 26 so that the entire table 34 is included in the gantry 21. If the table 34 is inserted towards innermost of the gantry 21 further than the state of FIG. 26, the table side radio communication device 300C on the right side of FIG. 26 is also located at a position where it can communicate with the rail side radio communication device 600 as shown in FIG. 27.

As just described, in the communication between the control side of the MRI apparatus 20C and the RF coil devices (100A and 100B) of the third embodiment, the gate signal and the reference signal go from the system control unit 52 through hard-wiring inside the rails 80c and are wirelessly transmitted via induced electric fields. The identification information of the RF coil devices 100A and 100B is wirelessly transmitted to the rail side radio communication device 600 via an induced electric field, and then inputted to the system control unit 52 by way of the hard-wiring inside the rail 80c. Thus, signals communicated as optical signals are MR signals only, and the amount of signals converted into optical signals can be reduced.

In addition, the same effects as the second embodiment can be obtained in the third embodiment except the following two points. Firstly, the movement position of the table 34 inside the gantry 21 is limited to (stepwise) positions where the table side radio communication devices 300C respectively face the rail side radio communication devices 600. Secondly, inside the rails 80c, the power wires and signal lines are wired to the innermost of the gantry 21. Thus, the degree of coupling effect in the third embodiment becomes larger than the second embodiment.

Supplementary Notes on the First Embodiment to the Third Embodiment

[1] As to charging methods in which electric power of an RF coil device is saved by separating signal lines from power wires without including the power wires in the table and without imposing a manipulation burden on a user, examples of applying such methods to digital radio communication via an induced electric field MR signals have been explained.

The charging methods respectively explained in the first embodiment and the second embodiment are not limited to the digital radio communication via an induced electric field. The above charging methods can be applied to a structure in which digital radio communication of MR signals is performed between an RF coil device and a control side of an MRI apparatus without through an induced electric field (for example, see Japanese Patent Application Laid-open (KOKAI) Publication No. 2010-29664).

[2] In the above embodiments, the following examples have been explained; i.e. coils (LA1, La2, Lb1, Lb2, Ls1, Ls2 and Ls3) are respectively disposed on the primary side and the secondary side, and electric power is transmitted from the primary side to the secondary side via an induced magnetic field when these coils are located at such positions that these are electro-magnetically coupled to each other. The transmission method of electric power is not limited to the above aspect.

For example, a laser generation device may be disposed to the power transmission side and a photoelectric conversion device of laser reception type may be disposed to the power receiving side. Other methods of wirelessly transmitting electric power such as optically transmitting electric power with a laser in the above manner may be used.

[3] As a varied example of the second embodiment, the RF coil devices (100A and 100B) may be charged only when the table 34 is inside the gantry 21. In this case, the bed side charging units 574 are omitted, and electric power is transmitter from only the gantry side charging units 572 to the control side radio communication devices 300B.

[4] Correspondences between terms used in the claims and terms used in the embodiments explained above will be described. Note that the correspondences described below are just some of possible interpretations for reference and should not be construed as limiting the present invention.

In the first embodiment to the third embodiment, the coil side radio communication device 200 is an example of the first radio communication unit described in the claims.

In the first embodiment and the second embodiment, the control side radio communication devices 300A and 300B are examples of the second radio communication unit and the radio communication unit described in the claims.

In the third embodiment, the table side radio communication device 300C is an example of the second radio communication unit described in the claims, and the rail side radio communication device 600 is an example of the third radio communication unit described in the claims.

In the first embodiment, the bed side charging unit 550 and the power transferring unit 320a are examples of the power supply unit described in the claims.

In the second embodiment, the gantry side charging unit 572, the bed side charging unit 574 and the power transferring unit 320b are examples of the power supply unit described in the claims.

In the third embodiment, the charging unit 610, the bedside charging unit 574 and the power transferring unit 320*c* are examples of the power supply unit described in the claims.

The signal conflating unit 36, the RF receiver 48 and the image reconstruction unit 56 are examples of "a signal processing system of a rear stage" described in the claims.

The rails 80*a*, 80*b* and 80*c* are examples of the supporting unit described in the claims.

[5] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus configured to detect a nuclear magnetic resonance (NMR) signal emitted from an object subjected to a static magnetic field using an RF (radio frequency) coil, the MRI apparatus comprising:
   a gantry inside which the static magnetic field is applied;
   a bed that includes a table for loading the object thereonto, a supporting platform configured to movably support the table and a table driving device configured to move the table into the gantry;
   a table support disposed along a moving path of the table in the gantry supporting the table when moved inside the gantry;
   a first radio communication circuit that acquires the NMR signal detected by the RF coil and wirelessly transmits the NMR signal;
   a second radio communication circuit that receives the wirelessly transmitted NMR signal from the first radio communication circuit;
   an image reconstruction processor configured to reconstruct image data of the object based on the NMR signal received by the second radio communication circuit; and
   a power supply that supplies consumed power of the RF coil via the first radio communication circuit by wirelessly supplying electric power to the first radio communication circuit, at least a part of the power supply being disposed inside the bed or inside the table support,
   wherein
   the power supply includes a bed side charger configured to be disposed inside the supporting platform and wirelessly supply electric power, and a power transferring circuit configured to be disposed inside the table and wirelessly transfer the electric power wirelessly received from the bed side charger to the first radio communication circuit; and
   the bed side charger and the power transferring circuit are respectively disposed to such positions that the power transferring circuit can wirelessly receive the electric power from the bed side charger through a surface of the table when the table is located at a predetermined position on the supporting platform.

2. The magnetic resonance imaging apparatus according to claim 1, further comprising:
   a charge/discharge circuit configured to be disposed inside the RF coil or inside the first radio communication circuit and supply accumulated electric power to the RF coil and the first radio communication circuit,
   wherein the first radio communication circuit is configured to charge the charge/discharge circuit by using wirelessly received electric power.

3. The magnetic resonance imaging apparatus according to claim 2, wherein the second radio communication circuit is disposed inside the table.

4. The magnetic resonance imaging apparatus according to claim 3, wherein the second radio communication circuit is configured to convert a received NMR signal from an electric signal into an optical signal, and transmit the resulting optical NMR signal to a signal processing system of a rear stage including the image reconstruction processor.

5. The magnetic resonance imaging apparatus according to claim 1, wherein:
   the bed side charger and the power transferring circuit are respectively disposed to such positions that the power transferring circuit can receive electric power from the bed side charger when the table is located at a most separated position from the gantry.

6. The magnetic resonance imaging apparatus according to claim 1, wherein:
   the bed side charger and the power transferring circuit are respectively disposed to such positions that the power transferring circuit can receive electric power from the bed side charger when the table is located at a position capable of changing a height of the supporting platform.

7. The magnetic resonance imaging apparatus according to claim 2, wherein:
   the power supply circuit includes at least one bed side charger disposed inside the supporting platform, and a power transferring circuit configured to be disposed inside the table and wirelessly transfer electric power wirelessly supplied from the bed side charger to the first radio communication circuit; and
   the power transferring circuit is disposed on a lateral face side inside the table so as to receive electric power through the lateral face that is in parallel with a moving direction of the table into the gantry.

8. The magnetic resonance imaging apparatus according to claim 7, further comprising:
   a plurality of bed side chargers disposed inside the supporting platform,
   wherein the plurality of bed side chargers are disposed at intervals along a surface of the supporting platform, the surface of the supporting platform being in parallel with a moving direction of the table.

9. The magnetic resonance imaging apparatus according to claim 2, wherein:
   the supporting platform includes a projecting portion formed along a moving direction of the table so as to face a lateral face of the table when the table is on the supporting platform, the lateral face being in parallel with the moving direction;
   the power supply circuit includes a plurality of bed side chargers configured to be disposed inside the projecting portion and supply electric power via an induced magnetic field, and a plurality of power transferring circuits configured to be disposed on the lateral face side in the table and wirelessly receive electric power from at least one of the plurality of bed side chargers via an induced magnetic field;

the plurality of bed side chargers and the plurality of power transferring circuits are disposed along the moving direction so that at least one of the plurality of power transferring circuits can receive electric power from at least one of the plurality of bed side chargers through the lateral face when entirety of the table is located at a predetermined position on the supporting platform;

each of the plurality of power transferring circuits is configured to transfer electric power received from one of the plurality of bed side chargers to the first radio communication circuit via the induced magnetic field; and the second radio communication circuit is configured to convert a received NMR signal from an electrical signal into an optical signal, and transmit the resulting NMR optical signal to a signal processing system of a rear stage including the image reconstruction processor.

10. The magnetic resonance imaging apparatus according to claim 2, wherein:

the power supply circuit includes a gantry side charger configured to be disposed inside the table support and wirelessly supply electric power, and a power transferring circuit configured to be disposed inside the table and wirelessly transfer electric power wirelessly supplied from the gantry side charger to the first radio communication circuit; and the gantry side charger is configured to wirelessly supply electric power to the power transferring circuit when at least a part of the table is located inside the gantry.

11. The magnetic resonance imaging apparatus according to claim 10, wherein:

the table support comprises a rail formed along a moving path of the table; and the power transferring circuit is disposed on a lateral face side in the table and the gantry side charger is disposed on a lateral face side in the rail, so that electric power is wirelessly supplied through a lateral face of the table and a lateral face of the rail, the lateral face of the table being in parallel with a moving direction of the table into the gantry.

12. The magnetic resonance imaging apparatus according to claim 2, wherein:

the table support comprises a rail formed along a moving path of the table;

the power supply circuit includes a plurality of gantry side chargers configured to be disposed inside the table support and wirelessly supply electric power, and a plurality of power transferring circuits configured to be disposed inside the table and wirelessly transfer electric power wirelessly supplied from at least one of the plurality of gantry side chargers to the first radio communication circuit;

the plurality of gantry side chargers are disposed along a lateral face of the rail at intervals and respectively include a plurality of power transmitting elements that wirelessly transmit electric power;

the plurality of power transferring circuits are disposed along a lateral face of the table at intervals and respectively include a plurality of power receiving elements that wirelessly receive electric power;

a width of each of the plurality of power receiving elements is equal to or larger than a sum of a width of each of the plurality of power transmitting elements and an interval between the plurality of power transmitting elements; and at least one of the plurality of gantry side chargers wirelessly supply electric power to a nearest one of the plurality of power transferring circuits, when at least a part of the table is located inside the gantry.

13. The magnetic resonance imaging apparatus according to claim 12, wherein:

the plurality of power transmitting elements and the plurality of power receiving elements are coils; and each of the plurality of gantry side chargers is configured to wirelessly transmit electric power to a power receiving element located at a position of being electromagnetically coupled, via an induced magnetic field by supplying an electric current to a power transmitting element of each of the plurality of gantry side chargers.

14. The magnetic resonance imaging apparatus according to claim 2, wherein:

the supporting platform includes a projecting portion formed along a moving direction of the table so as to face a lateral face of the table when the table is on the supporting platform, the lateral face being in parallel with the moving direction;

the power supply includes (a) a plurality of bed side chargers disposed inside the projecting portion and wirelessly supplying electric power, and (b) a plurality of power transferring circuits disposed inside the table along the lateral face, wirelessly receiving electric power from at least one of the plurality of bed side chargers and wirelessly transferring received electric power to the first radio communication circuit;

the plurality of bed side chargers are disposed inside the projecting portion at intervals along the moving direction and respectively include power transmitting elements that wirelessly transmit electric power;

the plurality of power transferring circuits are disposed at intervals along the lateral face and respectively include power receiving elements that wirelessly receive electric power; and a width of each of the power receiving elements is equal to or larger than a sum of a width of each of the power transmitting elements and an interval between the power transmitting elements.

15. The magnetic resonance imaging apparatus according to claim 14, wherein:

the power transmitting elements and the power receiving elements are coils; and each of the plurality of bed side chargers is configured to transmit electric power to at least one of the power receiving elements via an induced magnetic field by supplying electric current to a power transmitting element.

16. The magnetic resonance imaging apparatus according to claim 10, wherein:

the power supply is configured to supply consumed power of the RF coil via the first radio communication circuit, by avoiding at least one of a period during which an RF pulse is being transmitted from the MRI apparatus and a period during which the NMR signal is being detected by the RF coil.

17. The magnetic resonance imaging apparatus according to claim 4, further comprising:

a system controller configured to generate a control signal controlling operation of the RF coil and output the control signal; and a third radio communication circuit configured to be disposed inside the table support, acquire the control signal, and wirelessly transmit the control signal to the second radio communication circuit when the table is inside the gantry, wherein the second radio communication circuit is configured to be disposed inside the table and wirelessly transmit the control signal received from the third radio communication circuit to the first radio communication circuit; and the first radio communication circuit is configured to transmit the control signal received from the second radio communication circuit to the RF coil.

18. A magnetic resonance imaging (MRI) apparatus obtaining a NMR signal from an RF coil that detects the NMR signal emitted from an object under application of a static magnetic field, the MRI apparatus comprising:

a gantry inside which the static magnetic field is applied;

a bed that includes a table for loading the object thereonto, a supporting platform configured to movably support the table and a table driving device configured to move the table into the gantry;

a bed support disposed along a moving path of the table in the gantry and supporting the table when moved inside the gantry;

a power supply that is fixedly disposed so as not to move when the table moves, receives electric power via a power wire fixed in the MRI apparatus so as not to move when the table moves, and wirelessly transmits received electric power;

a first radio communication circuit that receives electric power wirelessly transmitted from the power supply, wirelessly transmits electric power to the RF coil, acquires the NMR signal detected by the RF coil, and wirelessly transmits the NMR signal;

a second radio communication circuit that receives the NMR signal wirelessly transmitted from the first radio communication circuit; and an image reconstruction processor configured to reconstruct image data of the object based on NMR signals received by the second radio communication circuit, wherein the power supply includes a bed side charger configured to be disposed inside the supporting platform and wirelessly supply electric power, and a power transferring circuit configured to be disposed inside the table and wirelessly transfer the electric power wirelessly received from the bed side charger to the first radio communication circuit; and the bed side charger and the power transferring circuit are respectively disposed to such positions that the power transferring circuit can wirelessly receive the electric power from the bed side charger through a surface of the table when the table is located at a predetermined position on the supporting platform.

19. A bed device comprising:

a table on which an object is loaded when magnetic resonance imaging (MRI) is performed;

a supporting platform that movably supports the table;

a power supply that is fixedly disposed to the supporting platform and wirelessly transmits electric power to a side of the table; and a radio communication circuit that is fixedly disposed to the table, wirelessly receives electric power from the power supply, wirelessly transmits electric power received from the power supply to an RF coil, and wirelessly receives a nuclear magnetic resonance signal emitted from the object and detected by the RF coil, wherein the power supply includes a bed side charger configured to be disposed inside the supporting platform and wirelessly supply electric power, and a power transferring circuit configured to be disposed inside the table and wirelessly transfer the electric power wirelessly received from the bed side charger to the first radio communication circuit; and the bed side charger and the power transferring circuit are respectively disposed to such positions that the power transferring circuit can wirelessly receive the electric power from the bed side charger through a surface of the table when the table is located at a predetermined position on the supporting platform.

* * * * *